United States Patent
Downs et al.

(10) Patent No.: US 11,862,543 B2
(45) Date of Patent: Jan. 2, 2024

(54) ELECTRIC DRIVE MODULE

(71) Applicant: AMERICAN AXLE & MANUFACTURING, INC., Detroit, MI (US)

(72) Inventors: James P. Downs, South Lyon, MI (US); David Crecelius, Cicero, IN (US); Jeffrey J. Ronning, Grosse Pointe Farms, MI (US); Paul J. Valente, Berkley, MI (US); John C. Morgante, Sterling Heights, MI (US)

(73) Assignee: American Axle & Manufacturing, Inc., Detroit, MI (US)

( * ) Notice: Subject to any disclaimer, the term of this patent is extended or adjusted under 35 U.S.C. 154(b) by 32 days.

(21) Appl. No.: 17/838,396

(22) Filed: Jun. 13, 2022

(65) Prior Publication Data
US 2022/0310493 A1 Sep. 29, 2022

Related U.S. Application Data

(63) Continuation of application No. 17/691,244, filed on Mar. 10, 2022, now Pat. No. 11,456,239, which is a
(Continued)

(51) Int. Cl.
*H01L 23/495* (2006.01)
*H02K 1/16* (2006.01)
(Continued)

(52) U.S. Cl.
CPC ......... *H01L 23/49568* (2013.01); *H02K 1/16* (2013.01); *H02K 1/20* (2013.01);
(Continued)

(58) Field of Classification Search
CPC ........... H01L 23/49568; H01L 23/3736; H01L 23/49513; H01L 23/49562; H01L 24/48;
(Continued)

(56) References Cited

U.S. PATENT DOCUMENTS

| 5,587,882 A | 12/1996 | Patel |
| 6,930,417 B2 | 8/2005 | Kaneko et al. |

(Continued)

FOREIGN PATENT DOCUMENTS

| CN | 108599470 | 9/2018 |
| DE | 102013214899 | 2/2015 |

(Continued)

OTHER PUBLICATIONS

Written Opinion and International Search Report for International Application PCT/US2020/029925, dated Sep. 21, 2020.
(Continued)

*Primary Examiner* — John K Kim
(74) *Attorney, Agent, or Firm* — Reising Ethington P.C.

(57) ABSTRACT

An electric drive unit having a stator, a rotor received in the stator and rotatable about a central longitudinal axis, and an inverter assembly that includes a plurality of power semiconductors, a plurality of heat sinks and an end plate. The power semiconductors are thermally coupled to the heat sinks. Each of the heat sinks has a plurality of fins that extend into a flow channel that is coaxial with the plurality of sets of field windings. The end plate is coupled to the power semiconductors and has a projection, which is sealingly coupled to the stator and which and partly defines an annular cavity, and a coolant port that is coupled in fluid communication with the annular cavity. The flow channel is in fluid communication with and disposed in a flow path between the annular cavity and the cooling channels in the stator body.

20 Claims, 50 Drawing Sheets

Related U.S. Application Data continuation of application No. 17/501,189, filed on Oct. 14, 2021, now Pat. No. 11,303,183, which is a continuation of application No. PCT/US2020/029925, filed on Apr. 24, 2020.

(60) Provisional application No. 62/904,199, filed on Sep. 23, 2019, provisional application No. 62/838,893, filed on Apr. 25, 2019.

(51) Int. Cl.
| | |
|---|---|
| *H02K 1/20* | (2006.01) |
| *H02K 11/00* | (2016.01) |
| *H02K 11/27* | (2016.01) |
| *H02K 11/33* | (2016.01) |
| *H02K 5/15* | (2006.01) |
| *H02K 5/20* | (2006.01) |
| *H02K 7/116* | (2006.01) |
| *H02K 9/19* | (2006.01) |
| *H02K 9/22* | (2006.01) |
| *H02K 5/22* | (2006.01) |
| *H01L 23/373* | (2006.01) |
| *H01L 23/00* | (2006.01) |

(52) U.S. Cl.
CPC .............. *H02K 5/15* (2013.01); *H02K 5/203* (2021.01); *H02K 5/225* (2013.01); *H02K 7/116* (2013.01); *H02K 9/19* (2013.01); *H02K 9/227* (2021.01); *H02K 11/00* (2013.01); *H02K 11/27* (2016.01); *H02K 11/33* (2016.01); *H01L 23/3736* (2013.01); *H01L 23/49513* (2013.01); *H01L 23/49562* (2013.01); *H01L 24/48* (2013.01); *H01L 24/73* (2013.01); *H01L 24/92* (2013.01); *H01L 2224/48175* (2013.01); *H01L 2224/73265* (2013.01); *H01L 2224/92247* (2013.01); *H01L 2924/13091* (2013.01); *H02K 2211/03* (2013.01)

(58) Field of Classification Search
CPC ..................... H01L 24/73; H01L 24/92; H01L 2224/48175; H01L 2224/73265; H01L 2224/92247; H01L 2924/13091; H01L 23/49811; H01L 21/4803; H01L 21/4853; H01L 21/4882; H01L 21/52; H01L 21/56; H01L 23/053; H01L 23/3677; H01L 23/49844; H01L 24/31; H01L 29/78; H02K 1/16; H02K 1/20; H02K 5/15; H02K 5/203; H02K 5/225; H02K 7/116; H02K 9/19; H02K 9/227; H02K 11/00; H02K 11/27; H02K 11/33; H02K 2211/03; H02K 7/003; H02K 7/006; H02K 11/215; B23K 37/00; H02M 7/003; H02P 27/06; H05K 7/20418
USPC ....................................................... 310/68 D
See application file for complete search history.

(56) References Cited

U.S. PATENT DOCUMENTS

| | | | |
|---|---|---|---|
| 7,525,224 B2 | 4/2009 | Takenaka et al. | |
| 7,641,490 B2 | 1/2010 | Korich et al. | |
| 7,775,060 B2 | 8/2010 | Nakajima et al. | |
| 8,937,414 B2 | 1/2015 | Song et al. | |
| 9,030,063 B2 | 5/2015 | Rawlinson et al. | |
| 9,692,277 B2 | 6/2017 | Pearce, Jr. et al. | |
| 10,236,791 B1 | 3/2019 | Chung et al. | |
| 10,411,574 B2 | 9/2019 | Nakashima et al. | |
| 10,464,439 B2 | 11/2019 | Liu et al. | |
| 10,696,149 B2 | 6/2020 | Pearce, Jr. et al. | |
| 11,303,183 B2 * | 4/2022 | Downs .................. | H02K 7/116 |
| 2005/0211490 A1 | 9/2005 | Shimizu et al. | |
| 2012/0098391 A1 | 4/2012 | Yamasaki et al. | |
| 2013/0278090 A1 | 10/2013 | Matsuo | |
| 2013/0285485 A1 | 10/2013 | Song et al. | |
| 2014/0265659 A1 | 9/2014 | Chamberlin et al. | |
| 2016/0105081 A1 | 4/2016 | Bradfield | |
| 2016/0172939 A1 | 6/2016 | Owen | |
| 2016/0276895 A1 * | 9/2016 | Aizawa .................... | H02K 3/46 |
| 2016/0285335 A1 * | 9/2016 | Watanabe .............. | H02K 3/522 |
| 2017/0077779 A1 * | 3/2017 | Hanioka ................ | H02K 9/227 |
| 2017/0117208 A1 | 4/2017 | Kasztelan et al. | |
| 2017/0331356 A1 | 11/2017 | Nakashima | |
| 2018/0058773 A1 | 3/2018 | Adhiachari et al. | |
| 2018/0218960 A1 | 8/2018 | Takahagi et al. | |
| 2019/0067154 A1 | 2/2019 | Yoshihara et al. | |
| 2020/0149624 A1 | 5/2020 | Hata et al. | |
| 2020/0227334 A1 | 7/2020 | Hart et al. | |
| 2020/0331343 A1 | 10/2020 | Takahashi et al. | |
| 2021/0066157 A1 | 3/2021 | Manninen et al. | |
| 2022/0037954 A1 * | 2/2022 | Downs .................. | H02K 11/00 |
| 2022/0199501 A1 * | 6/2022 | Downs .................. | H02K 11/00 |
| 2022/0310493 A1 * | 9/2022 | Downs .................... | H02K 1/20 |

FOREIGN PATENT DOCUMENTS

| | | |
|---|---|---|
| DE | 102015216055 | 2/2017 |
| DE | 102017214490 | 2/2019 |
| DE | 102018111624 | 11/2019 |
| GB | 2574018 | 11/2019 |
| GB | 2574019 | 11/2019 |
| GB | 2574020 | 11/2019 |
| JP | H09129791 | 5/1997 |
| JP | 2001060750 | 3/2001 |
| JP | 2008184111 | 8/2008 |
| JP | 2012074440 | 4/2012 |
| JP | 2016144382 | 8/2016 |
| KR | 1020140057032 | 5/2014 |
| WO | 1996019827 | 6/1996 |
| WO | 2018030343 | 2/2018 |
| WO | 2018138530 | 8/2018 |
| WO | 2019208081 | 10/2019 |
| WO | 2019208083 | 10/2019 |
| WO | 2019208084 | 10/2019 |

OTHER PUBLICATIONS

On Semiconductor®, NTB5860NL, NTP5860NL, NVB5860NL, N-Channel Power MOSFET Information pages, Semiconductor Components Industries, LLC, Aug. 2012, 9 pages.
European Search Report for corresponding European application EP20795936.2, filed Nov. 25, 2021.
European Search Report for corresponding European application EP22202238.6, filed Oct. 18, 2022.

\* cited by examiner

ELECTRIC DRIVE MODULE

CROSS-REFERENCE TO RELATED APPLICATIONS

This application is a continuation of U.S. patent application Ser. No. 17/691,244 filed Mar. 10, 2022, which is a continuation of U.S. patent application Ser. No. 17/501,189 filed Oct. 14, 2021 (now U.S. patent Ser. No. 11/303,183 issued Apr. 12, 2022), which is a bypass continuation of International Patent Application No. PCT/US2020/029925 filed Apr. 24, 2020, which claims the benefit of U.S. Provisional Application No. 62/838,893 filed Apr. 25, 2019 and U.S. Provisional Application No. 62/904,199 filed Sep. 23, 2019. The disclosures of each of the above-referenced applications is incorporated by reference as fully set forth in detail herein.

FIELD

The present disclosure relates to an electric drive module.

BACKGROUND

This section provides background information related to the present disclosure which is not necessarily prior art.

While there is increasing interest in the electrification of vehicle drivelines, there are significant issues that must be overcome before vehicles with electrified drivelines substantially displace vehicle drivelines that are powered solely by internal combustion engines. Some of these issues include the cost of the electrified driveline, the volume of the electrified driveline and its ability to be packaged into available space within a vehicle, as well as the robustness of the electronics that are employed to operate and control the electrified driveline.

SUMMARY

This section provides a general summary of the disclosure, and is not a comprehensive disclosure of its full scope or all of its features.

In one form, the present disclosure provides an electric drive module that includes a housing assembly, an electric motor, and an inverter. The electric motor is received in the housing assembly and has a stator and a rotor. The stator has a plurality of sets of field windings and a plurality of phase leads. A plurality of stator cooling passages are formed through the stator. Each of the sets of field windings is disposed about a rotary axis. Each of the phase leads is electrically coupled to a corresponding one of the sets of field windings. The rotor is disposed in the stator for rotation about the rotary axis. The inverter has a retaining member, an end plate, a circuit board assembly, a plurality of power semiconductor devices, and one or more heat sinks. The retaining member is received between the housing assembly and an axial end of each of the sets of field windings. The end plate is fixedly and sealingly coupled to the retaining member. At least a portion of the circuit board assembly has an annular shape that is disposed about the rotor and is received in the retaining member on a first side of the end plate. The circuit board assembly is electrically coupled to the phase leads. Each of the power semiconductor devices has a plurality of pin terminals and a power terminal that is electrically coupled to one of the pin terminals. The power semiconductor devices are arranged in an annular manner within the retaining member such that the power terminals are disposed on a second side of the end plate that is opposite the first side. The pin terminals of the power semiconductor devices extend through the end plate and are electrically coupled to the circuit board assembly. The power terminal of each of the power semiconductor devices is mounted to the one or more heat sinks. Each of the one or more heat sinks has a plurality of fins. The fins of the heat sinks are disposed in an annular region that is adjacent to the axial ends of the sets of field windings. The annular region is in fluid communication with the stator cooling passages. An inlet port is formed through the end plate. The inlet port is adapted to receive a liquid cooling fluid therethrough. The inlet port is coupled in fluid communication to the annular region.

In another form, the present disclosure provides an electric drive module that includes a housing assembly, an electric motor and an inverter. The electric motor is received in the housing assembly and has a stator and a rotor that is rotatable relative to the stator about a rotary axis. The stator has a plurality of sets of field windings and a plurality of phase leads. Each of the phase leads is electrically coupled to a corresponding one of the sets of field windings. The inverter has a retaining member, an end plate, a circuit board assembly, a plurality of power semiconductor devices, and one or more heat sinks. The retaining member is received between the housing assembly and an axial end of each of the sets of field windings. The end plate is fixedly and sealingly coupled to the retaining member. The circuit board assembly is received in the retaining member on a first side of the end plate. Each of the power semiconductor devices has a plurality of device terminals and a power terminal that is electrically coupled to one of the device terminals. The power semiconductor devices are arranged within the retaining member such that the power terminals are disposed on a second side of the end plate that is opposite the first side. The device terminals of the power semiconductor devices extend through the end plate and are electrically coupled to the circuit board assembly. The power terminal of each of the power semiconductor devices is mounted to the one or more heat sinks. Each of the one or more heat sinks has a plurality of fins. The fins of the heat sinks are disposed in a region that is adjacent to the axial ends of the sets of field windings. An inlet port is formed through the end plate and is configured to receive a liquid cooling fluid therethrough. The inlet port being coupled in fluid communication to the region.

In still another form, the present disclosure provides an electric drive unit that includes a stator, a rotor, and an inverter assembly. The stator has a stator body and a plurality of sets of field windings. The stator body defines a plurality of cooling channels that extend longitudinally through the stator body. Each of the sets of field windings is fixedly coupled to the stator body and is circumferentially spaced apart about a central longitudinal axis. The rotor is received in the stator and is rotatable about the central longitudinal axis. The inverter assembly includes a plurality of power semiconductors, a plurality of heat sinks and an end plate. Each of the power semiconductors is thermally coupled to a corresponding one of the heat sinks. Each of the heat sinks has a plurality of fins that extend into a flow channel that is coaxial with the plurality of sets of field windings. The end plate is coupled to the power semiconductors and has a projection and a coolant port. The projection is sealingly coupled to the plurality of sets of field windings and partly defines an annular cavity. The coolant port is coupled in fluid communication with the annular cavity. The flow channel is in fluid communication with and disposed in a flow path between the annular cavity and the cooling channels in the stator body.

In a further form, the present disclosure provides an electric drive unit that includes a motor assembly having an electric motor and an inverter assembly. The electric motor has a plurality of sets of field windings and defines a plurality of cooling channels. Each of the sets of field windings includes a phase terminal. The inverter assembly has a retainer, a plurality of power semiconductors, a circuit board, first and second bus bars, a plurality of conductor plates, and a plurality of heat sinks. The retainer includes an annular end plate that is sealingly coupled to the electric motor. Each of the power semiconductors has a plurality of device terminals that are received through the annular end plate. Each of the power semiconductors is electrically coupled to the first and second bus bars. Each of the conductor plates is electrically coupled to a corresponding set of the power semiconductors and a corresponding one of the phase terminals. The heat sinks are mechanically and thermally coupled to the power semiconductors. The power semiconductors and the heat sinks are disposed concentric with the plurality of sets of field windings. The end plate defines a coolant tube. The end plate and the electric motor cooperate to form an annular cavity that is in fluid communication with the coolant tube. The heat sinks have fins that are disposed in a flow channel. The flow channel is disposed in fluid communication between the annular cavity and the cooling channels.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 71:
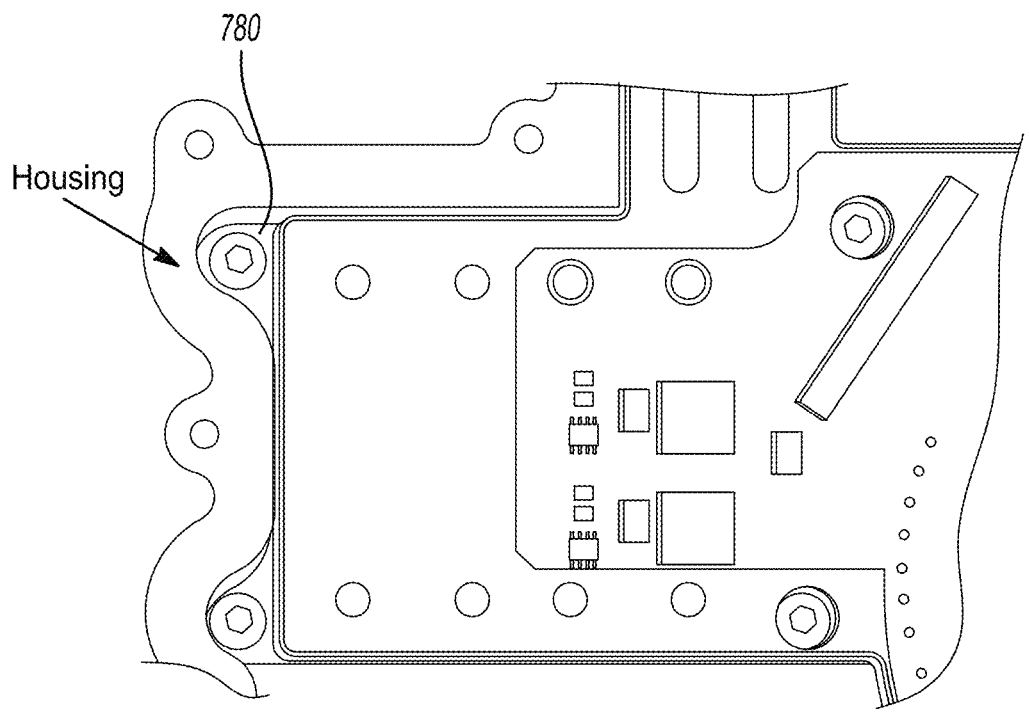
Figure 72:
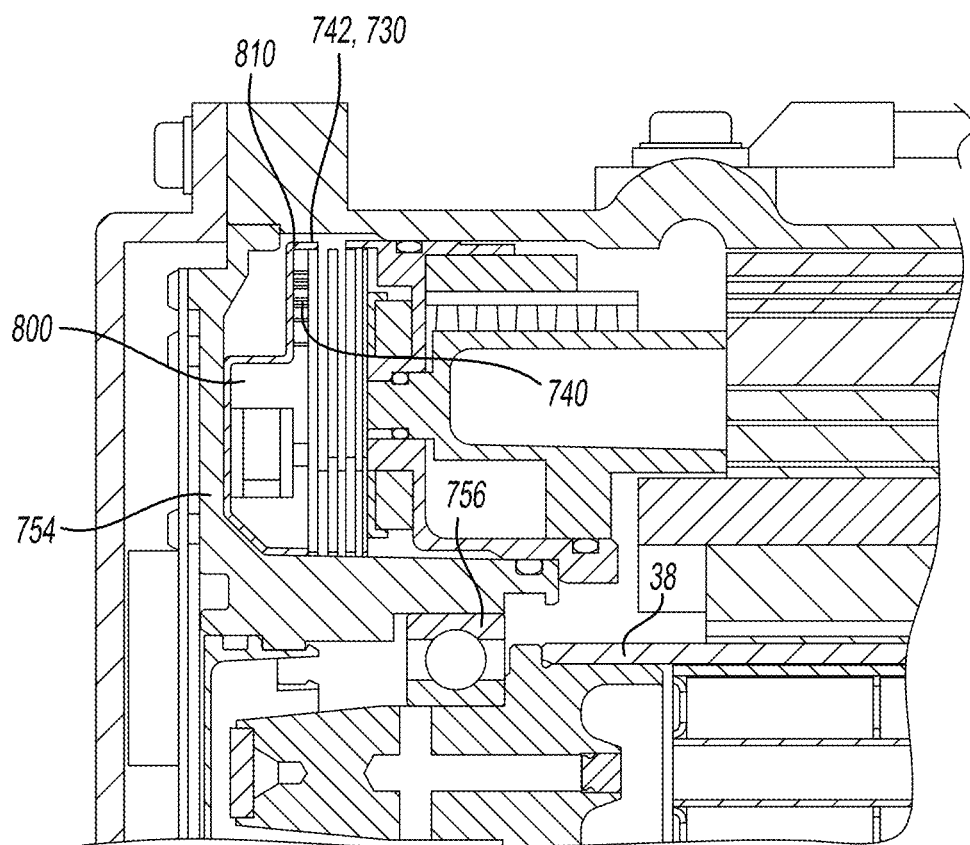

FIG. 71 is a perspective view of a portion of the alternately configured electric drive unit illustrating the mounting of the field capacitor to the housing via a plurality of screws; and FIG. 72 is a section view of a portion of the alternately configured electric drive unit taken through the bearing support and illustrating an insulator axially between the circuit board assembly and a flange formed on the bearing support.

Corresponding reference numerals indicate corresponding parts throughout the several views of the drawings.

DETAILED DESCRIPTION

Figure 1:
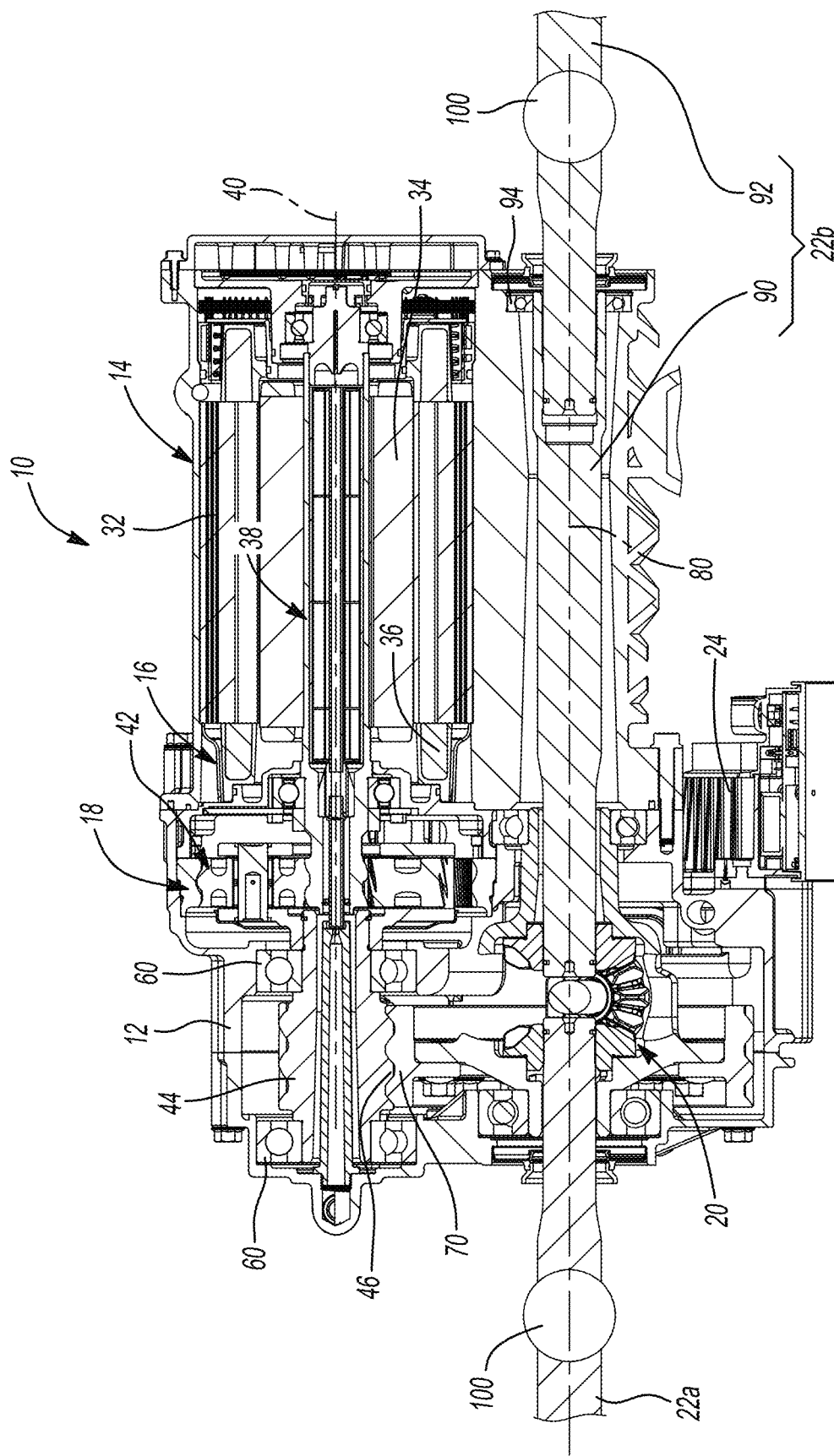
FIGS. 1 and 2 are longitudinal section views of an exemplary electric drive module constructed in accordance with the teachings of the present disclosure.
Figure 2:
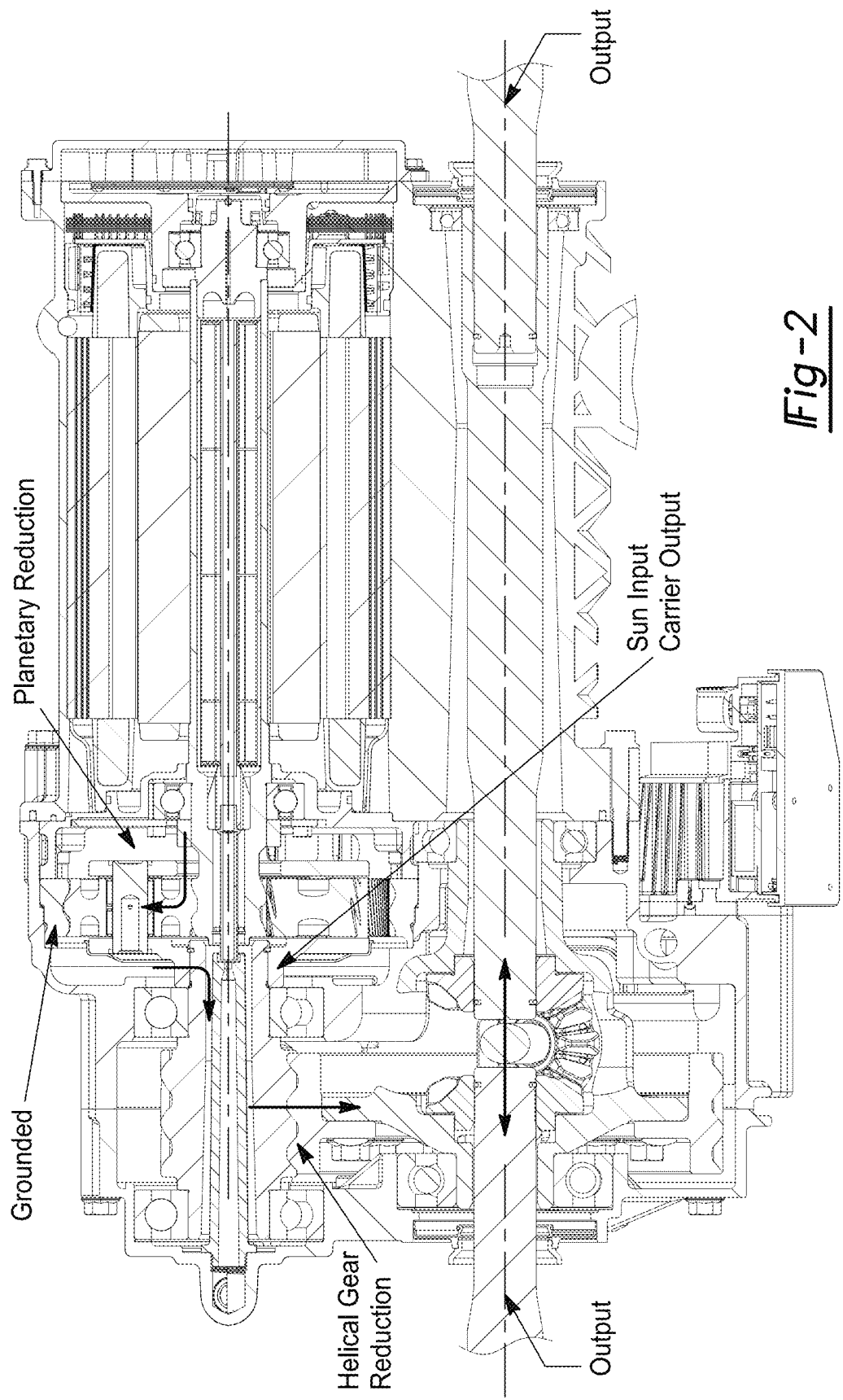
Figure 5:
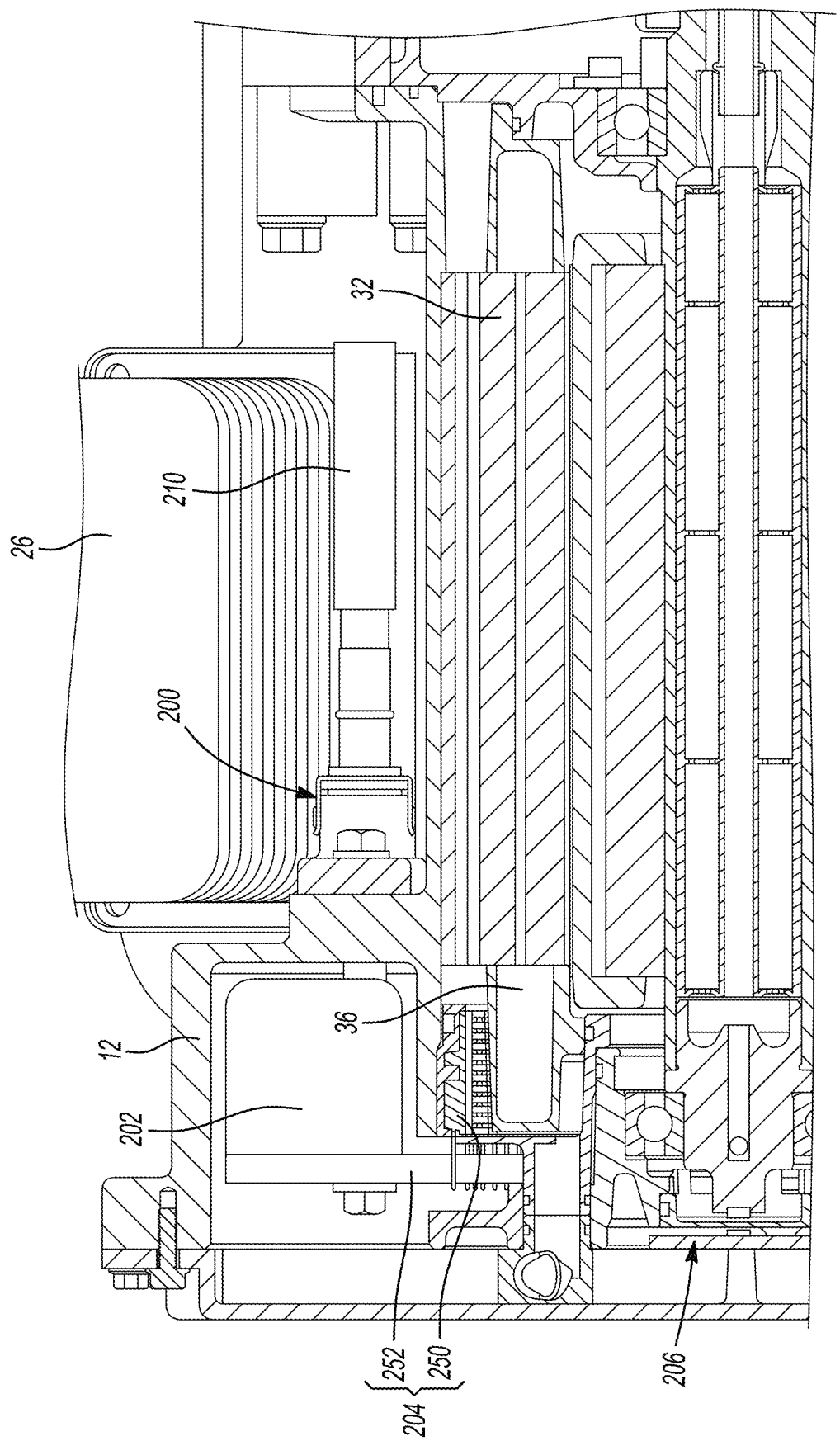
FIGS. 5 and 6 are partly sectioned views of the electric drive unit of FIG. 1.
Figure 6:
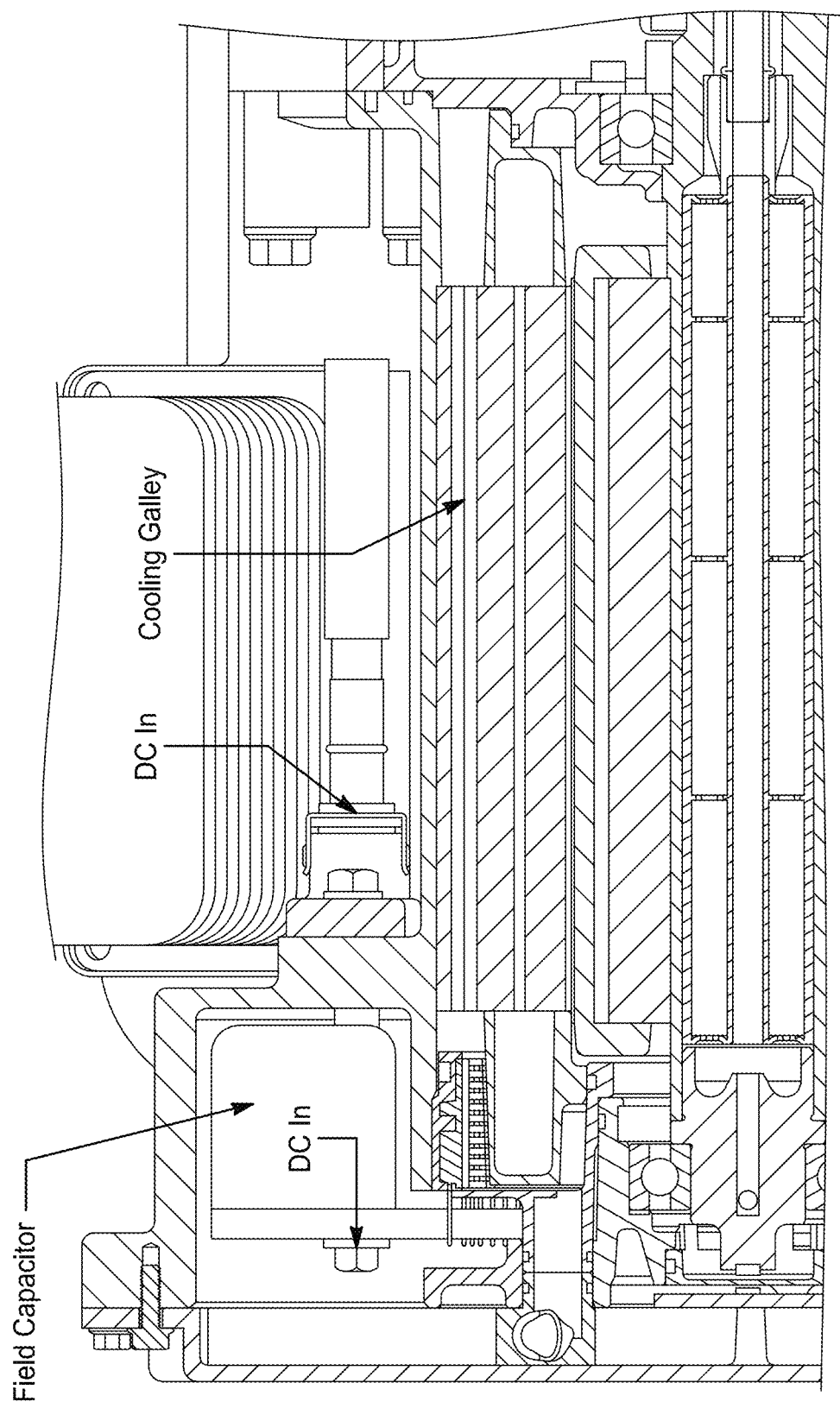
Figure 8:
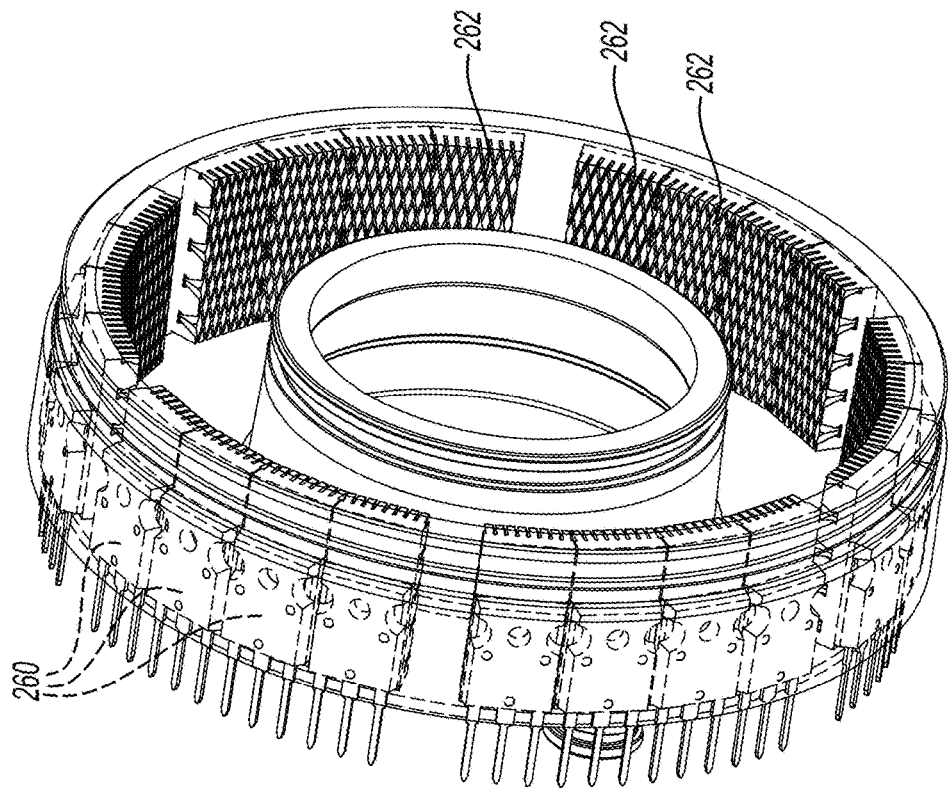
FIGS. 8 and 10 are similar to FIGS. 7 and 9, respectively, but depict a portion of the inverter in a see-through manner so that a plurality of MOSFET's are more easily seen.
Figure 7:
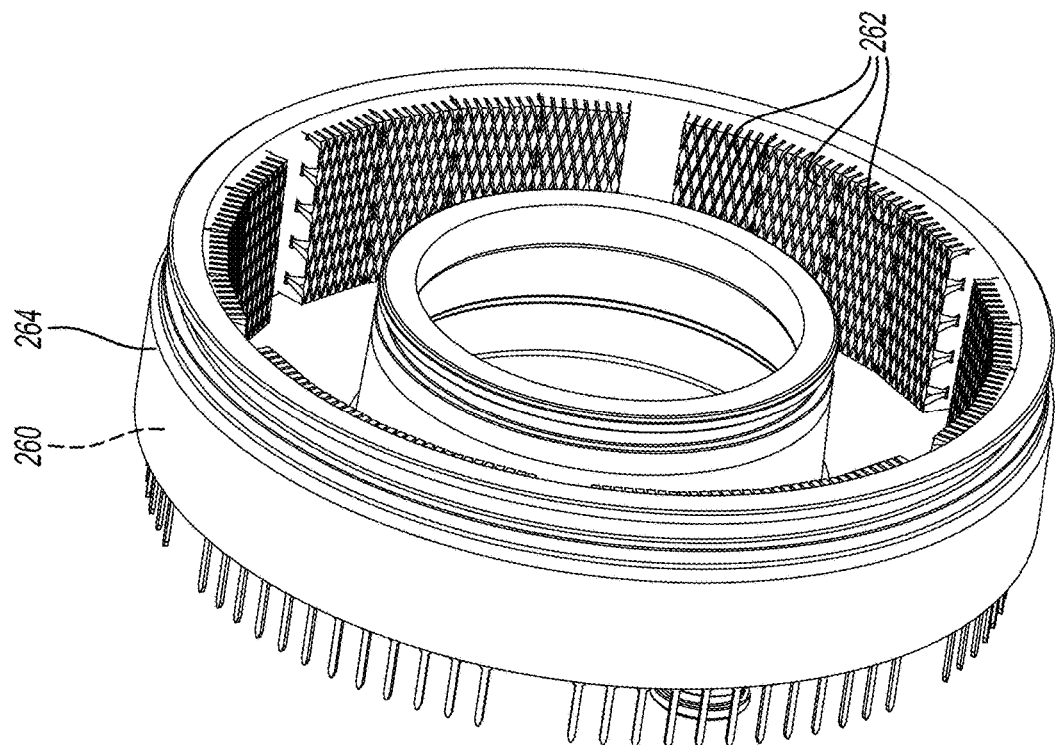
FIGS. 7 and 9 are perspective views of a portion of the motor assembly, illustrating a portion of an inverter in more detail.
Figure 10:
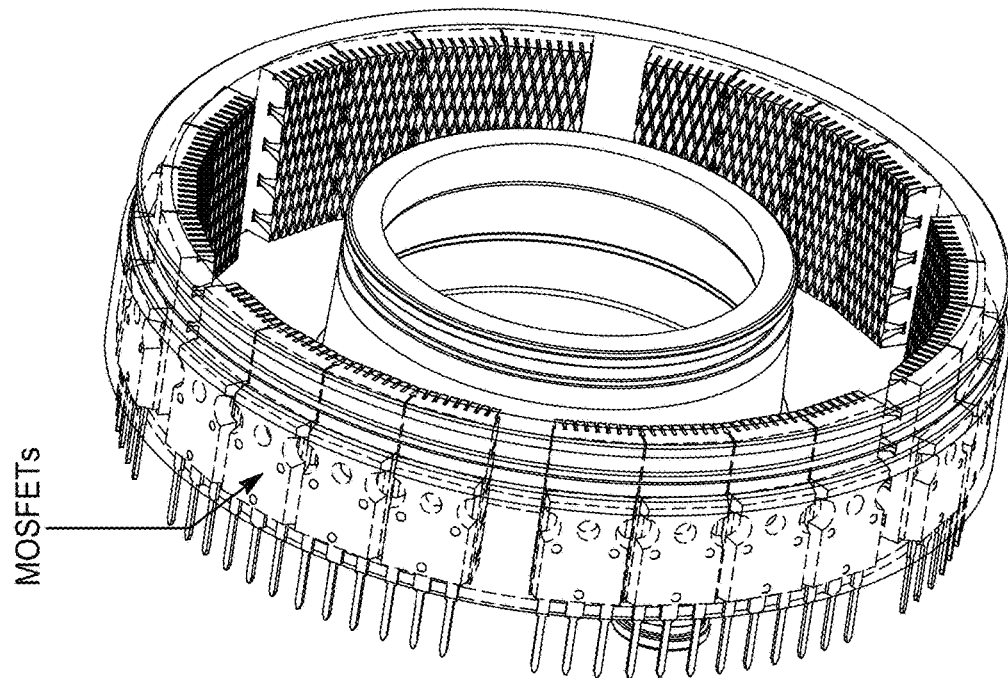
Figure 9:
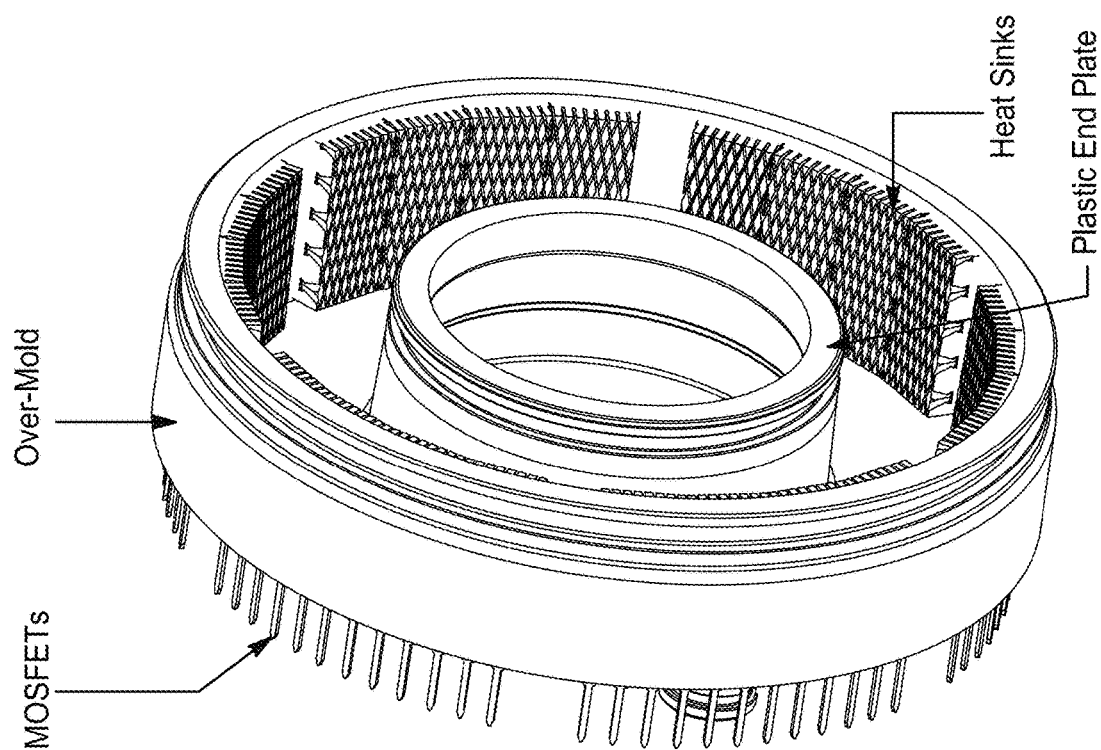
Figure 11:
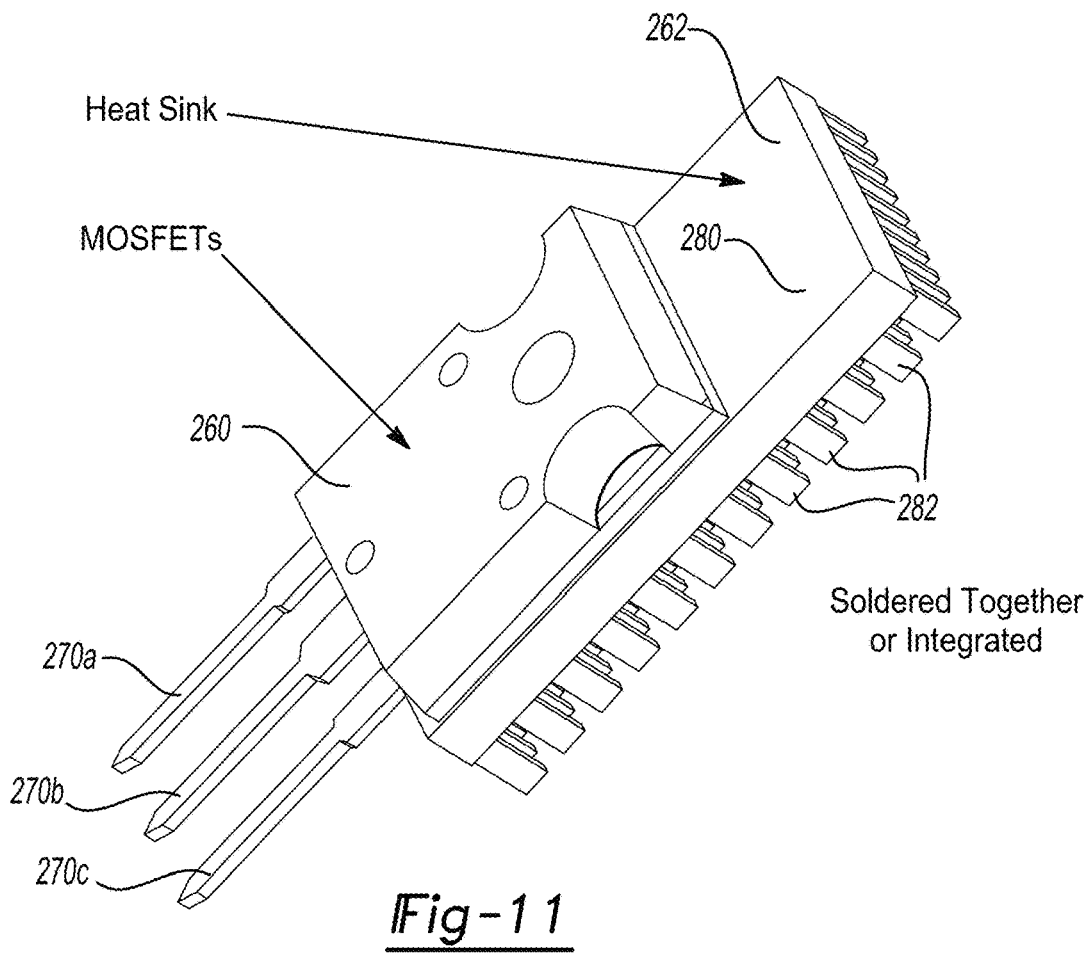
FIG. 11 is a perspective view of a portion of the inverter, illustrating a MOSFET as connected to a heat sink.
Figure 12:
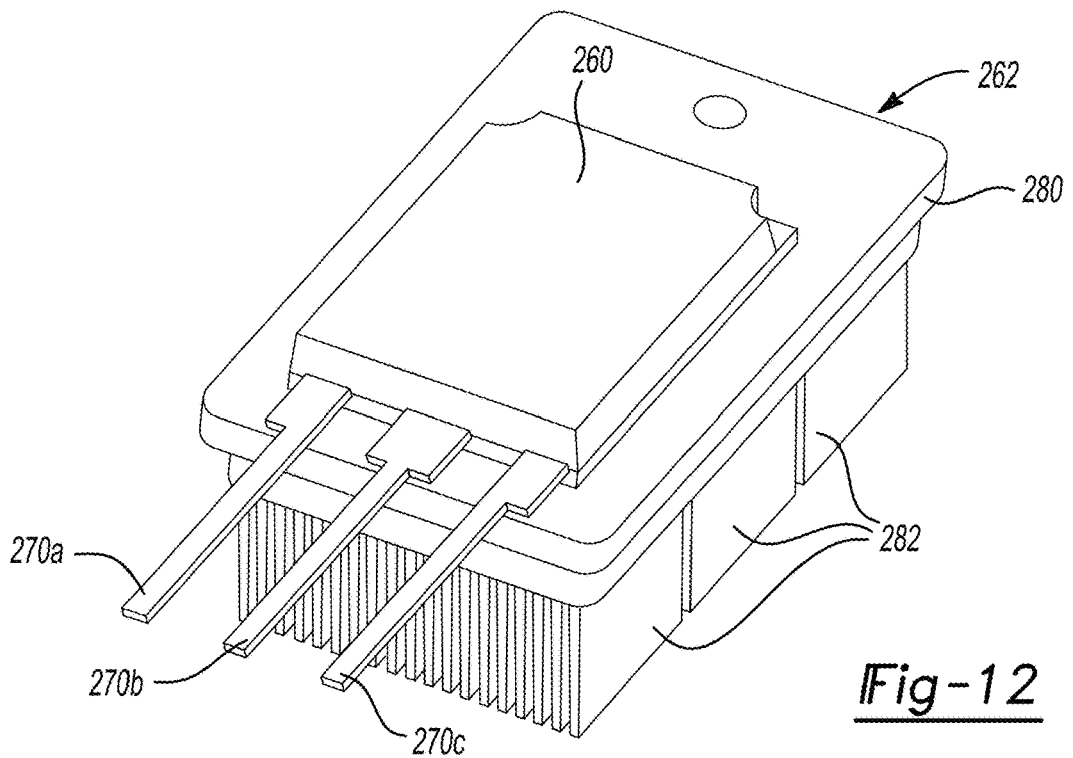
FIG. 12 is a rear perspective view illustrating a MOSFET as connected to a heat sink.
Figure 13:
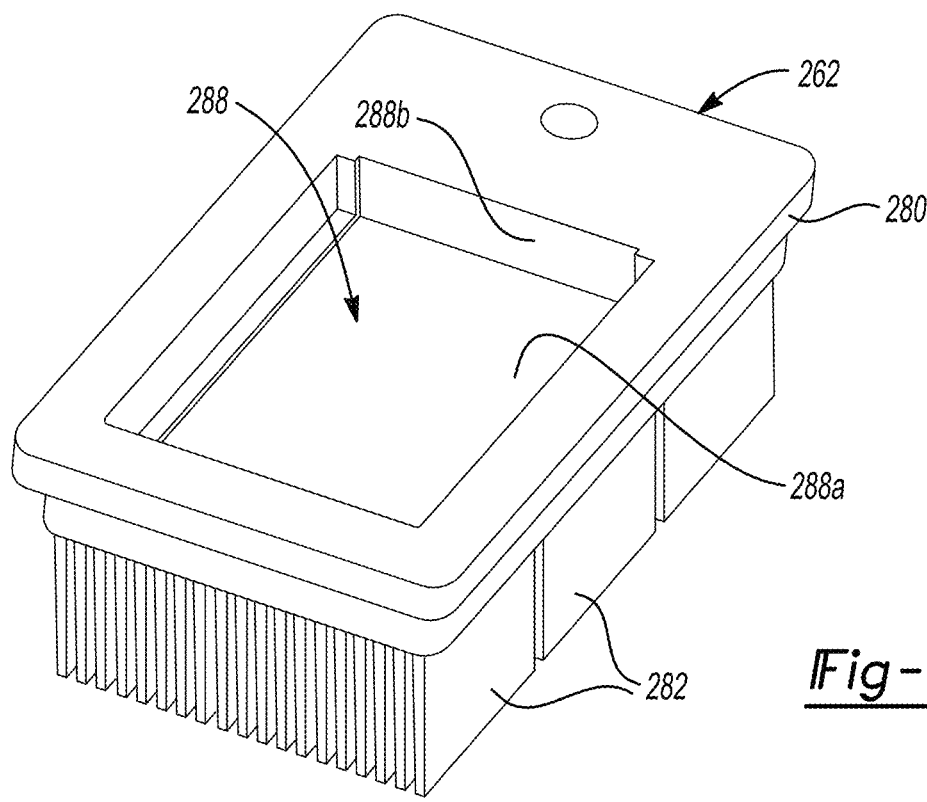
FIG. 13 is a rear perspective view of a heat sink.
Figure 14:
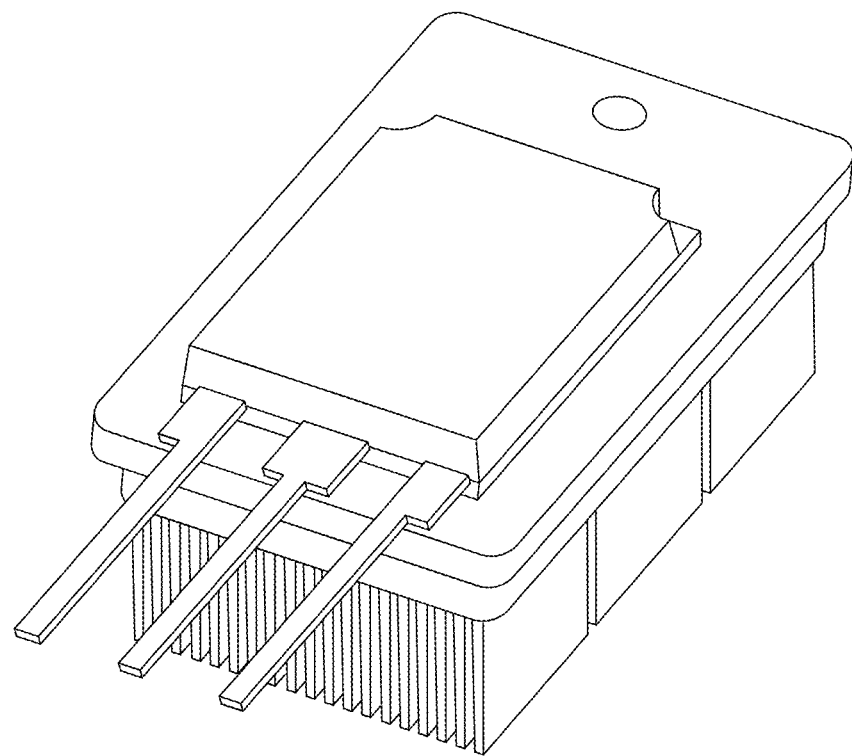
FIG. 14 is an exploded perspective view of a MOSFET, a solder material and a heat sink.

With reference to FIGS. 1 and 2, an exemplary electric drive module constructed in accordance with the teachings of the present disclosure is generally indicated by reference numeral 10. The electric drive module 10 includes a housing assembly 12, an electric motor 14, a control unit 16, a transmission 18, a differential assembly 20, a pair of output shafts 22*a* and 22*b*, a pump 24, a heat exchanger 26 (FIG. 5) and a filter 28.

The housing assembly 12 can house the electric motor 14, the control unit 16, the transmission and the differential assembly 20. The electric motor 14 can be any type of electric motor and can have a stator 32 and a rotor 34. The stator 32 can include field windings 36, whereas the rotor 34 can include a rotor shaft 38 that can be disposed within the stator 32 for rotation about a first rotational axis 40.

The transmission 18 can include a planetary reduction 42, a shaft 44 and a transmission output gear 46. The planetary reduction can have a sun gear, which can be unitarily and integrally formed with the rotor shaft 38 to keep pitch line velocity as low as possible, a ring gear, which can be grounded to or non-rotatably coupled to the housing assembly 12, a planet carrier and a plurality of planet gears that can be journally supported by the planet carrier and which can be meshingly engaged with both the sun gear and the ring gear. The sun gear, the ring gear and the planet gears can be helical gears. The shaft 44 can be mounted to a set of bearings 60 that support the shaft for rotation about the first rotational axis 40 relative to the housing assembly 12. The transmission output gear 46 can be coupled to (e.g., unitarily and integrally formed with) the shaft 44 for rotation therewith about the first rotational axis 40.

The differential assembly 20 can include a final drive or differential input gear 70 and a differential. The differential input gear 70 can be rotatable about a second rotational axis 80 and can be meshingly engaged to the transmission output gear 46. In the example provided, the transmission output gear 46 and the differential input gear 70 are helical gears. The differential can be any type of differential mechanism that can provide rotary power to the output shafts 22*a* and 22*b* while permitting (at least in one mode of operation) speed differentiation between the output shafts 22*a* and 22*b*. In the example provided, the differential includes a differential case, which is coupled to the differential input gear 70 for rotation therewith, and a differential gearset having a plurality of differential pinions, which are coupled to the differential case and rotatable (relative to the differential case) about one or more pinion axes that are perpendicular to the second rotational axis 80, and a pair of side gears that are meshingly engaged with the differential pinions and rotatable about the second rotational axis 80. Each of the output shafts 22*a* and 22*b* can be coupled to an associated one of the side gears for rotation therewith. In the example provided, the output shaft 22*b* is formed as two distinct components: a stub shaft 90 and half-shaft 92. The stub shaft 90 is drivingly coupled to an associated one of the side gears and extends between an associated gear and the half-shaft 92 and is supported by a bearing 94 in the housing assembly 12 for rotation about the second rotational axis 80. Each of the output shaft 22*a* and the half-shaft 92 has a constant velocity joint 100 with a splined male stem. The splined male stem of the constant velocity joint on the output shaft 22*a* is received into and non-rotatably coupled to an associated one of the side gears. The splined male stem of the constant velocity joint on the half-shaft 92 is received into and non-rotatably coupled to the stub shaft 90.

In FIGS. 3 through 6, the control unit 16 includes a power terminal 200, one or more field capacitor 202, an inverter 204 and a controller 206. The power terminal 200 can be mounted to the housing assembly 12 and can have contacts or terminals (not shown) that can be fixedly coupled to a respective power lead 210 to electrically couple the power lead 210 to the control unit 16. It will be appreciated that the electric motor 14 can be powered by multi-phase electric AC power and as such, the power terminal 200 can have multiple contacts or terminals to permit the several power leads 210 to be coupled to the control unit 16.

Each field capacitor 202 electrically couples an associated one of the power leads 210 to the inverter 204. In the example provided, each field capacitor 202 is relatively small and is disposed in an annular space between the inverter 204 and the housing assembly 12. The annular space can be disposed adjacent to an end of a body of the stator 32 from which the field windings 36 extend. Each field capacitor 202 can be mounted to the inverter 204.

With reference to FIGS. 3, 4 and 7 through 10, the inverter 204 can be an annular structure that can be mounted about the field windings 36 that extend from the body of the stator 32. In the example provided the inverter 204 includes a transistor assembly 250 and a circuit board assembly 252. The transistor assembly 250 can comprise a plurality of surface mount MOSFET's 260, a plurality of heat sinks 262, and a retaining member 264.

With reference to FIGS. 11 through 14, each of the MOSFET's 260 can include a plurality of device or pin terminals 270*a*, 270*b* and 270*c* and a surface-mount power terminal (not specifically shown). The surface-mount power terminal of each MOSFET 260 can be soldered to an associated one of the heat sinks 262. In the example provided, each heat sink 262 has a base 280 and a plurality of fins 282 that extend from the base 280. The base 280 can optionally define a pocket 288 that is configured to receive the MOSFET 260. The pocket 288 has a bottom surface 288*a*. A riser 288*b*, which is a tapered surface of the pocket that provides clearance between the heat sink 262 and the MOSFET 260, can be provided to permit air to vent from/prevent air entrapment in the pocket 288 when the MOSFET 260 is received into the pocket 288 and soldered to the bottom surface 288*a*. The solder can be placed into the pocket 288 prior to inserting the MOSFET 260 into the pocket 288. The solder can optionally be in the form of a metal foil. The retaining member 264 can be a suitable electrically insulating plastic material that can be overmolded onto the MOSFET's 260 and heat sinks 262.

The plastic of the retaining member 264 can cohesively bond to the MOSFET's 260 and the heat sinks 262 to thereby fixedly couple the MOSFET's and heat sinks 262 to one another. Configuration in this manner eliminates relative motion between the MOSFET's 260 and between each of the MOSFET's 260 and its associated heat sink 262, as well as creates a fluid-tight seal that inhibits fluid migration from the interior of the transistor assembly 250 in a radially outward direction. The retaining member 264 can carry a seal that can form a seal between the retaining member 264 and the housing assembly 12.

If desired, the solder can be a relatively low temperature solder that has a melting point that is below a predetermined target temperature. The target temperature can be a temperature that is below a maximum operating temperature of the transistor assembly 250. For example, the target temperature can be the expected temperature of the transistor assembly 250 when the electric motor 14 (FIG. 1) was powered at approximately 30%, 50%, or 80% of maximum power for a predetermined time interval, such as three hours. In such situation, the solder between the surface-mount power terminal and the heat sink 262 would be expected to melt from time to time during the operation of the electric drive module 10 (FIG. 1). The melted solder would remain conductive and the retaining member 264 would both inhibit relative movement between the MOSFET's 260 and the heat sinks 262 but also inhibit migration of the liquid solder out of the pocket 288 and away from the interface between the surface-mount power terminal and the bottom surface 288a of the pocket 288. As such, the melting of the solder would not impair operation of the electric motor 14 (FIG. 1). Furthermore, the solder would eventually cool and re-bond the surface-mount power terminal to the bottom surface 288a of the pocket 288. It will be appreciated that different alloys could be employed to tune the melt point of the solder to a desired temperature or temperature range.

Figure 15:
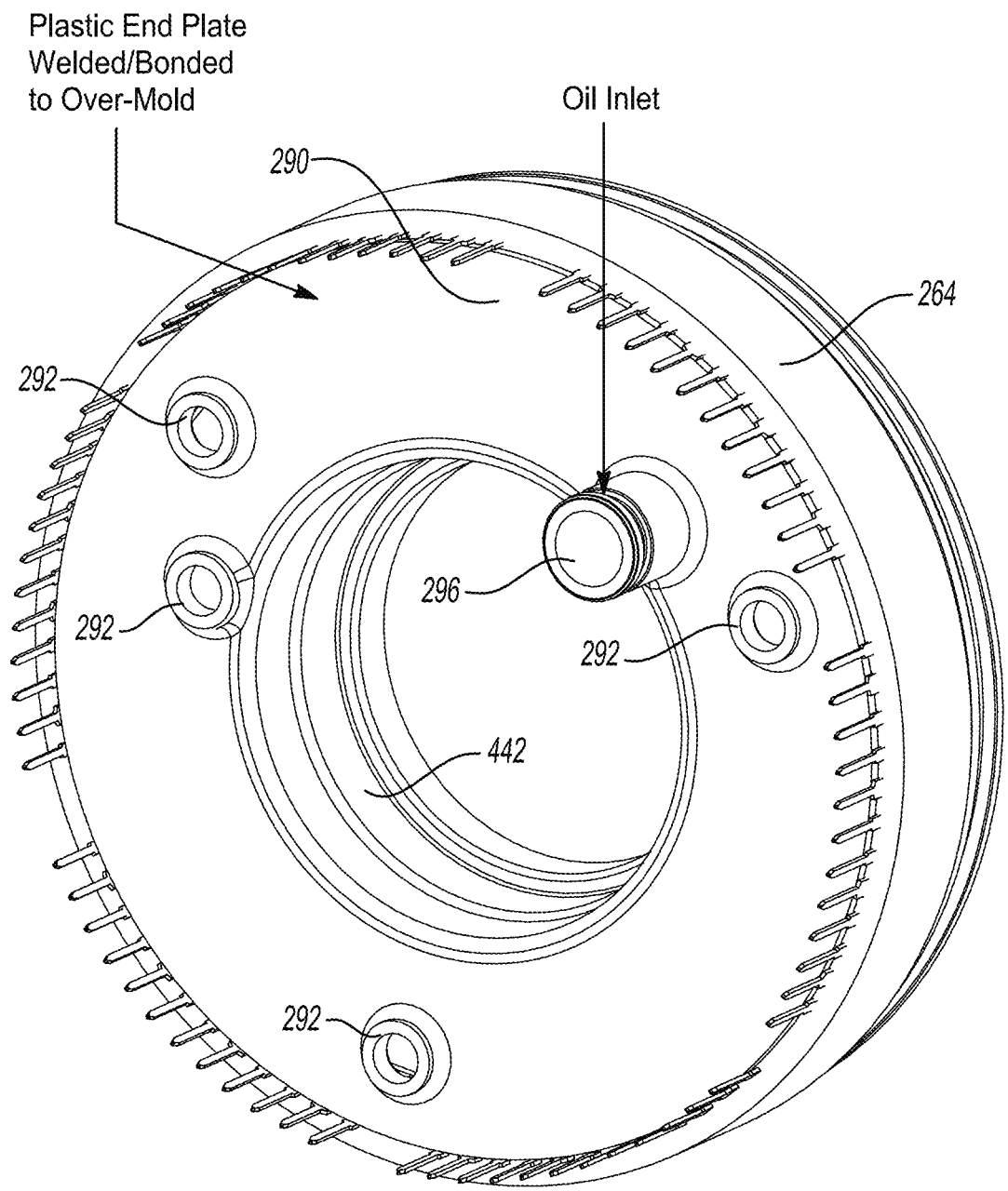
FIG. 15 is a perspective view of the inverter shown with an end plate.

With reference to FIG. 15, an annular end plate 290 can be fixedly and sealingly coupled to the retaining member 264. The end plate 290 can include a plurality of phase lead bosses 292, which can accept phase leads 294 (FIG. 3) of the field windings 36 (FIG. 3) therethrough, as well as an oil inlet port 296.

Figure 3:
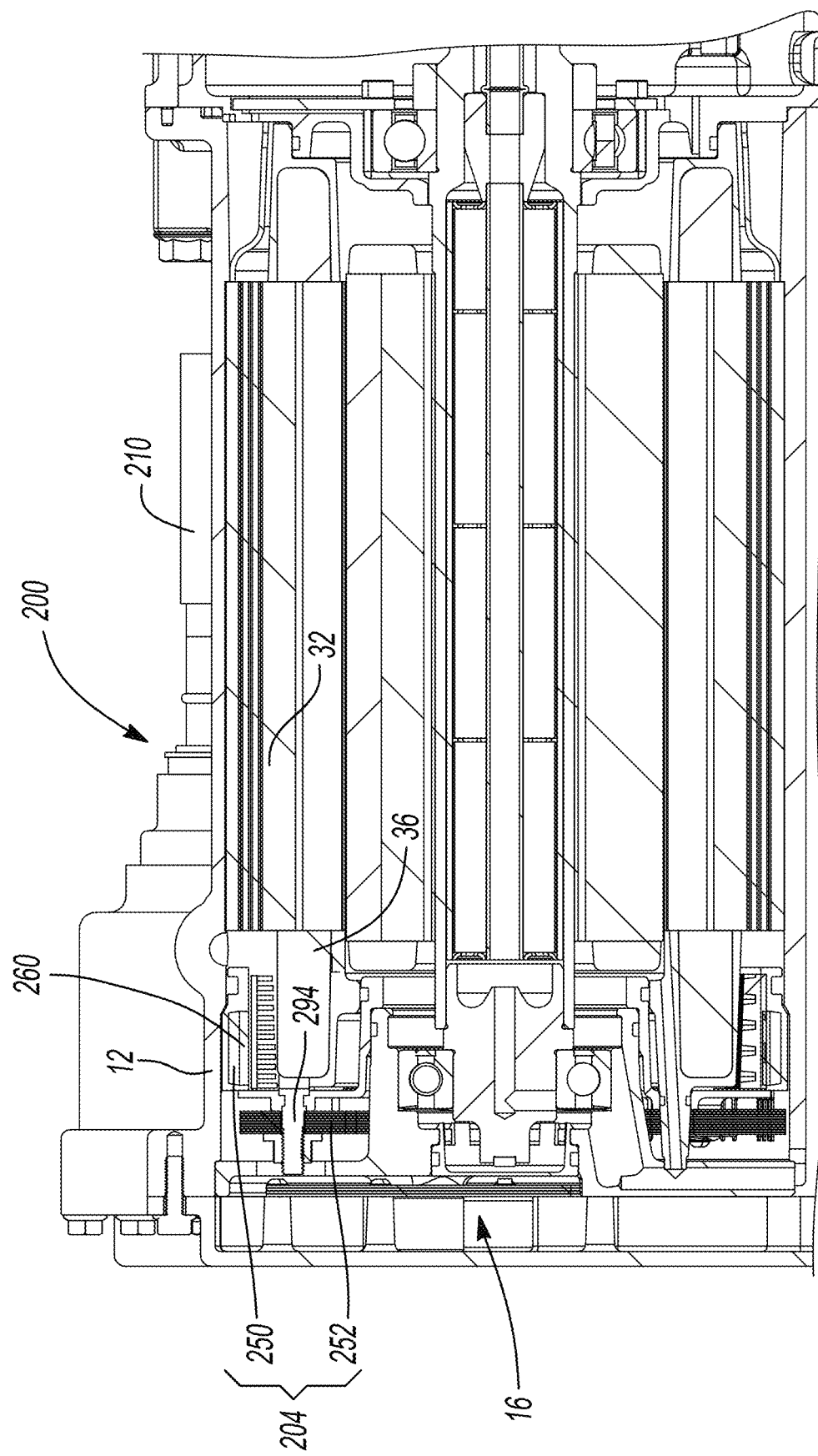
FIGS. 3 and 4 are sections view of a portion of the electric drive unit of FIG. 1, illustrating the construction of a motor assembly in more detail.
Figure 4:
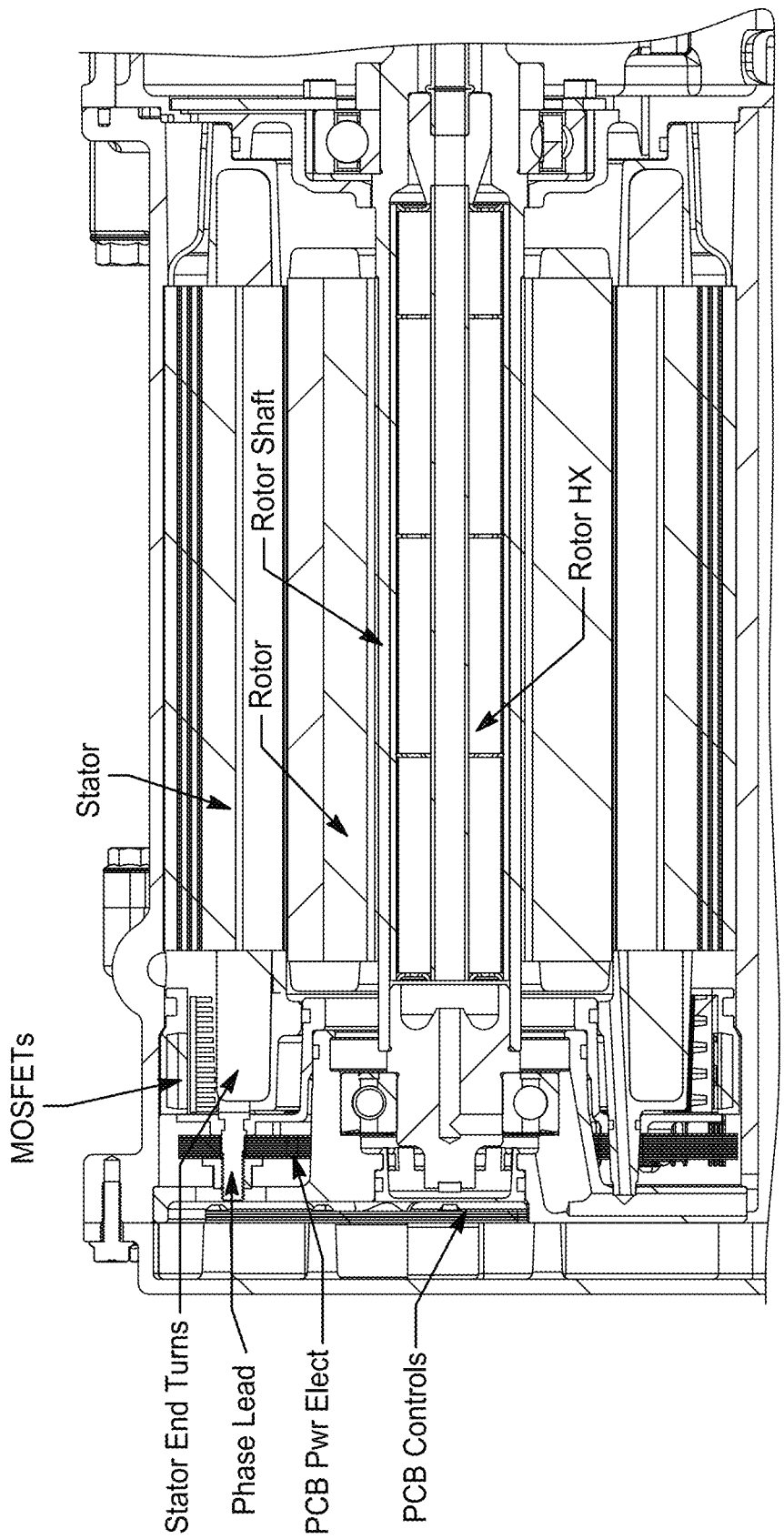

In FIGS. 3 and 4, the circuit board assembly 252 can comprise a plurality of printed circuit boards that can be stacked against one another and electrically coupled to the pin terminals of the MOSFET's 260 as well as to the phase leads 294 of the field windings 36 of the stator 32. The quantity of printed circuit boards is dependent upon the thickness of the electrical traces or conductors on each of the printed circuit boards and the amount of current that is to pass through between each MOSFET 260 and an associated one of the field windings 36.

Figure 16:
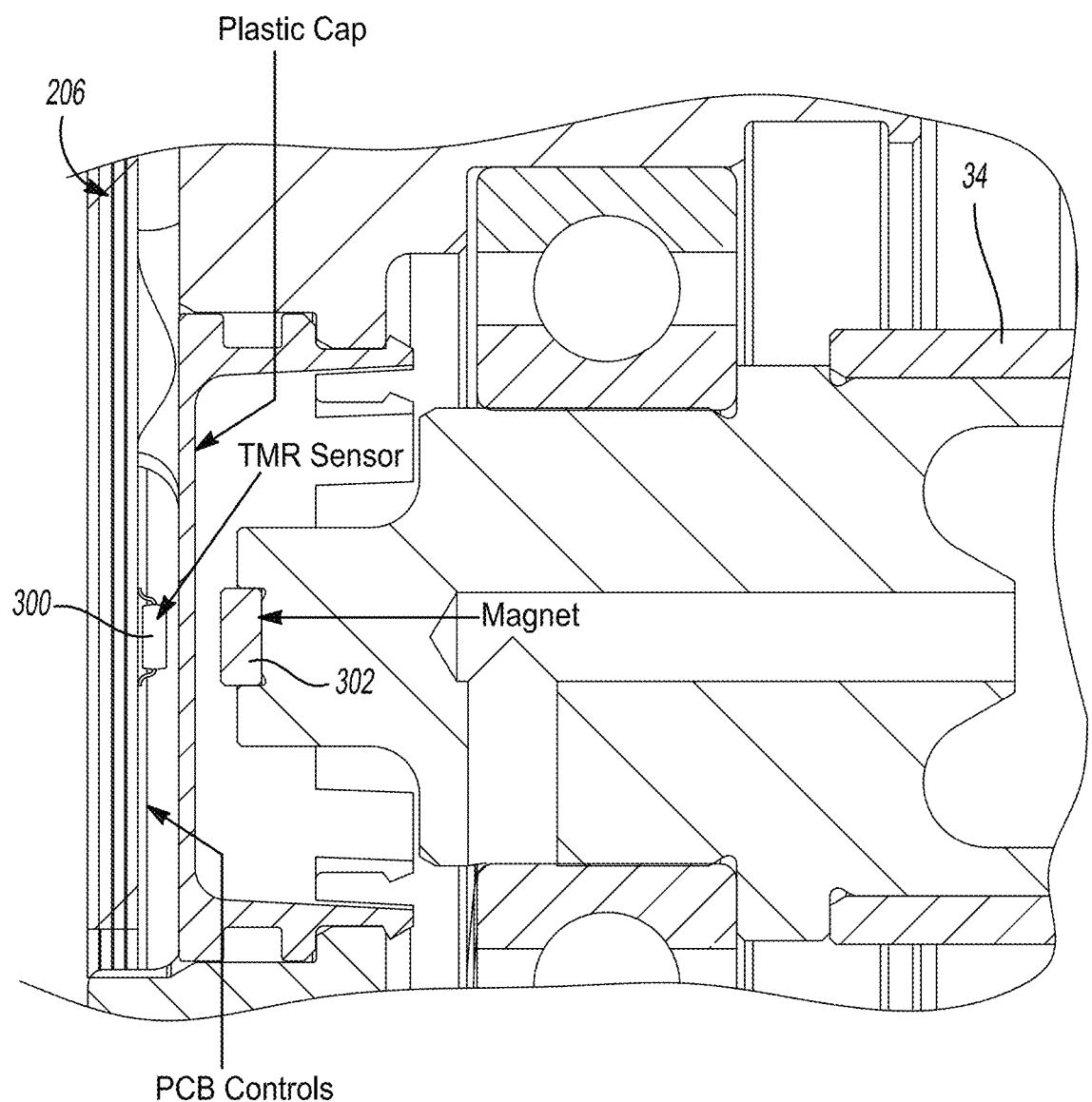
FIG. 16 is a sectional view of a portion of the electric drive unit of FIG. 1, illustrating a sensor assembly having a TMR sensor that is mounted to a control board and a magnet that is coupled for rotation with a rotor of the motor assembly.

With reference to FIG. 16, the controller 206 is configured to sense a rotational position of the rotor 34 relative to the stator 32 (FIG. 1) and responsively control the flow of electric power from the inverter 204 (FIG. 3) to the field windings 36 (FIG. 3) to rotate the magnetic field that is produced by the field windings 36 (FIG. 3). The controller 206 can include a second circuit board assembly that can comprise a plurality of stacked printed circuit boards. The second circuit board assembly can have conventional hardware and control programming for operating the electric motor 14 (FIG. 1) and a TMR sensor 300 that is configured to sense a rotational position of a magnetic field of a magnet 302 that is fixedly coupled to the rotor 34. The TMR sensor 300 and the magnet 302 can optionally be used in place of a conventional encoder or resolver. Significantly, the controller 206 uses direct voltage traces on the various printed circuit boards and/or the pins of the MOSFETS instead of resistors to determine current flow.

Figure 17:
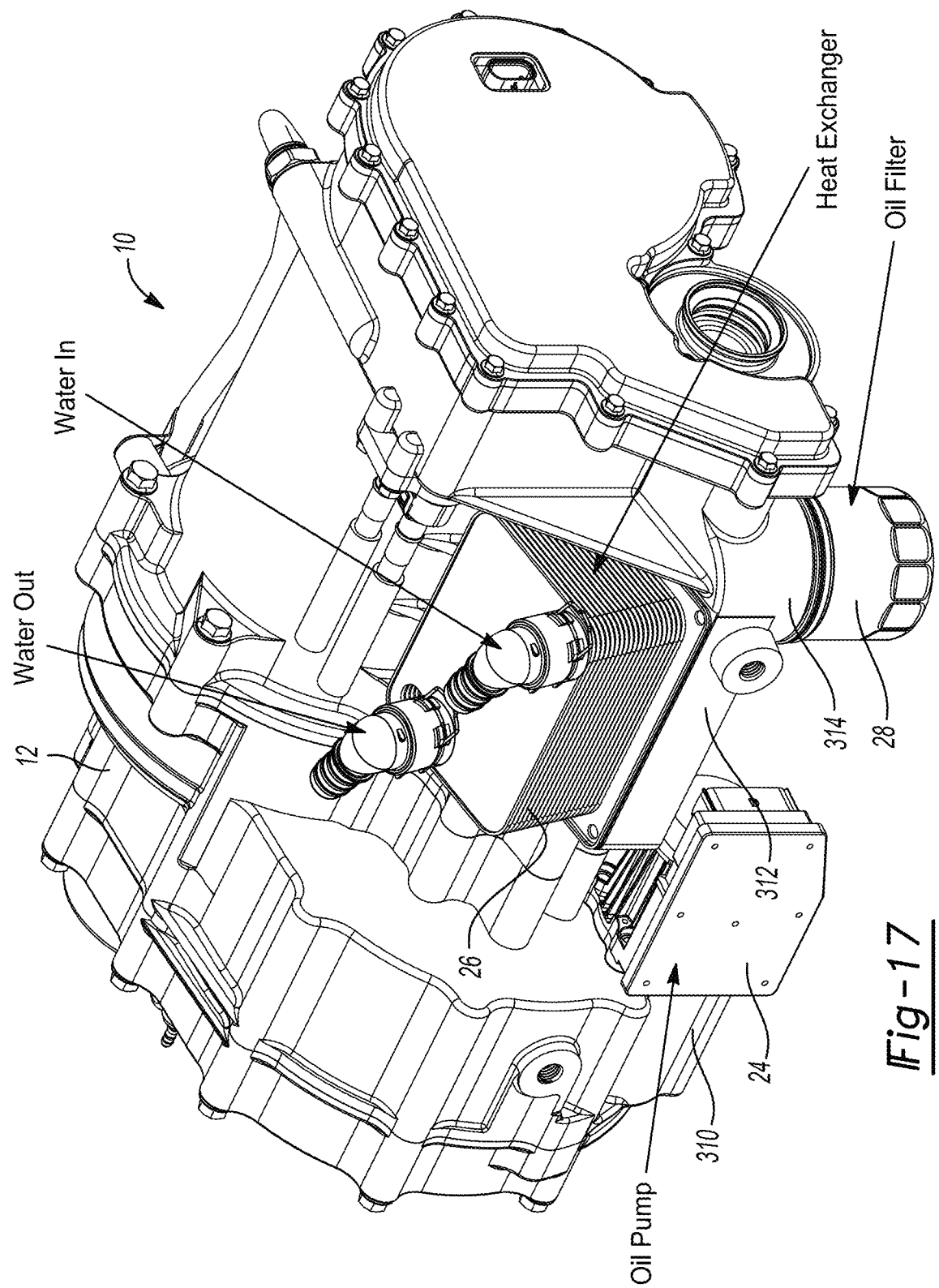
FIG. 17 is a perspective view of the electric drive unit of FIG. 1.

In FIG. 17, the housing assembly 12 is shown to have a pump mount 310, a heat exchanger mount 312 and a filter mount 314. The pump 24 can be mounted to the pump mount 310 and can circulate an appropriate fluid about the electric drive module 10 to both lubricate and/or cool various components. In the example provided the fluid is a suitable dielectric fluid, such as automatic transmission fluid. The heat exchanger 26 can be mounted to the heat exchanger mount 312 and can be configured to receive a pressurized cooling fluid, such as a water-glycol mixture, from an external source and to facilitate the transfer of heat from the dielectric fluid circulated in the electric drive module 10 to the pressurized cooling fluid. The filter 28 can be any suitable filter, such as a spin-on oil filter, can be mounted to the filter mount 314, and can filter the dielectric fluid that is circulated within the electric drive module.

Figure 18:
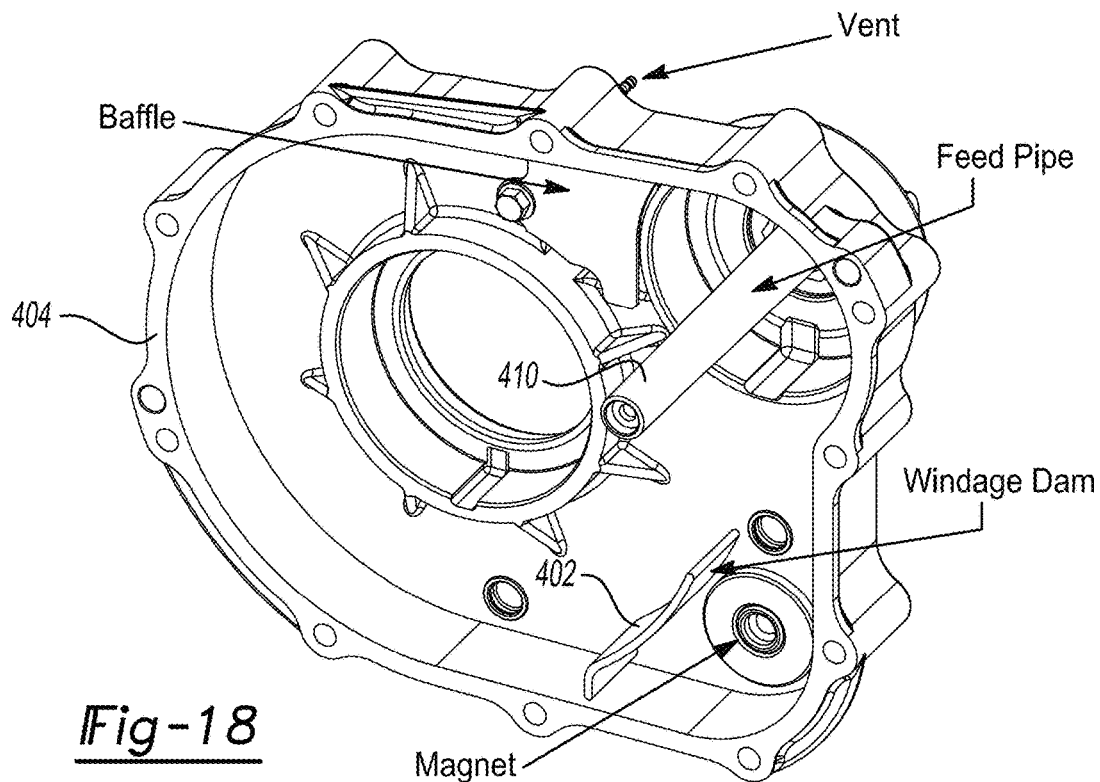
FIG. 18 is a rear perspective view of a portion of a housing of the electric drive unit of FIG. 1.
Figure 19:
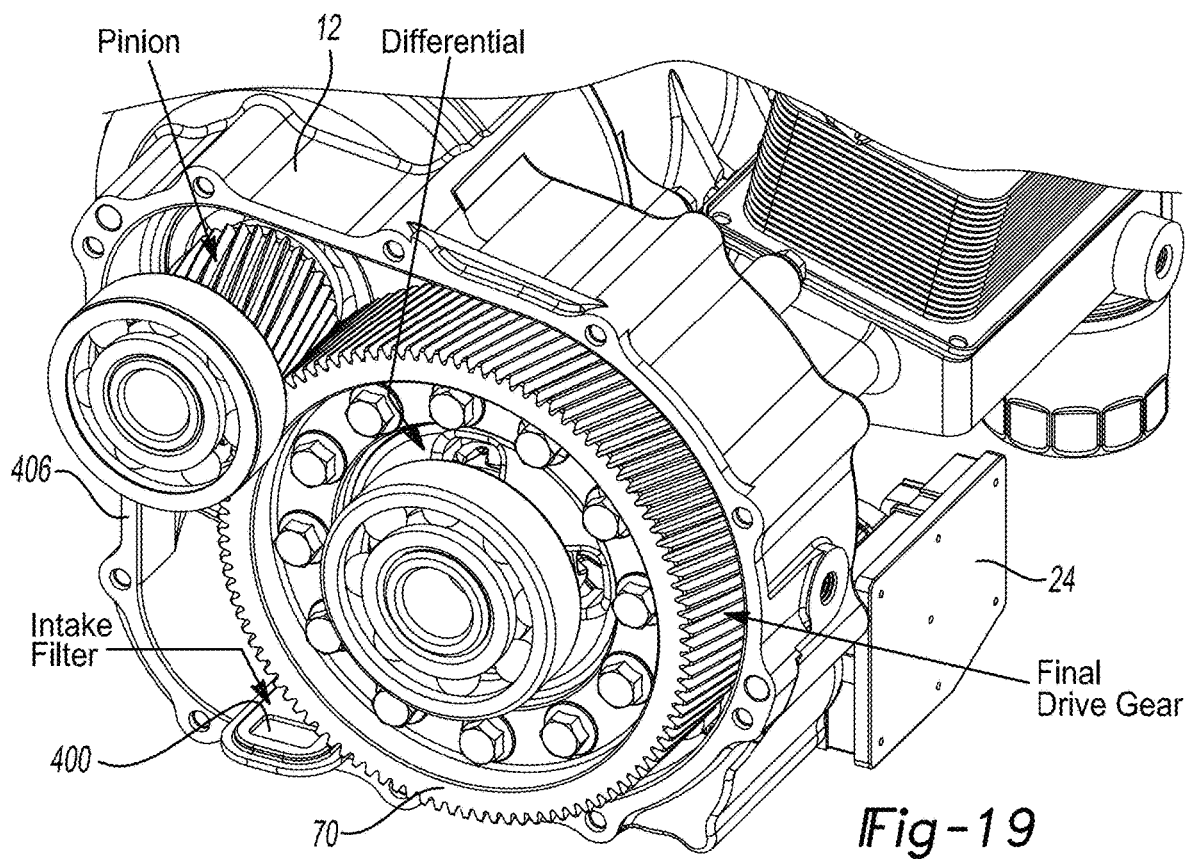
FIG. 19 is a perspective view of a portion of the electric drive unit of FIG. 1 with the portion of the housing shown in FIG. 18 removed.
Figure 20:
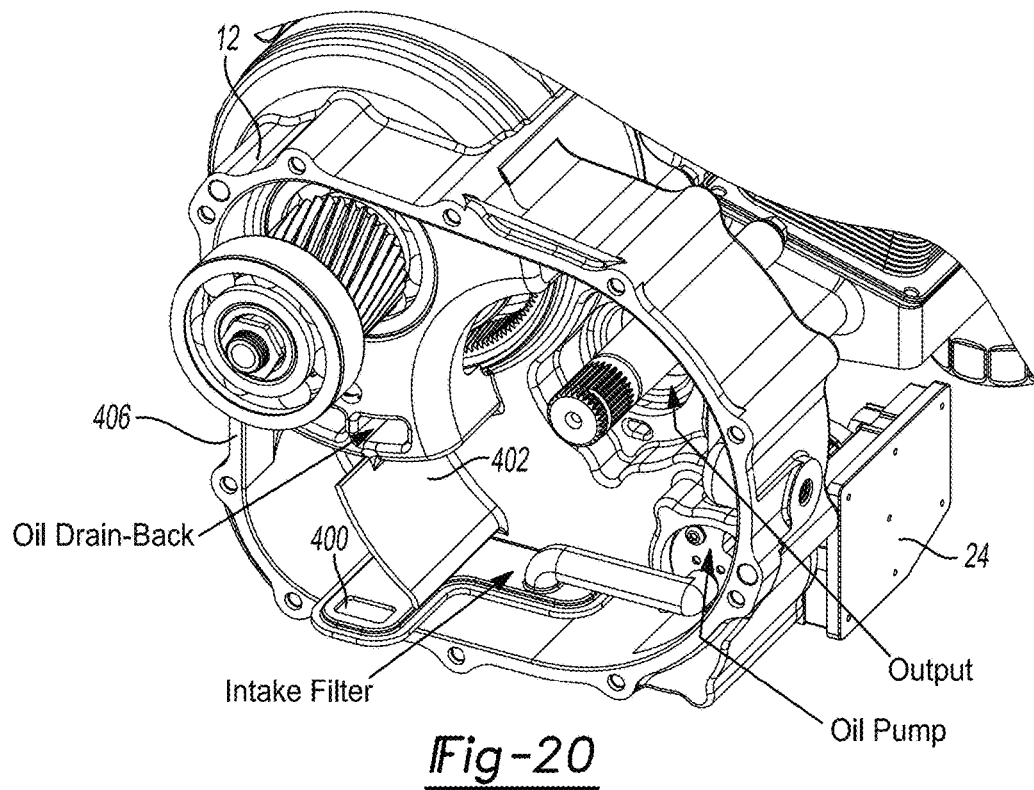
FIG. 20 is similar to that of FIG. 19, but depicting the electric drive unit with a portion of a transmission and a differential assembly removed.

With reference to FIGS. 18 through 20, an intake filter or screen 400 can be disposed in a portion of the housing assembly 12 that houses the differential input gear 70. The intake filter 400 can receive dielectric fluid that can be returned to the low-pressure side of the pump 24. A windage dam 402 can be integrated into a cover 404 and a main housing portion 406 of the housing assembly 12 to shield the dielectric fluid that is being returned to the intake filter 400 from the differential input gear 70. More specifically, the windage dam 402 can cause dielectric fluid to accumulate in the vicinity of the intake filter 400 and segregate the accumulated fluid from the (rotating) differential input gear 70. It will be appreciated that without the windage dam 402, the rotating differential input gear 70 would tend to pull dielectric fluid away from the intake filter 400, which could prevent sufficient dielectric fluid from being returned to the low pressure (intake) side of the pump 24. It will also be appreciated that segregating the dielectric fluid from the rotating differential input gear 70 can reduce drag losses that would otherwise be incurred from the rotation of the differential input gear 70 through the dielectric fluid. The cover 404 can also include a tubular feed pipe 410.

Figure 21:
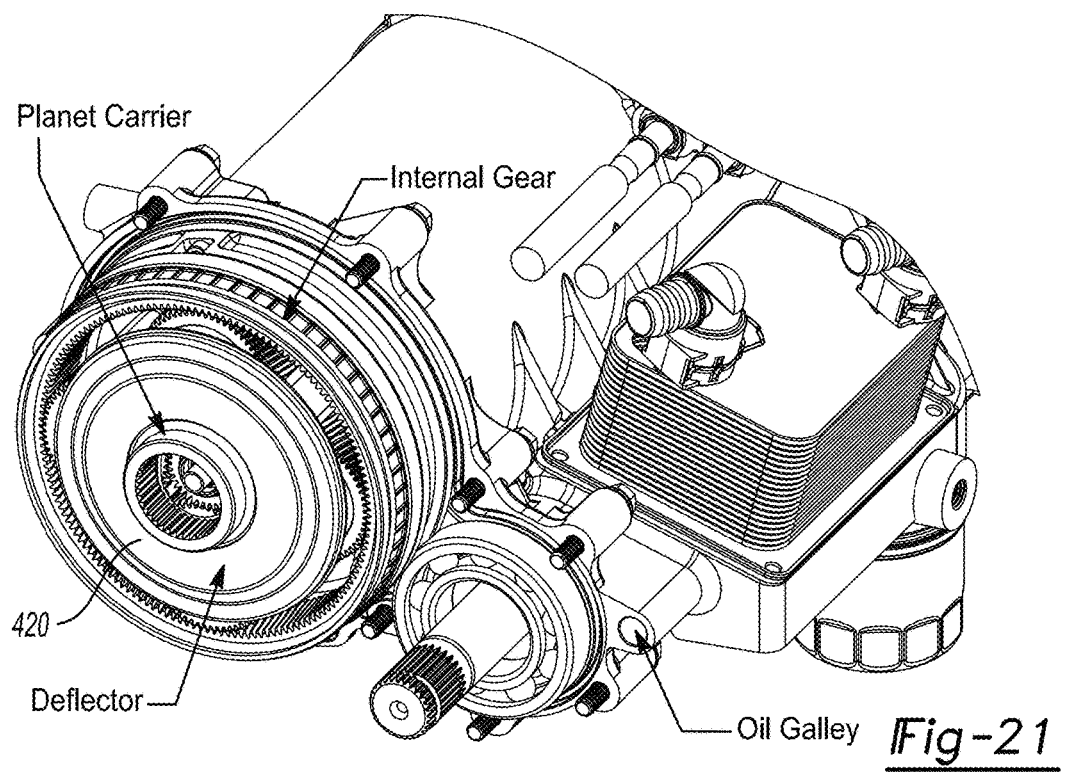
FIG. 21 is similar to that of FIG. 20, but depicting a further portion of the housing removed to better show a portion of the transmission.
Figure 22:
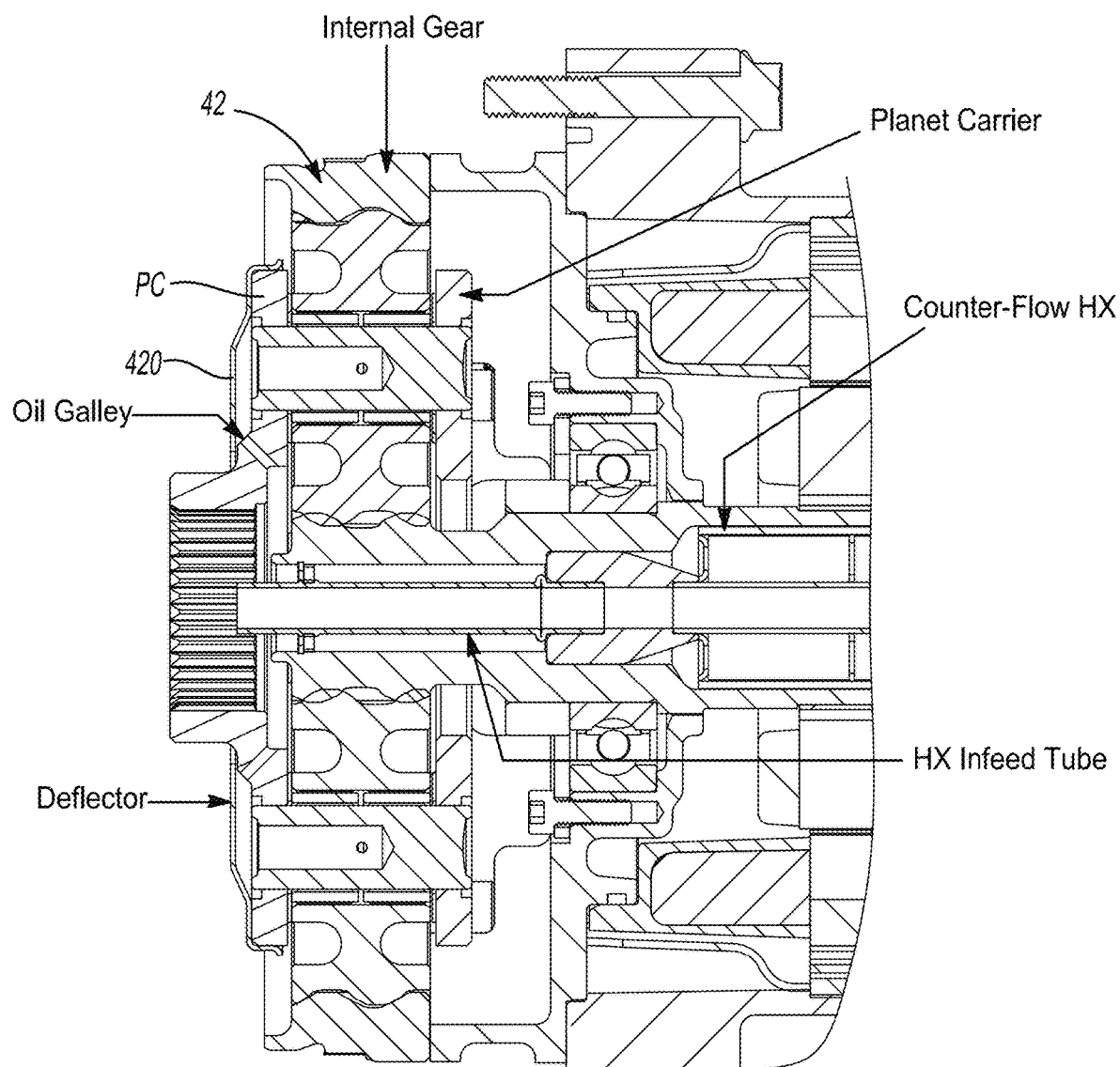
FIG. 22 is a sectional view of a portion of the electric drive unit that is shown in FIG. 21.

With reference to FIGS. 21 and 22, a deflector 420 can be mounted to the planet carrier PC and can shield the planetary reduction 42 from dielectric fluid that is slung from other rotating components and/or cause dielectric fluid to drain from the planetary reduction 42 in a desired manner.

Figure 23:
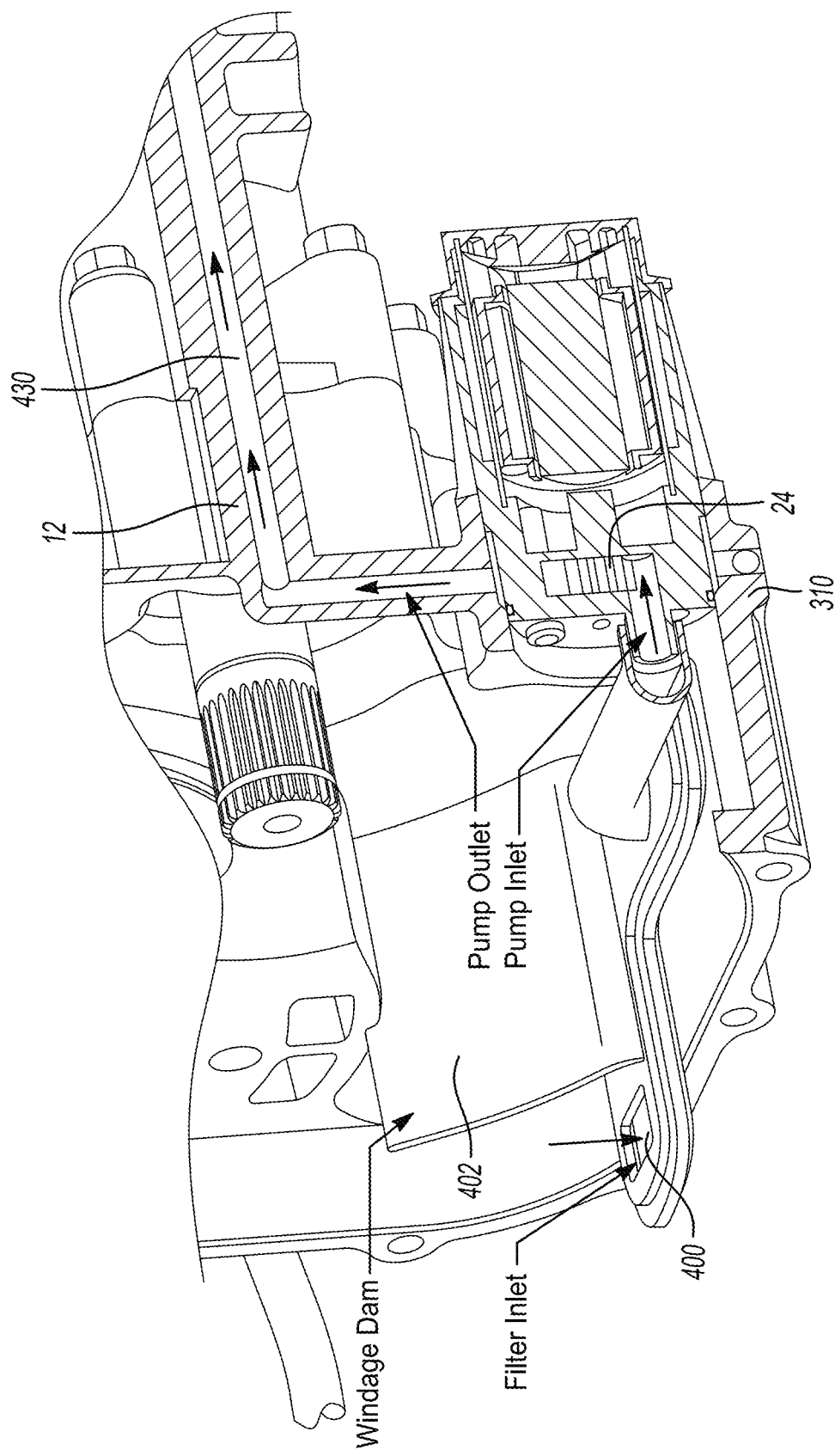
FIGS. 23 through 44 are section views of various portions of the electric drive unit of FIG. 1, depicting the flow of cooling and lubricating oil through various portions of the electric drive unit.
Figure 24:
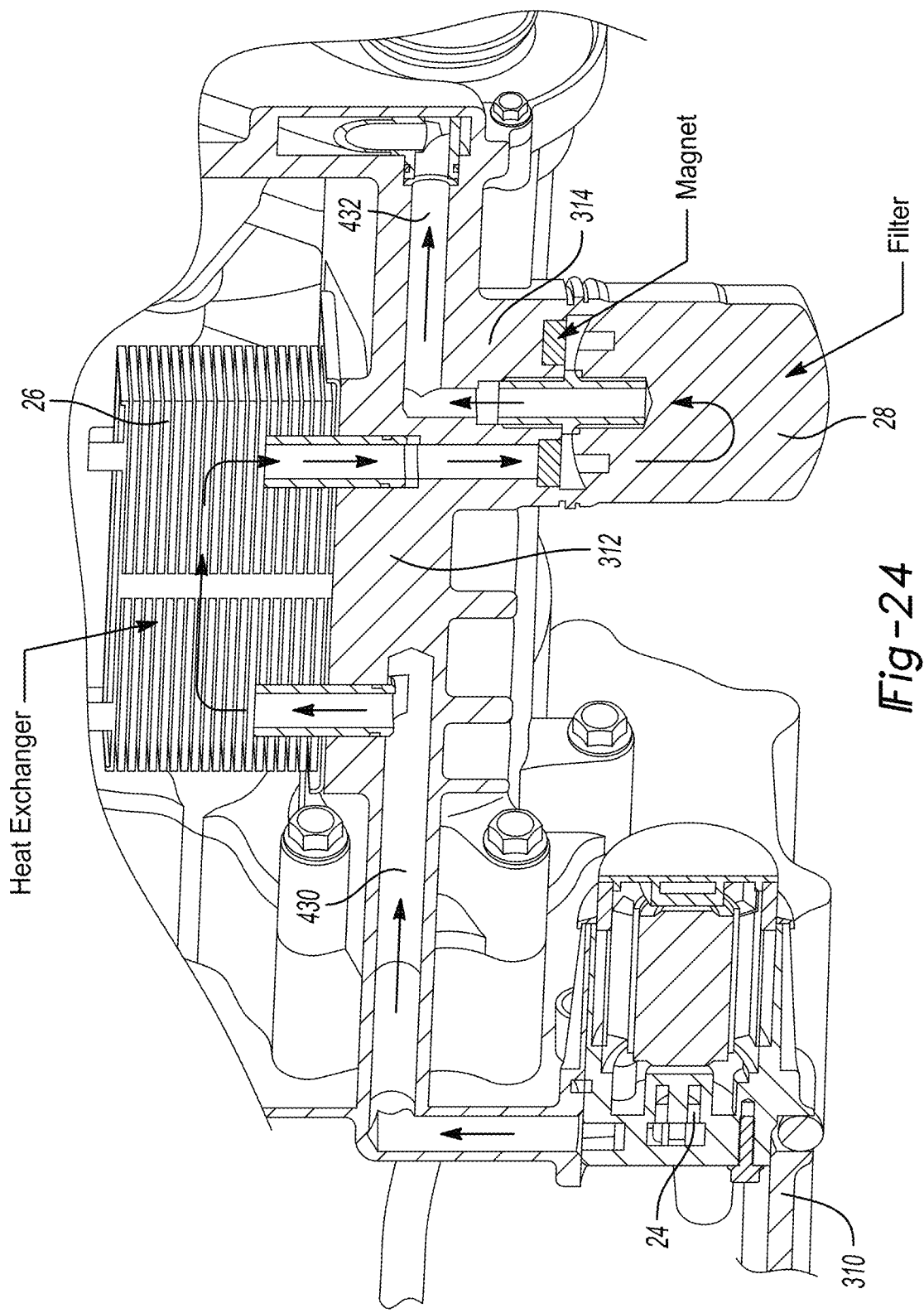

In FIGS. 23 and 24, dielectric fluid is received into the intake filter 400 and transmitting to the low pressure (inlet) side of the pump 24. High pressure dielectric fluid exits the pump 24 and travels through an internal gallery 430 in the housing assembly 12 to an inlet passage of the heat exchanger mount 312, through the heat exchanger 26, into an outlet passage of the heat exchanger mount 312, into an inlet passage of the filter base 314, through the filter 28, into an outlet passage in the filter mount 314 and to another internal gallery 432 in the housing assembly 12.

Figure 25:
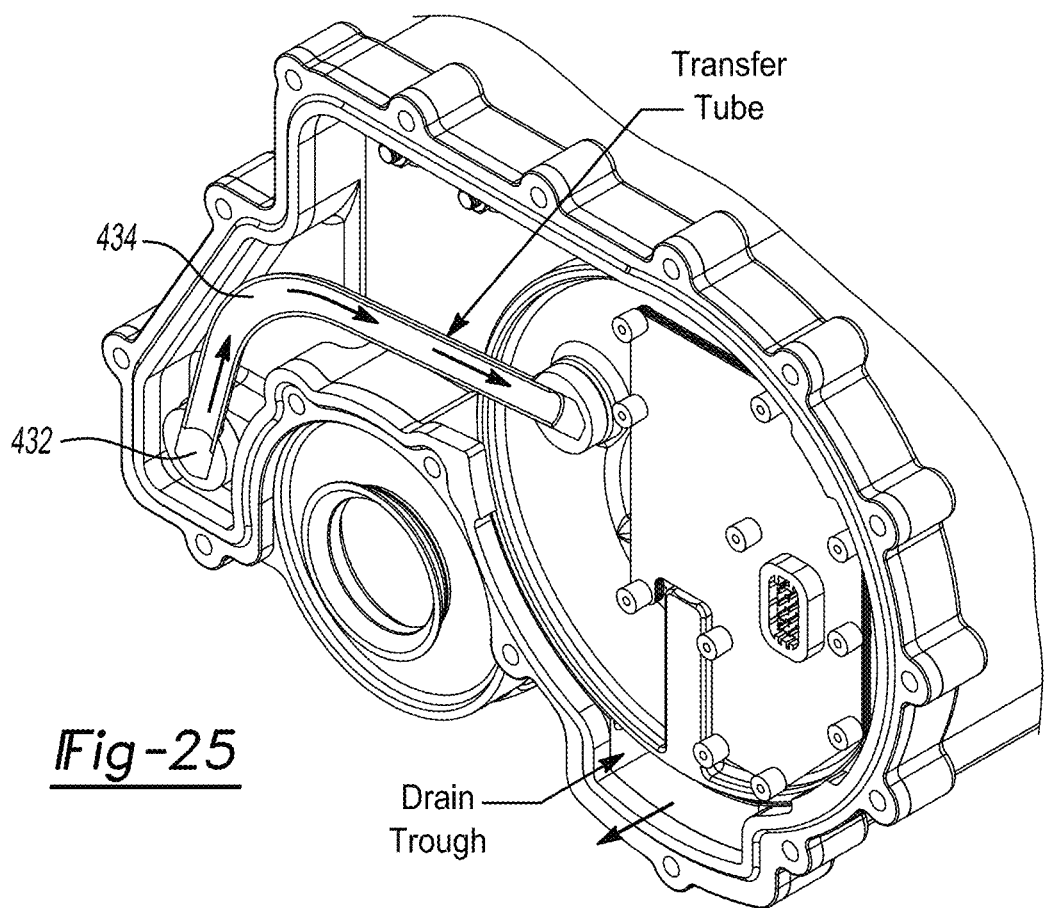
Figure 26:
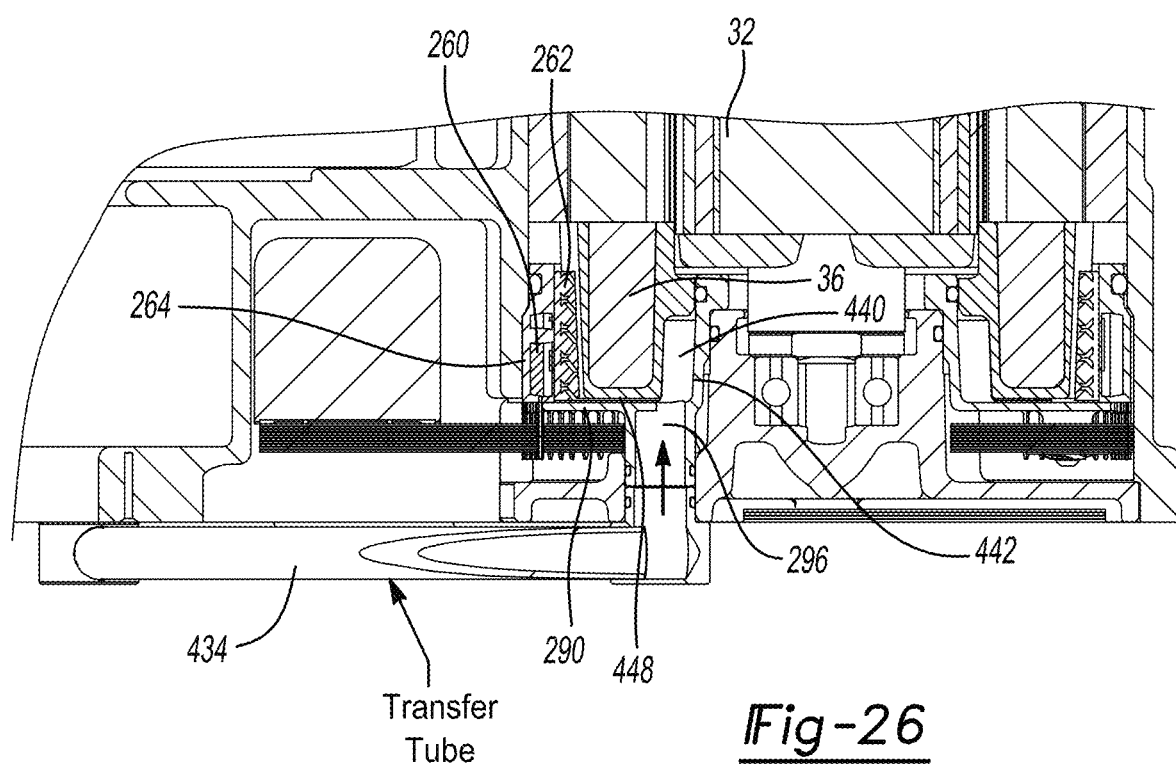

In FIGS. 25 and 26, dielectric fluid exiting the internal gallery 432 can travel through a transfer tube 434 through the oil inlet port 296 in the end plate 290 and can enter an annular cavity 440 that is located radially between a tubular central projection 442 on the end plate 290 and the field windings 36. The central projection 442 can carry a seal that can be sealingly engaged to the central projection 442 and to the field windings 36. An annular gap 448 is formed between an axial end of the field windings 36 and an annular portion of the end plate 290. As noted previously, the end plate 290 is fixedly and sealingly coupled to the retaining member 264 of the transistor assembly 250.

Figure 27:
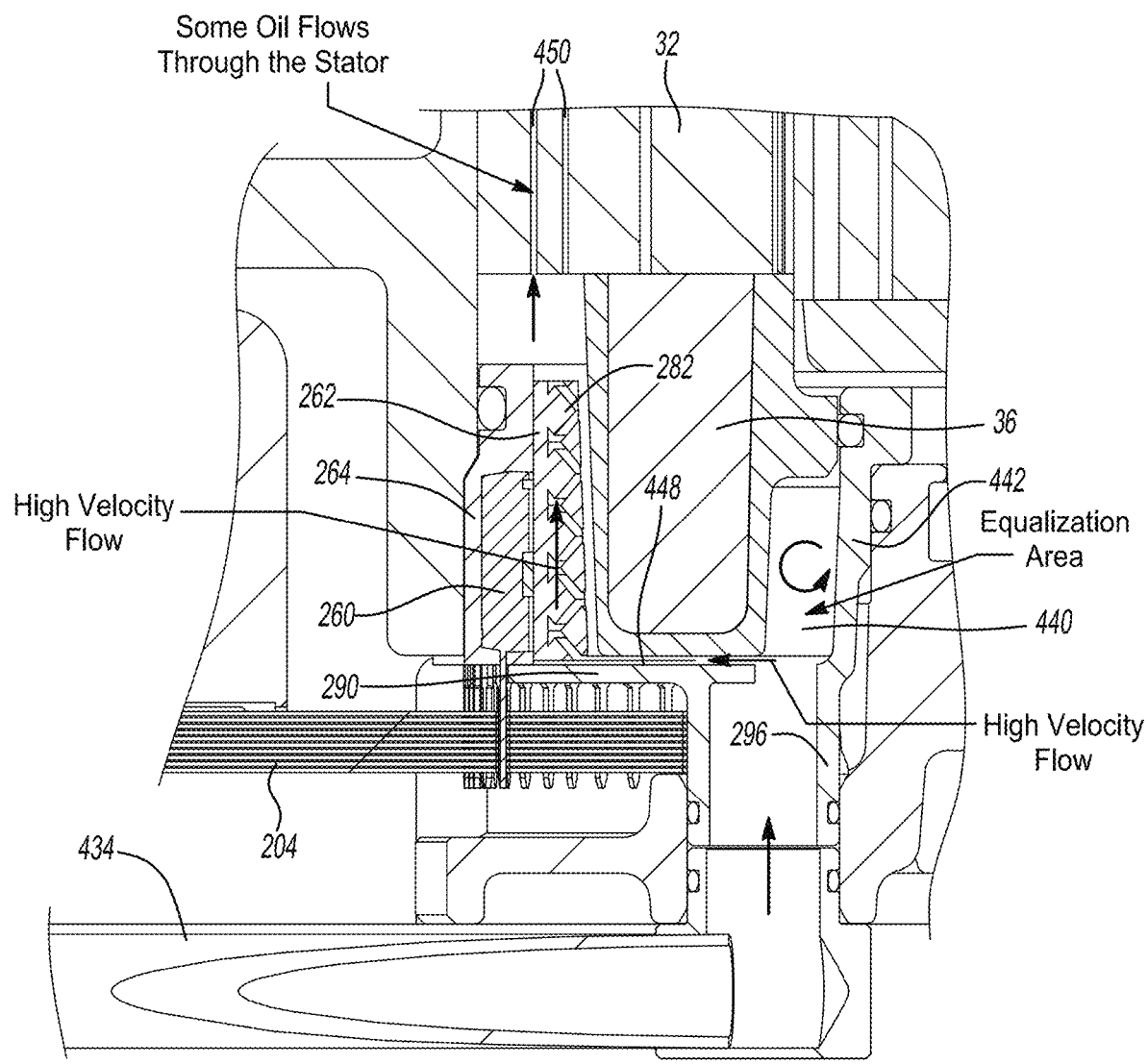
Figure 28:
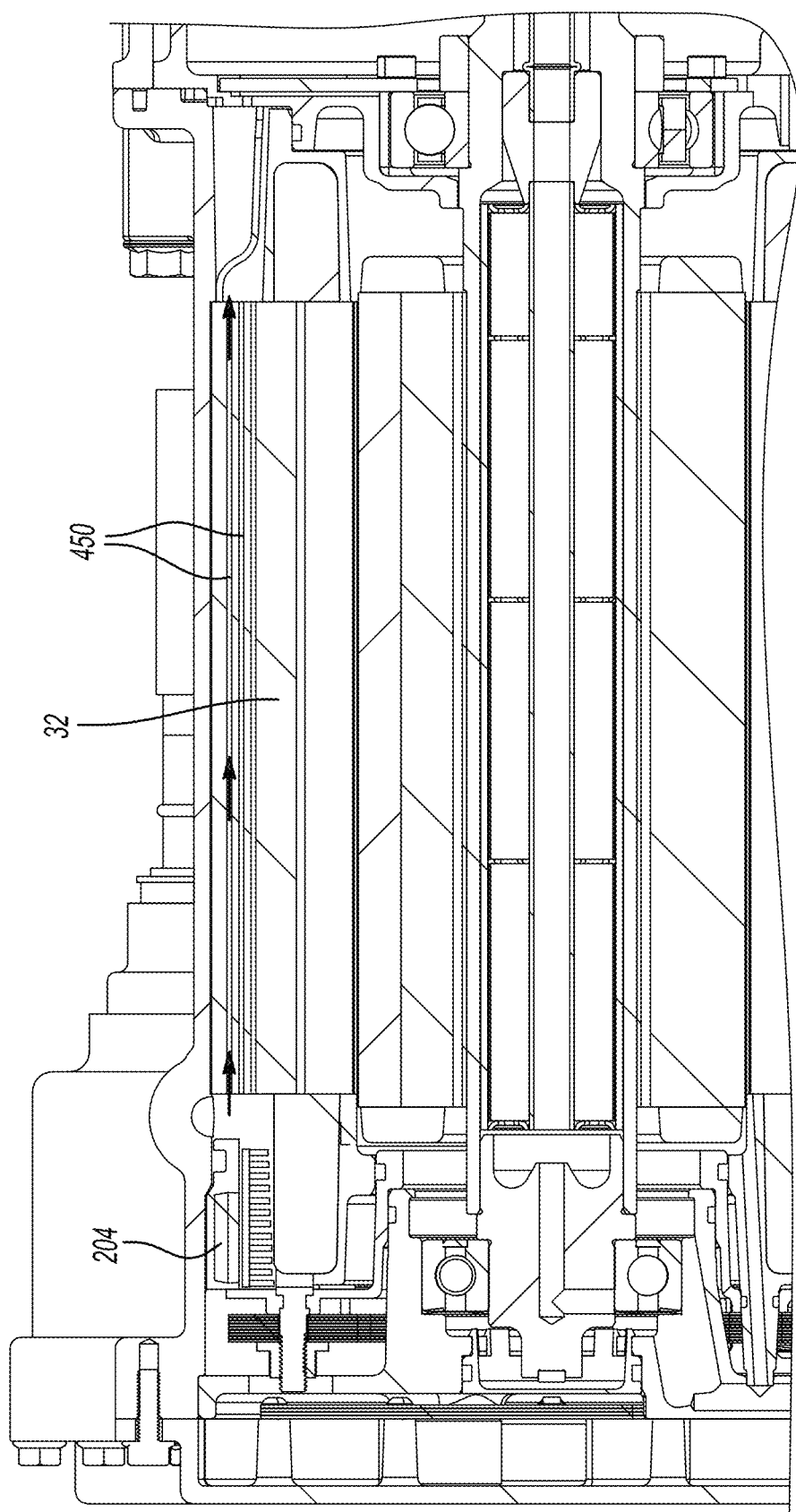

In FIG. 27, the dielectric fluid is shown to flow through the annular gap 448, through the fins 282 in the heat sinks 262 and into passages 450 formed axially through the stator 32. While the fins 282 have been depicted herein as perpendicular projections, it will be appreciated that the fins 282 could be shaped differently (for example, as diamond shaped projections) to cause the flow of dielectric fluid passing through the fins 282 to move in both tangential and axial directions. Flow in this manner may be beneficial for rejecting more heat from the heat sinks 262 into the dielectric fluid and/or to produce a desired flow restriction that can aid in the pressure balancing of the cooling flow to the rotor. Accordingly, it will be appreciated that dielectric fluid is introduced to the inverter 204, passes through fins 282 on heat sinks 262 that are electrically conductively coupled to power terminals of the MOSFET's 260 to thereby cool the inverter 204, and thereafter enters the passages 450 in the stator 32 to cool the stator 32 as is shown in FIG. 28.

Figure 29:
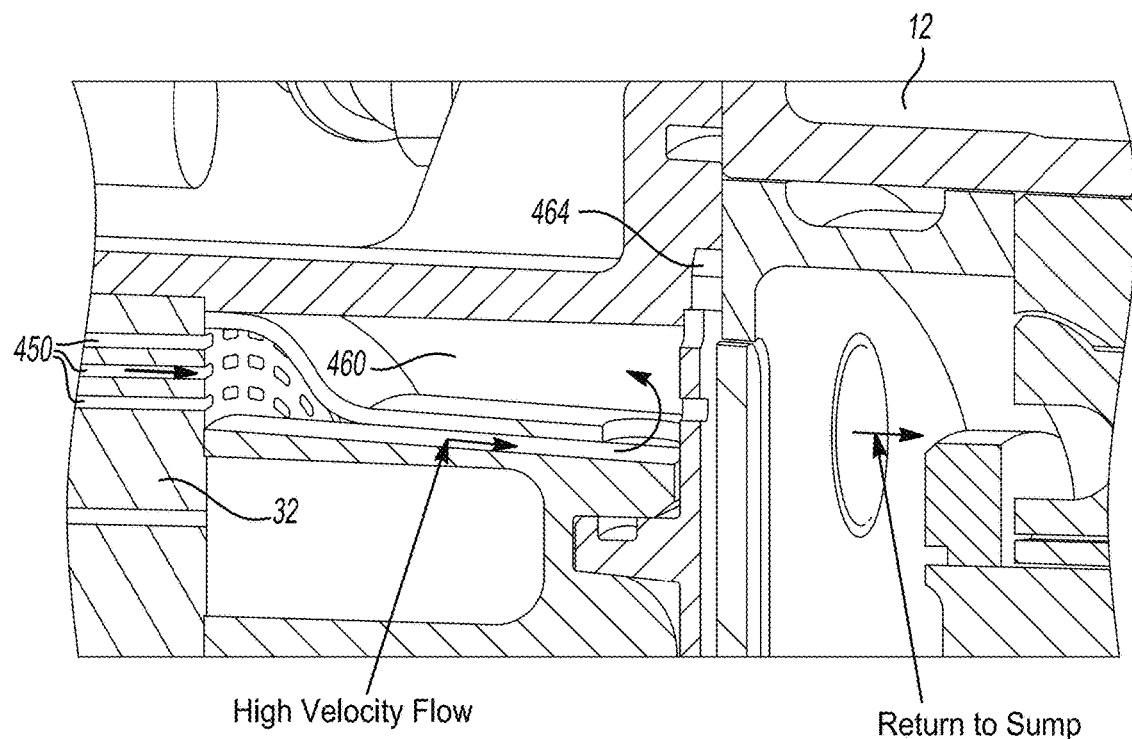
Figure 30:
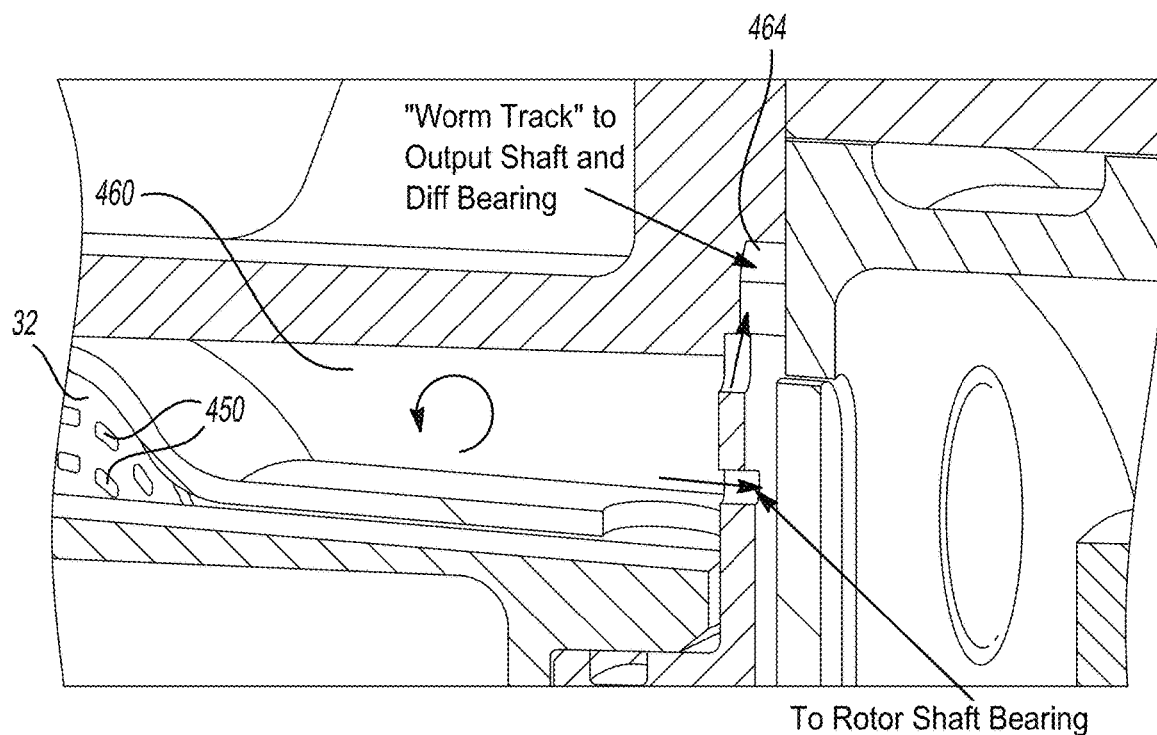

In FIGS. 29 and 30, dielectric fluid exiting the stator 32 is collected in an annular cavity 460 on an opposite end of the stator 32 that permits the velocity of the dielectric fluid to slow. A portion of the dielectric fluid is returned to a sump (not shown) in the housing assembly 12, while other portions of the flow are directed to lubricate various other components. For example, the annular cavity 460 can be in fluid communication with a worm track 464.

Figure 31:
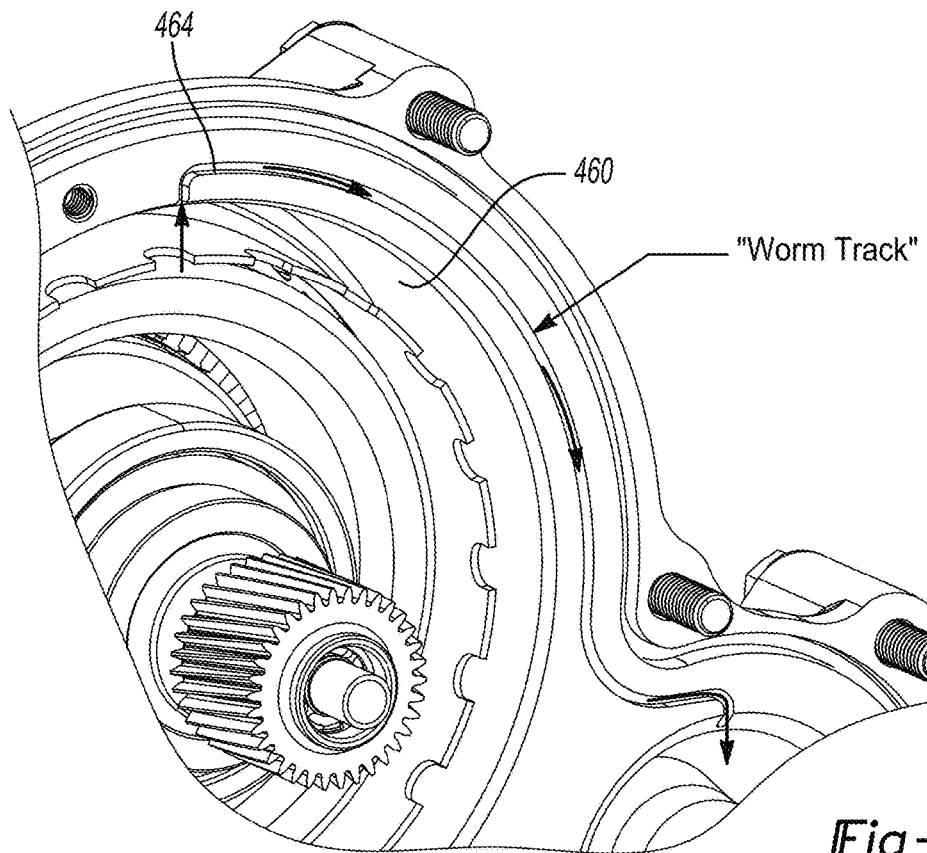
Figure 32:
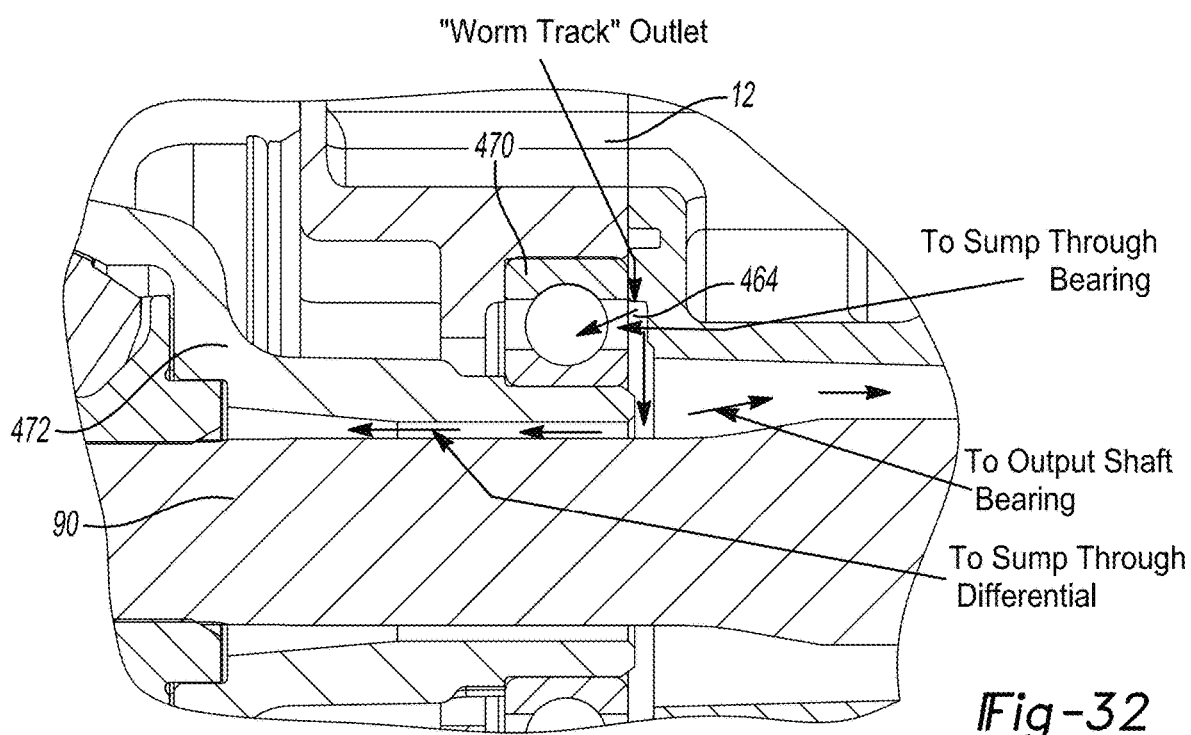
Figure 33:
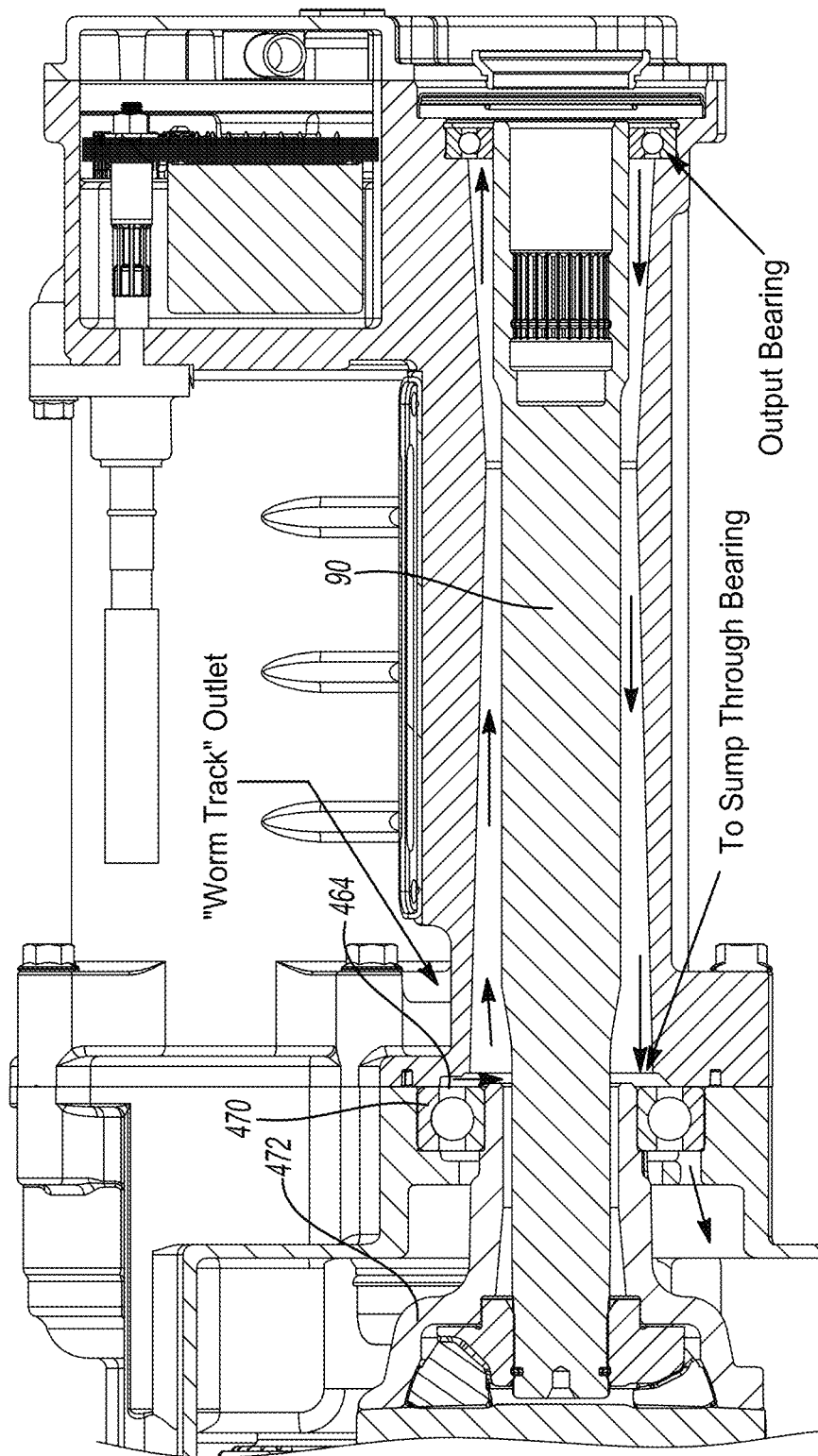

With reference to FIGS. 31 through 33, the worm track 464 can have an outlet that can discharge the dielectric fluid into a bearing 470, which can support the differential case 472 for rotation relative to the housing assembly 12, and/or onto the stub shaft 90, where the dielectric fluid can migrate to the opposite axial ends of the stub shaft 90 to lubricate the differential gearing and the bearing 94. Thereafter, the dielectric fluid can drain to the sump where it can flow into the intake filter 400 (FIG. 23).

Figure 34:
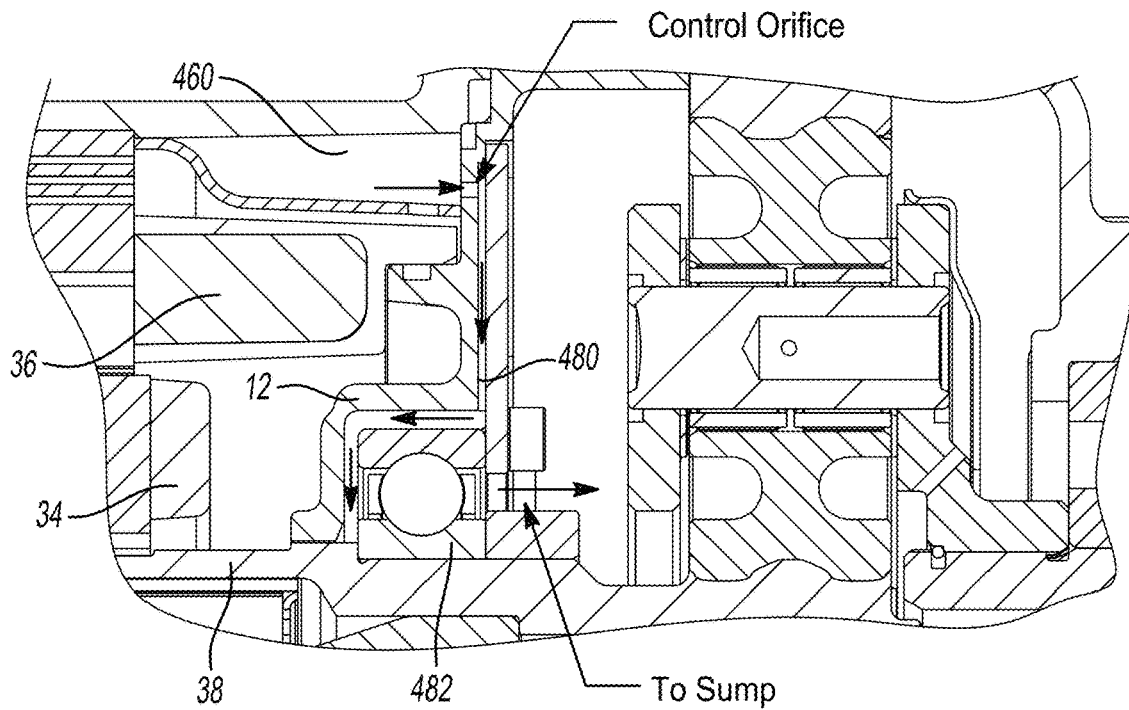
Figure 35:
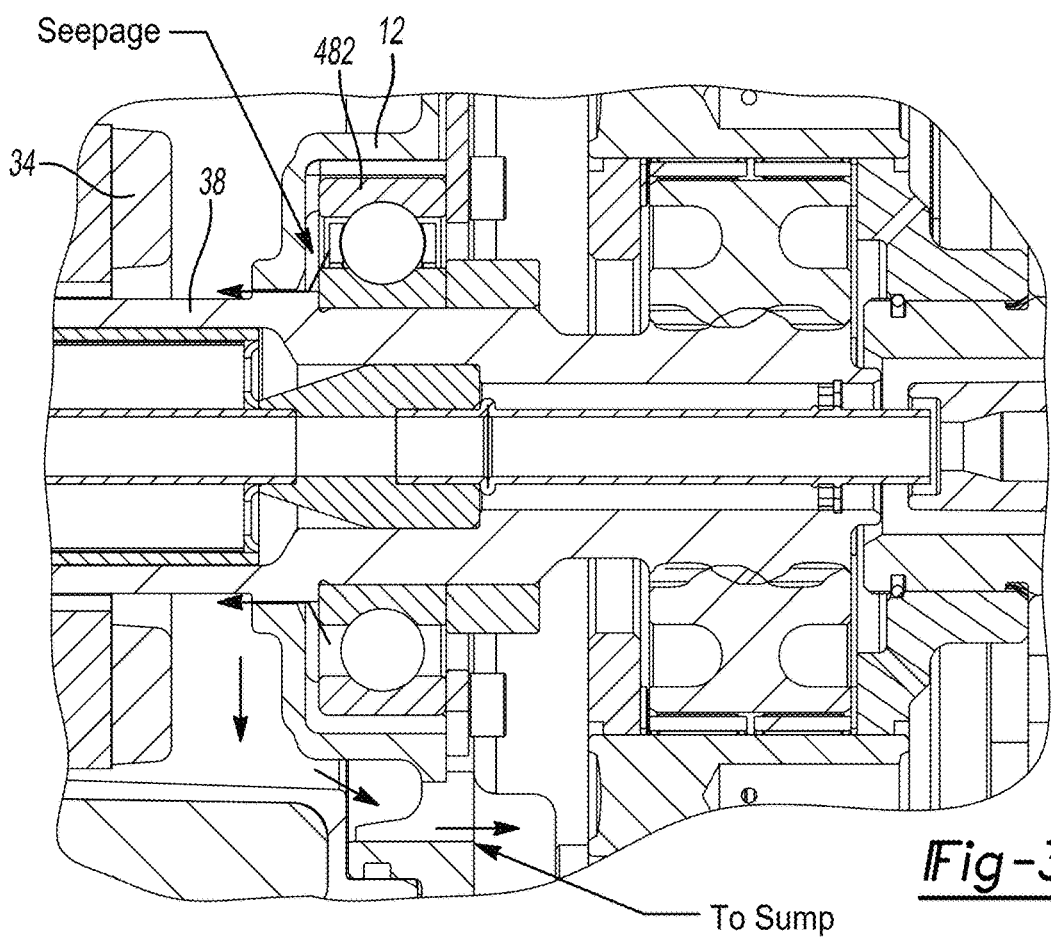

In FIGS. 34 and 35, the annular cavity 460 can be in fluid communication with a passage 480 that provides a flow of the dielectric fluid to a bearing 482 that supports the rotor shaft 38 relative to the housing assembly 12. Dielectric fluid that is discharged from the bearing 482 can seep between the housing assembly 12 and the rotor shaft 38 and can drain to the sump in the housing assembly 12.

Figure 36:
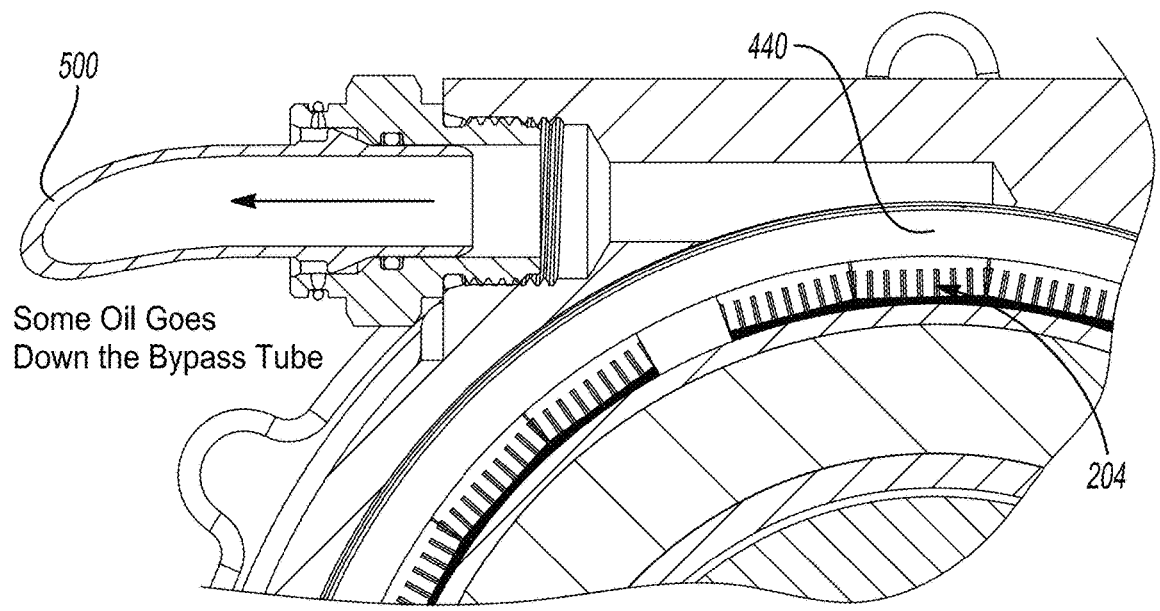

With reference to FIGS. 26, 27 and 36, a portion of the dielectric fluid in the annular cavity 440 can be discharged into a bypass tube 500. The amount of fluid that is discharged into the bypass tube 500 is based on pressure balancing between the flow that is directed through the bypass tube 500 and the portion of the flow that travels through the inverter 204 and the stator 32.

Figure 37:
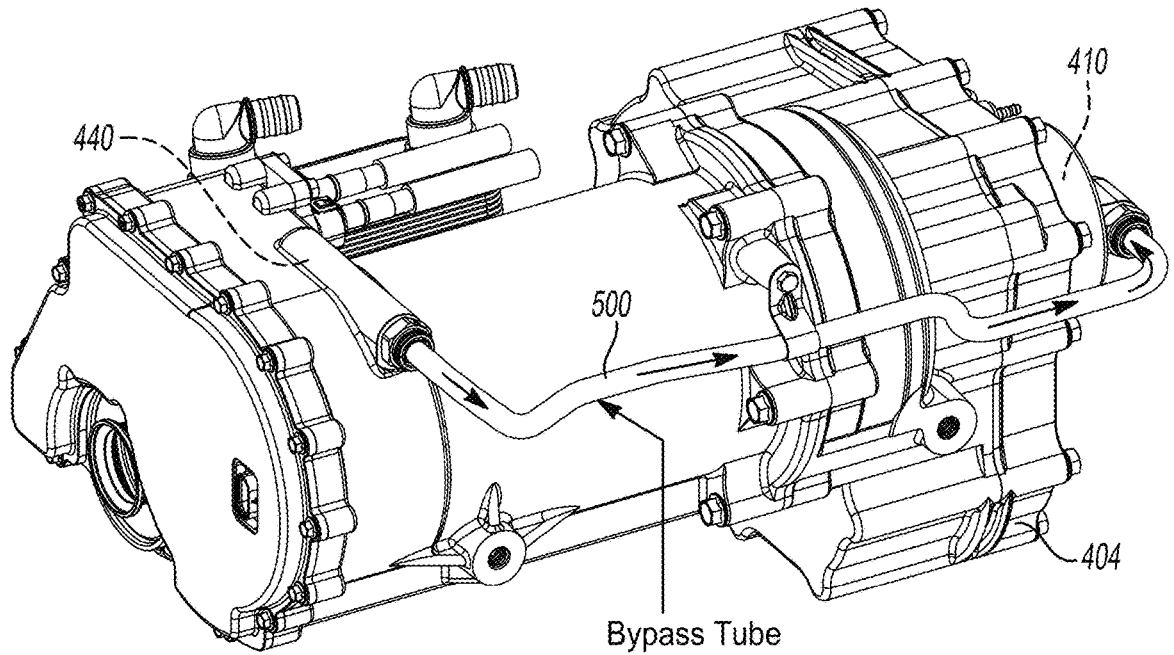

FIG. 37 depicts the dielectric fluid as it is discharged from the annular cavity 440 and transferred via the bypass tube 500 to the feed pipe 410 in the cover 404.

Figure 38:
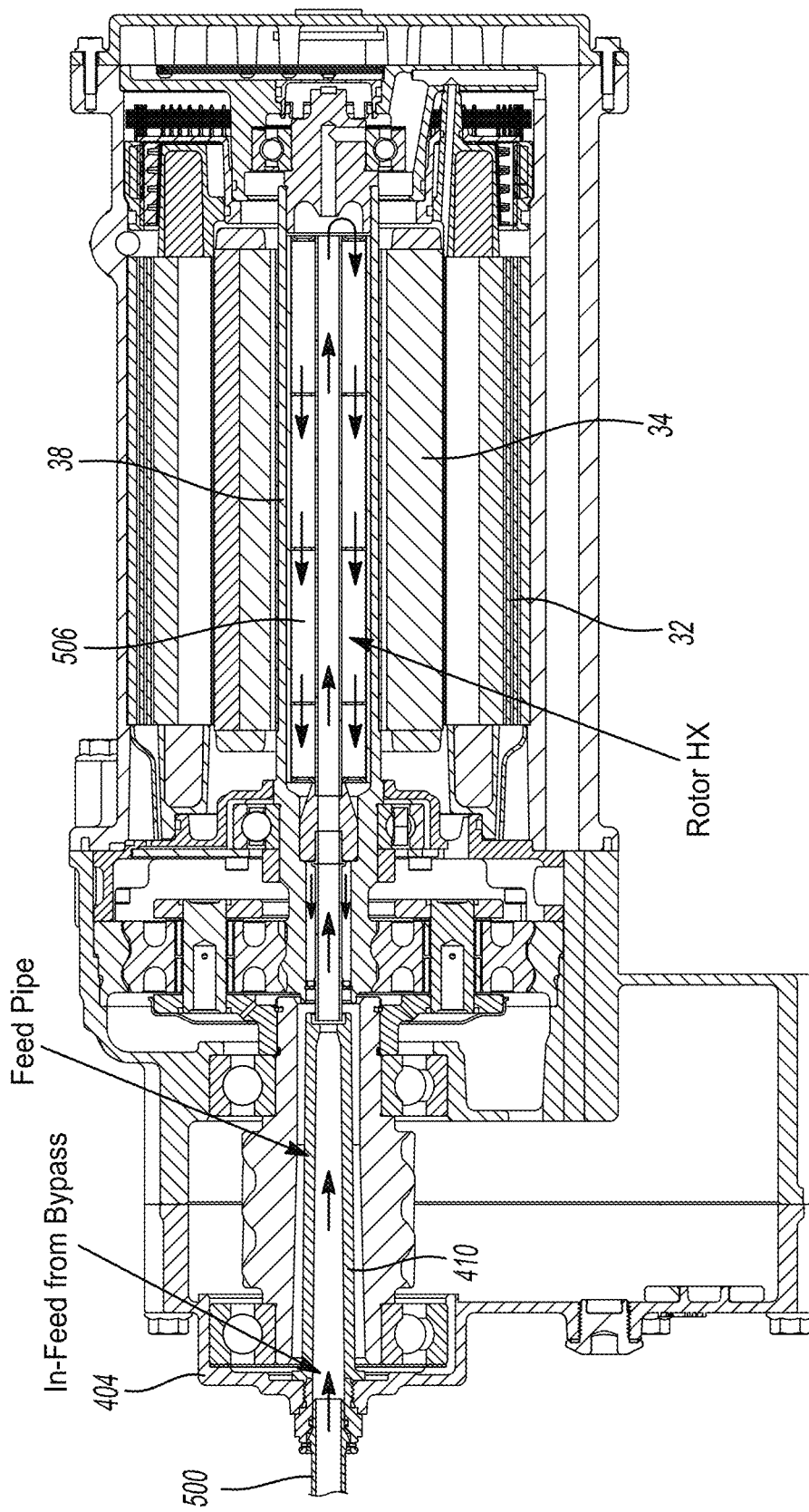

FIG. 38 depicts the bypass flow exiting the bypass tube 500, traveling through the feed pipe 410 in the cover 404 and being fed into a heat exchanger 506 that is mounted within the rotor shaft 38. The heat exchanger 506 receives the flow (inflow) of dielectric fluid along its rotational axis, and then turns the flow at the opposite end of the rotor 34 so that the flow of dielectric fluid flows concentrically about the inflow toward the end of the rotor 34 that received the inflow of the dielectric fluid.

Figure 39:
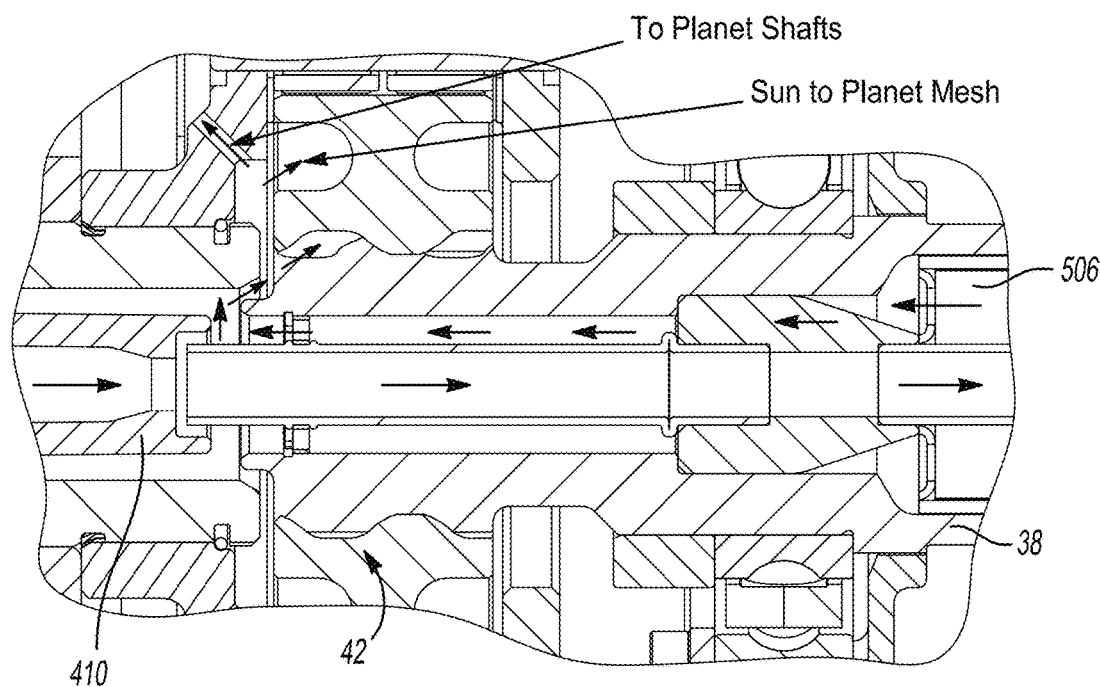
Figure 40:
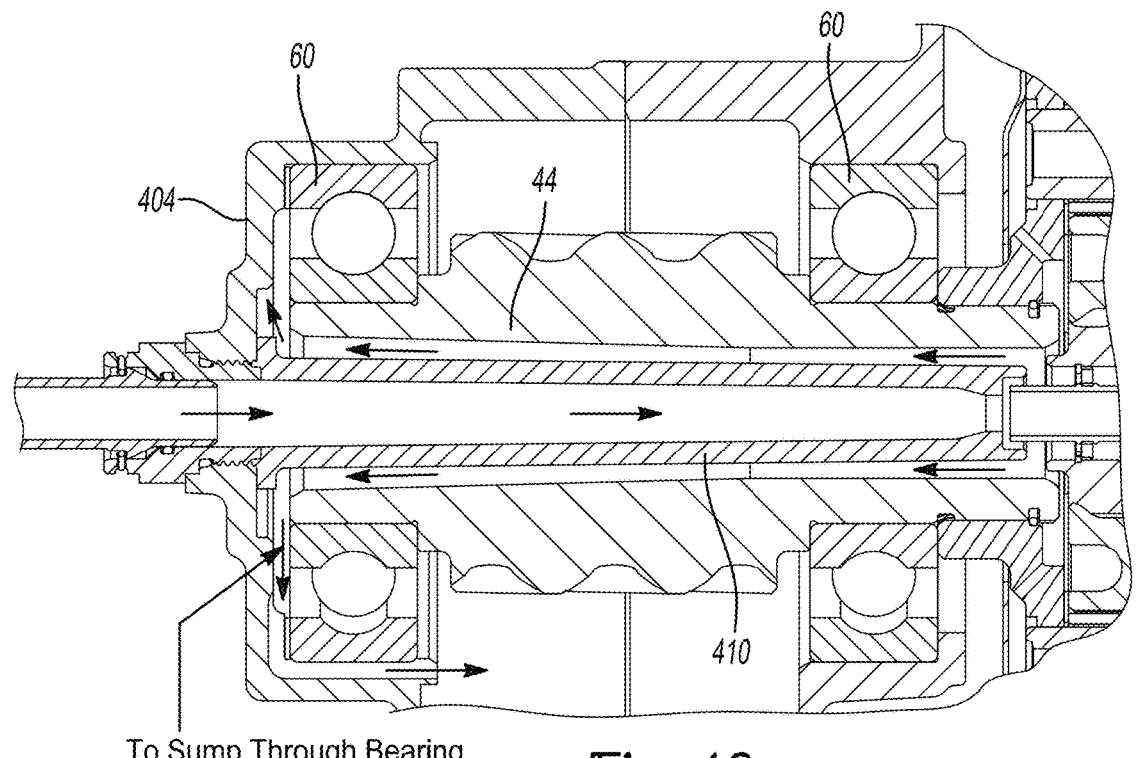
Figure 41:
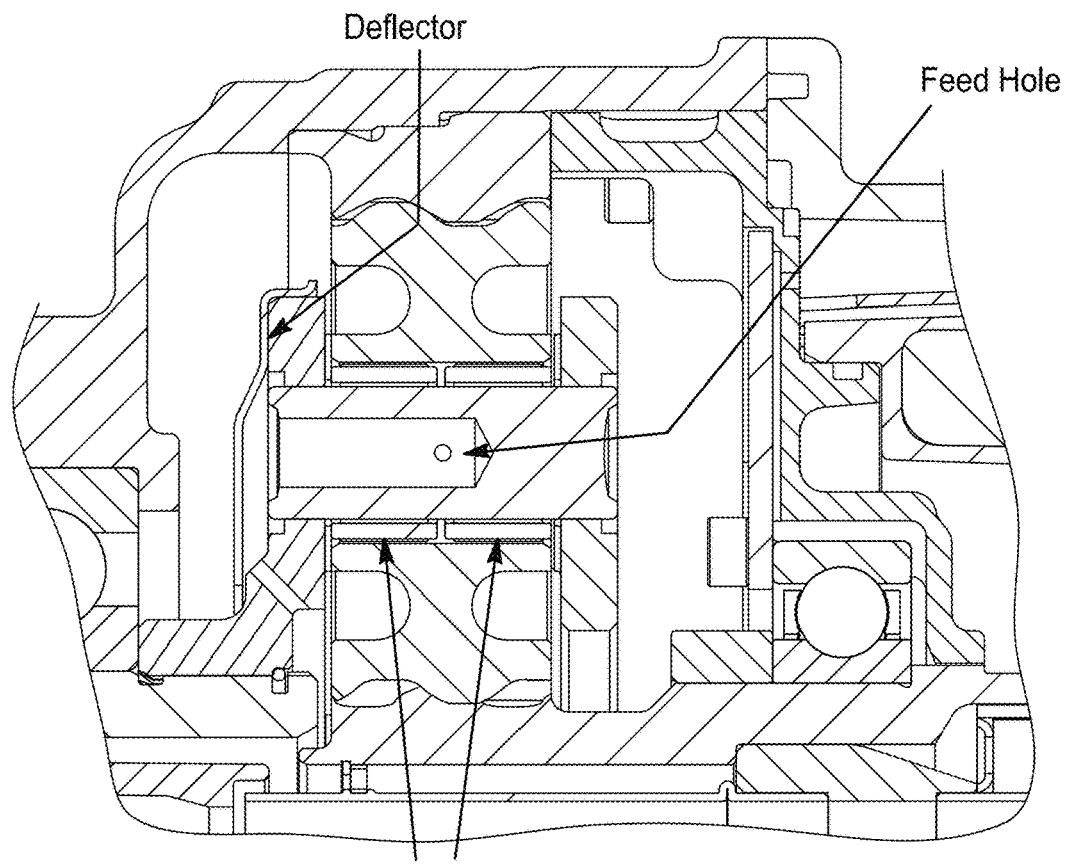
Figure 42:
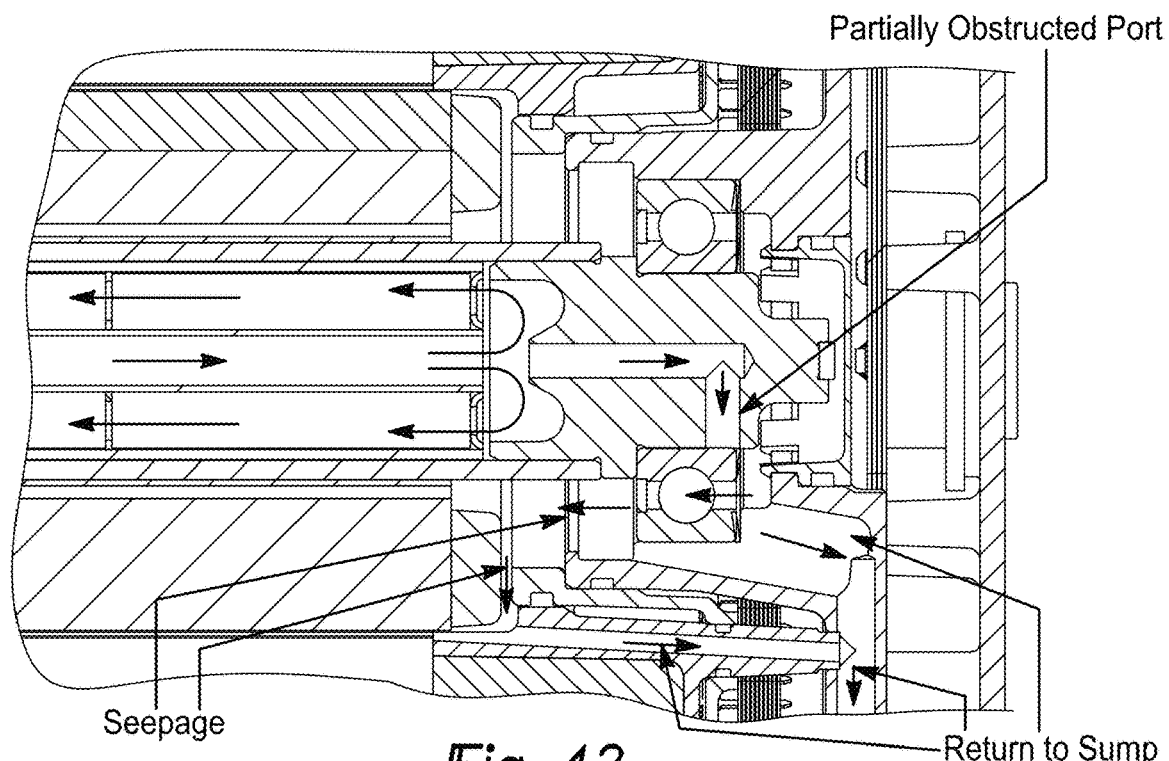
Figure 43:
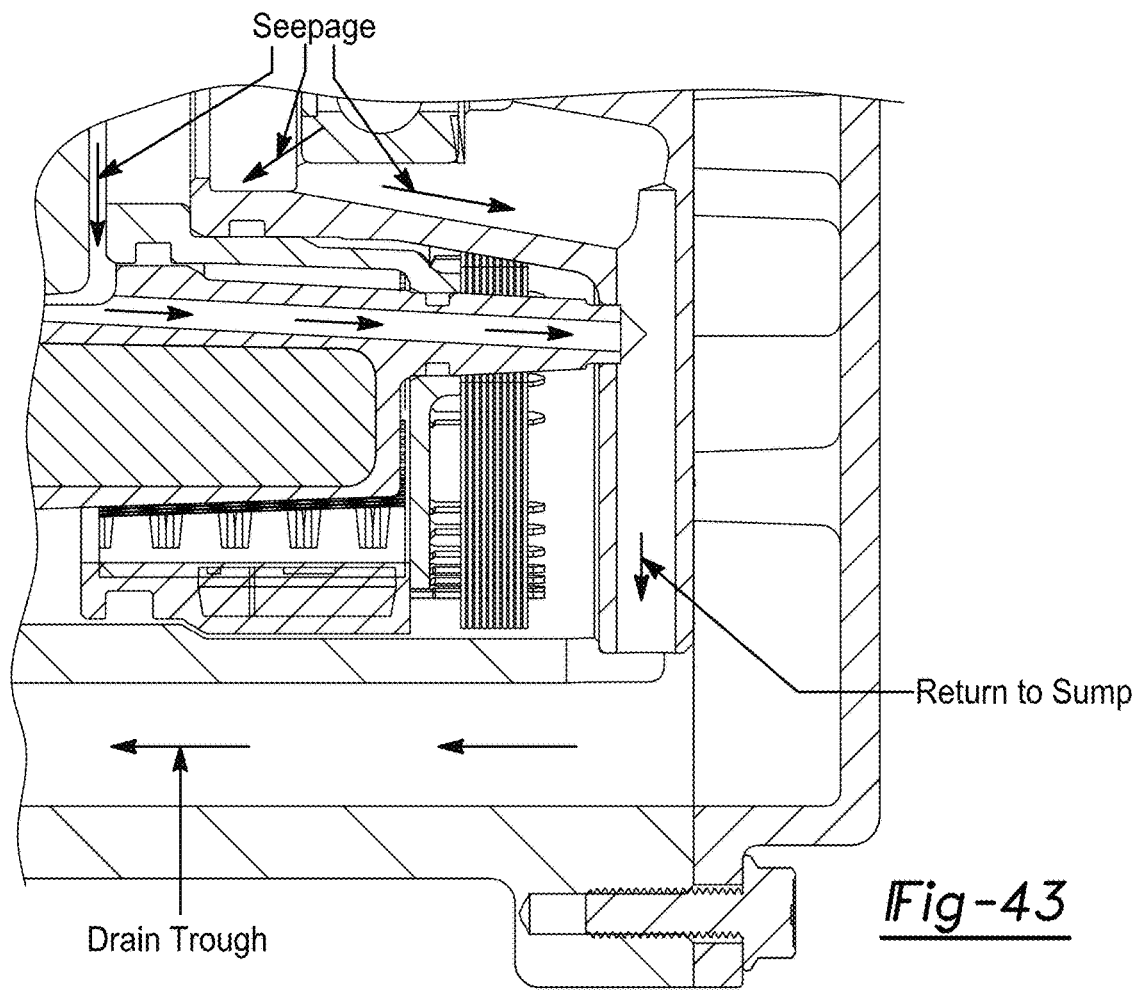
Figure 44:
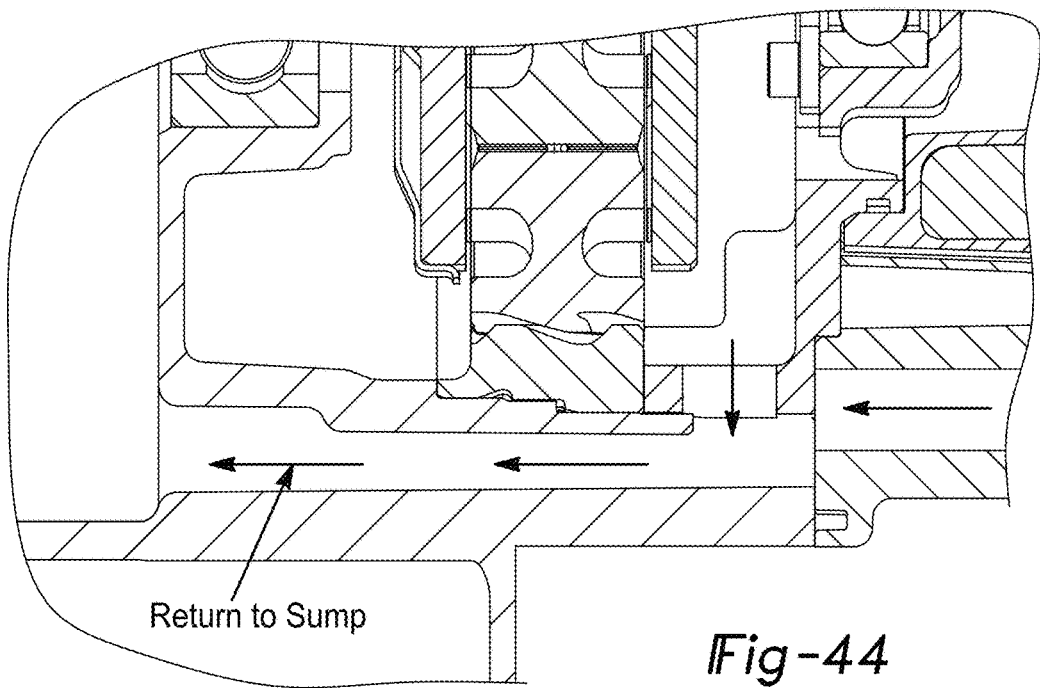
Figure 45:
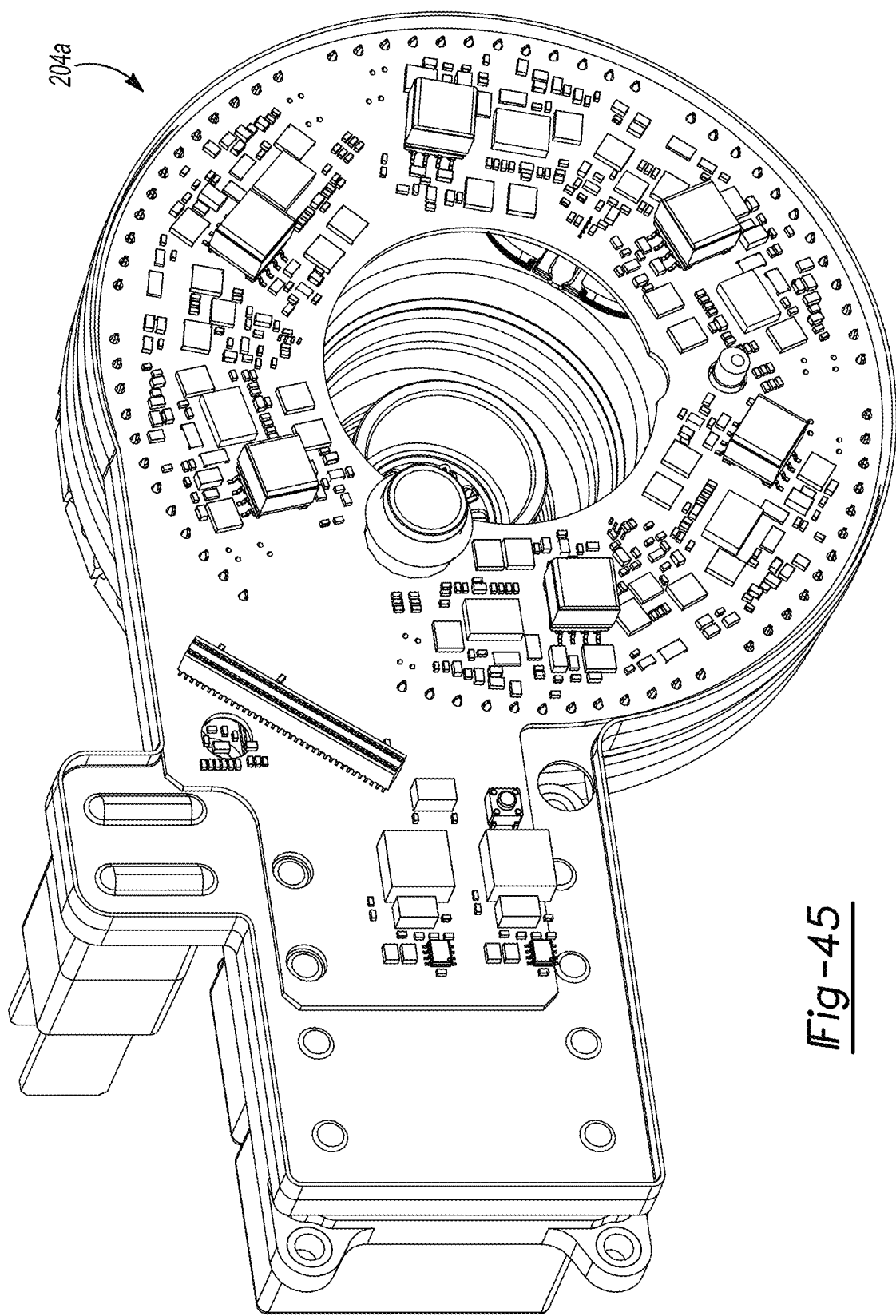
FIG. 45 through 60 are various views of an alternately configured inverter.

In FIGS. 39 and 40, the outflow of the dielectric fluid that exits the heat exchanger 506 in the rotor shaft 38 can be at least partly employed to lubricate the various components (i.e., bearings, shafts, gear teeth) of the planetary reduction 42, as well as the bearings 60 that support the shaft 44 of the transmission. Note that the feed pipe 410 in the cover 404 is received through a bore in the shaft 44. In the example provided, the feed pipe 410 is a discrete component that is assembled to the cover 404.

FIGS. 41 through 44 show various flows of dielectric fluid being used to lubricate various other components within the electric drive module.

With reference to FIGS. 45 through 72, another inverter constructed in accordance with the teachings of the present disclosure is generally indicated by reference numeral 204a. Unless expressly described herein, the inverter 204a can be generally similar to the inverter 204 (FIG. 3) described in detail above.

Figure 46:
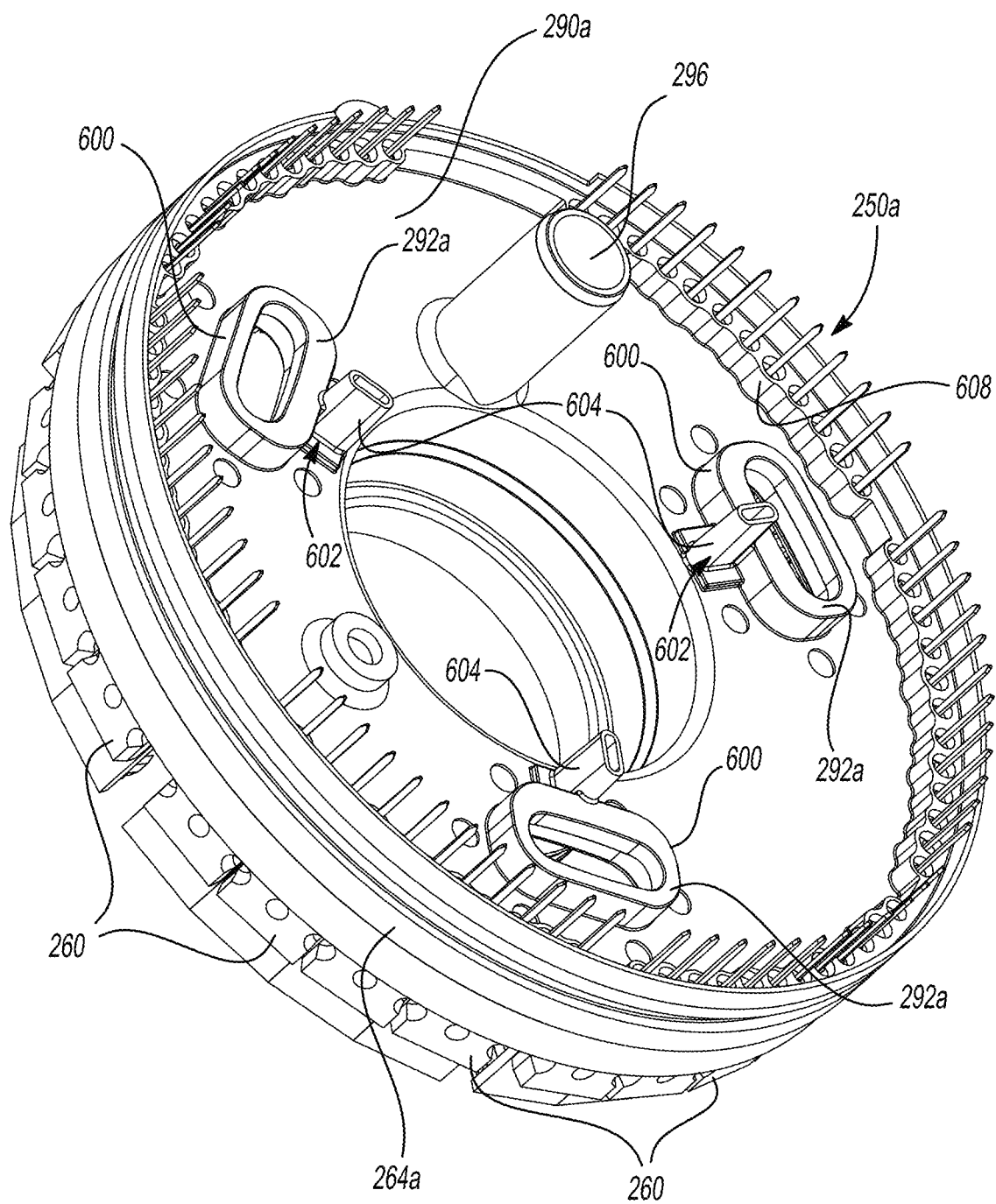

In FIG. 46, the transistor assembly 250a has a retaining member 264a that is formed as a discrete component and thereafter various other components, including the surface mount MOSFET's 260, can be assembled to the retaining member 264a. The retaining member 264a defines a plurality of phase lead bosses 292a, a plurality of current sensor lamination mounts 600 and a plurality of sensor mounts 602. Each of the phase lead bosses 292a can be disposed axially through the retaining member 264a and can be disposed within an associated one of the current sensor lamination mounts 600. Each of the phase lead bosses 292a is sized to receive portion of a corresponding phase lead (not shown) that supplies electric power to the electric motor. Each of the current sensor lamination mounts 600 is a generally oval-shaped structure that projects axially from the bottom surface 290a of the retaining member 264a. Each of the sensor mounts 602 is disposed proximate an associated one of the current sensor lamination mounts 600 and defines a hollow, oval-shaped guide tube 604 that projects axially away from the bottom surface 290a of the retaining member 264a. In this example, the retaining member 264a defines a plurality of insulating shields 608 that are spaced about the circumference of the retaining member 264a and which extend axially from the bottom surface 290a of the retaining member 264a. With additional reference to FIG. 47, each of the insulating shields 608 is disposed about (e.g., concentrically about) a corresponding aperture 610 that is sized to receive a corresponding terminal from one of the MOSFET's 260. The insulating shields 608 help to electrically insulate the terminals of the MOSFET's 260 from one another.

Figure 47:
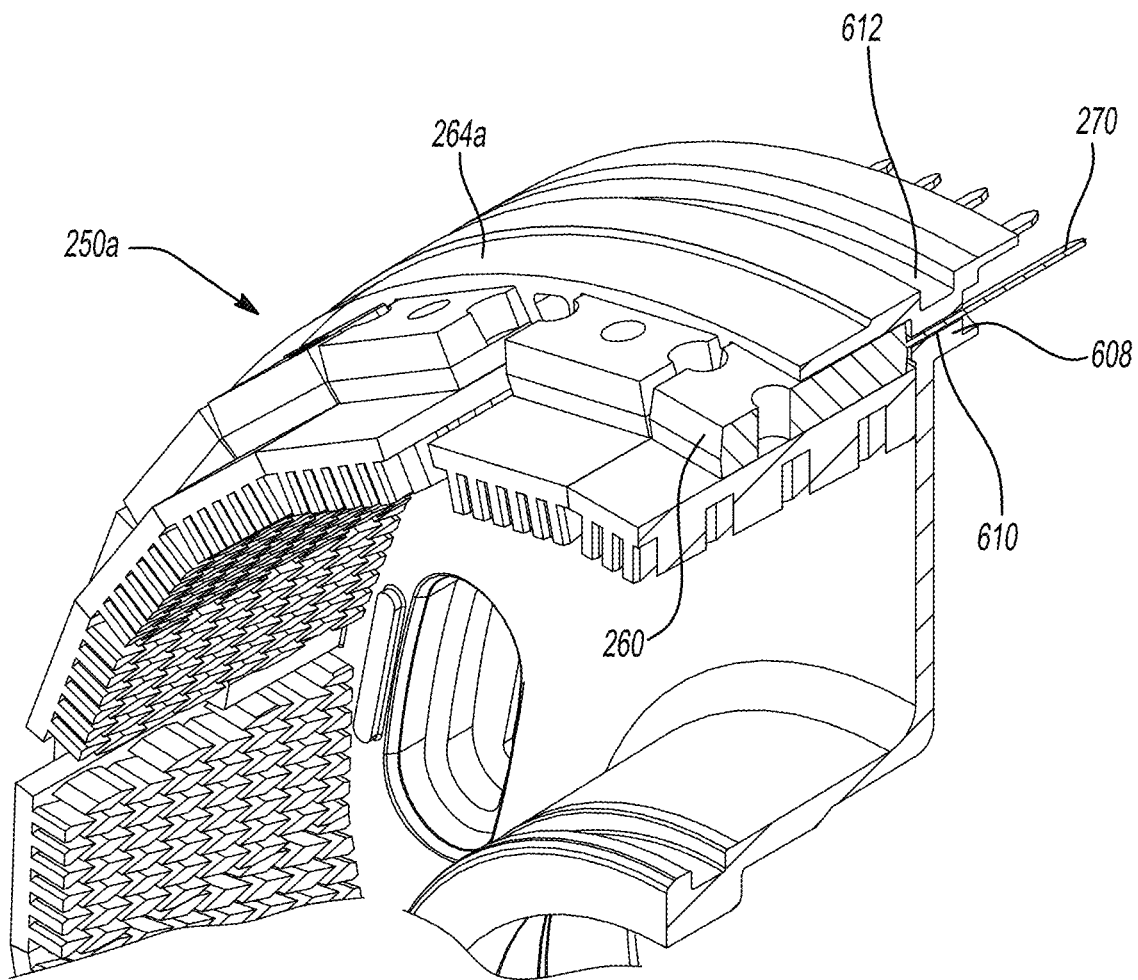

FIG. 47 shows a portion of the transistor assembly 250a and depicts the presence of an annular seal ring groove 612 about the perimeter of the retaining member 264a. The seal ring groove 612 is configured to receive an appropriate elastomeric seal (e.g., an O-ring) therein that sealingly engages the retaining member 264a and the housing assembly 12 (FIG. 1).

Figure 48:
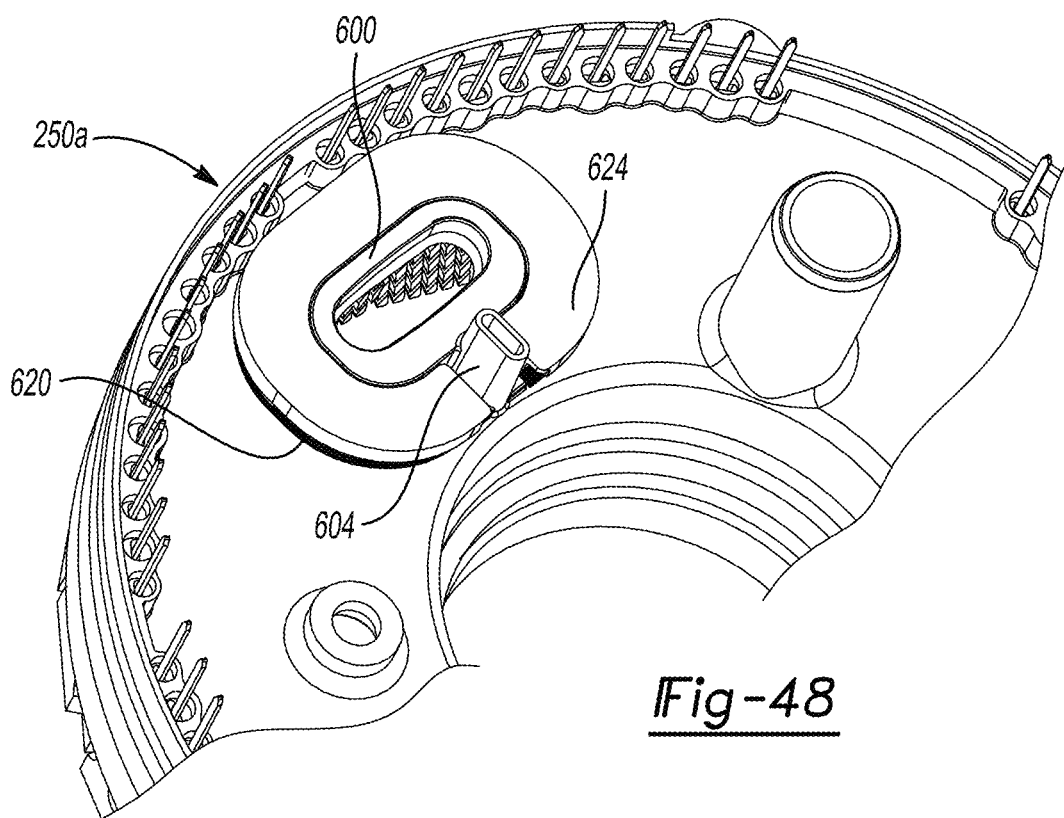
Figure 49:
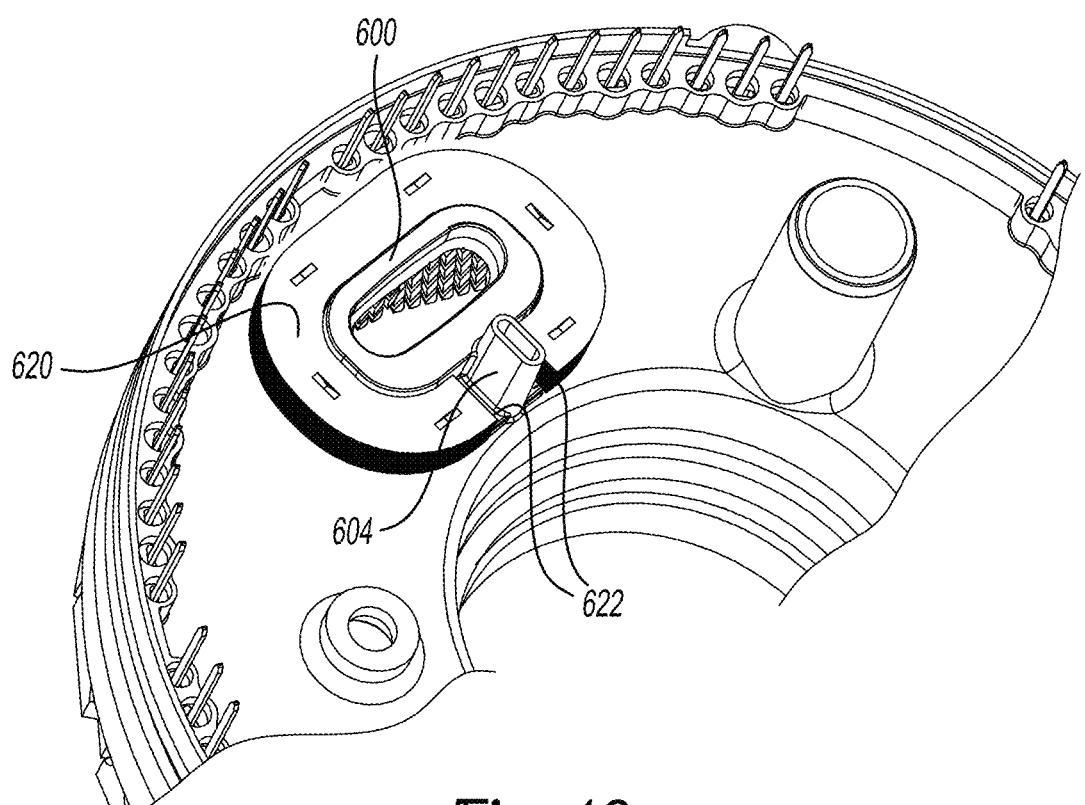

With reference to FIGS. 48 and 49, a plurality of current sensor laminations 620 are stacked onto each of the current sensor lamination mounts 600. The current sensor laminations 620 are formed of steel and are generally C-shaped so as to define a pair of end faces 622 that are disposed on opposite sides of an associated guide tube 604. The current sensor laminations 620 can be configured with locating features that nest into or with locating features on adjacent ones of the current sensor laminations 620 to help secure the current sensor laminations 620 to one another. A generally C-shaped insulating member 624 can be disposed on each stack of current sensor laminations 620 on an axial side of the stack that is opposite the bottom surface 290a.

Figure 50:
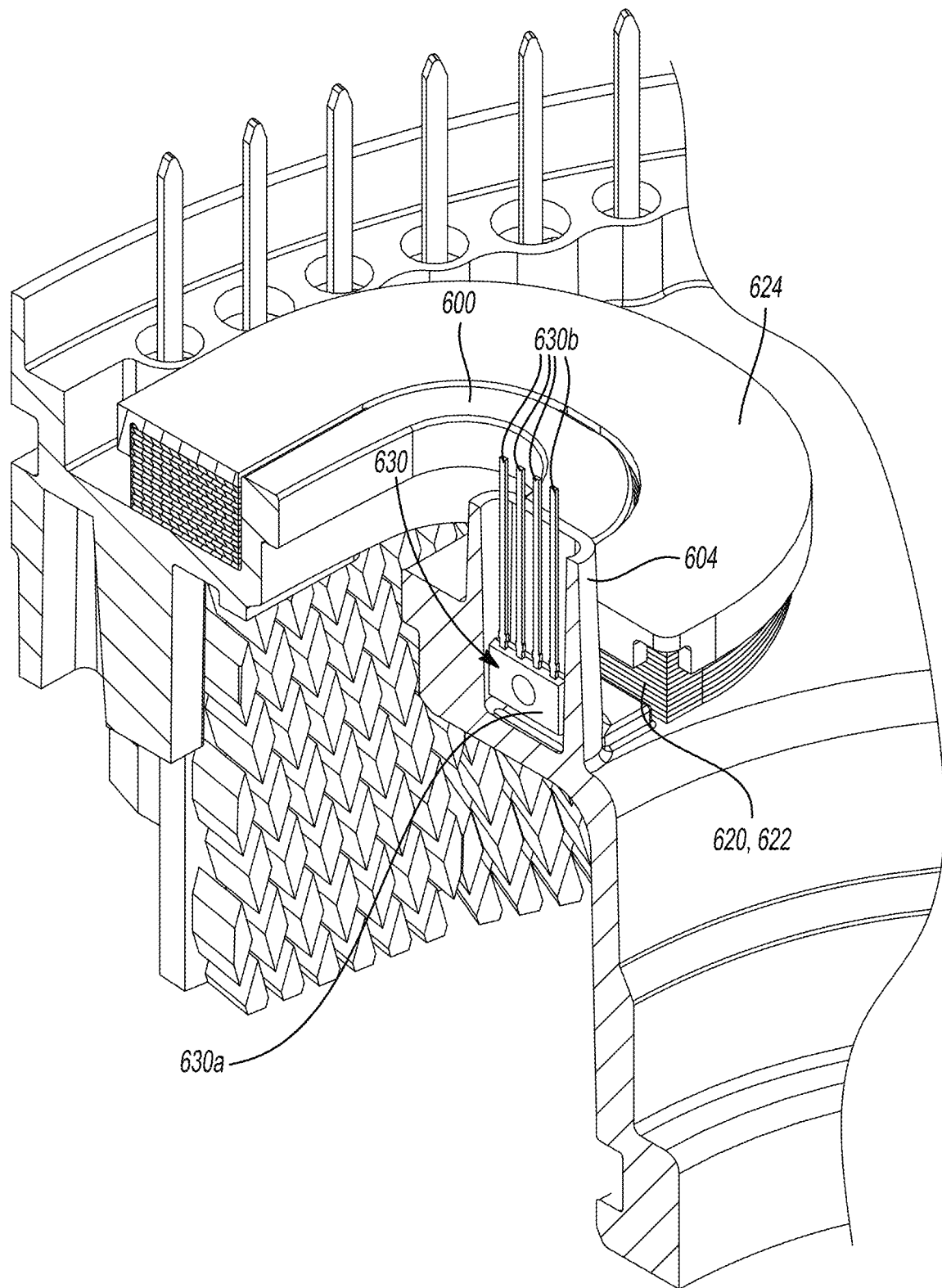

In FIG. 50, a Hall sensor 630 is disposed in an associated one of the sensor mounts 602. A proximal end of the Hall sensor 630 is mounted to the circuit board so that the sensor portion 630a of the Hall sensor 630 is disposed parallel to end faces 622 of the current sensor laminations 620 at a desired location along a sensing axis relative to the stack of current sensor laminations 620. Because the sensor portion 630a of the Hall sensor 630 is disposed at some distance from the proximal end of the Hall sensor 630, it will be appreciated that it would be relatively easy to bend the terminals 630b of the Hall sensor 630, which would affect the positing of the sensor portion 630a of the Hall sensor 630. The guide tube 604, however, is sized and located relative to an associated one of the current sensor lamination mounts 600 to receive the sensor portion 630a of the Hall sensor 630 as the circuit board is mounted to the retaining member 264a and the MOSFET's 260 and guide the sensor portion 630a into a desired location between the end faces 622.

Figure 51:
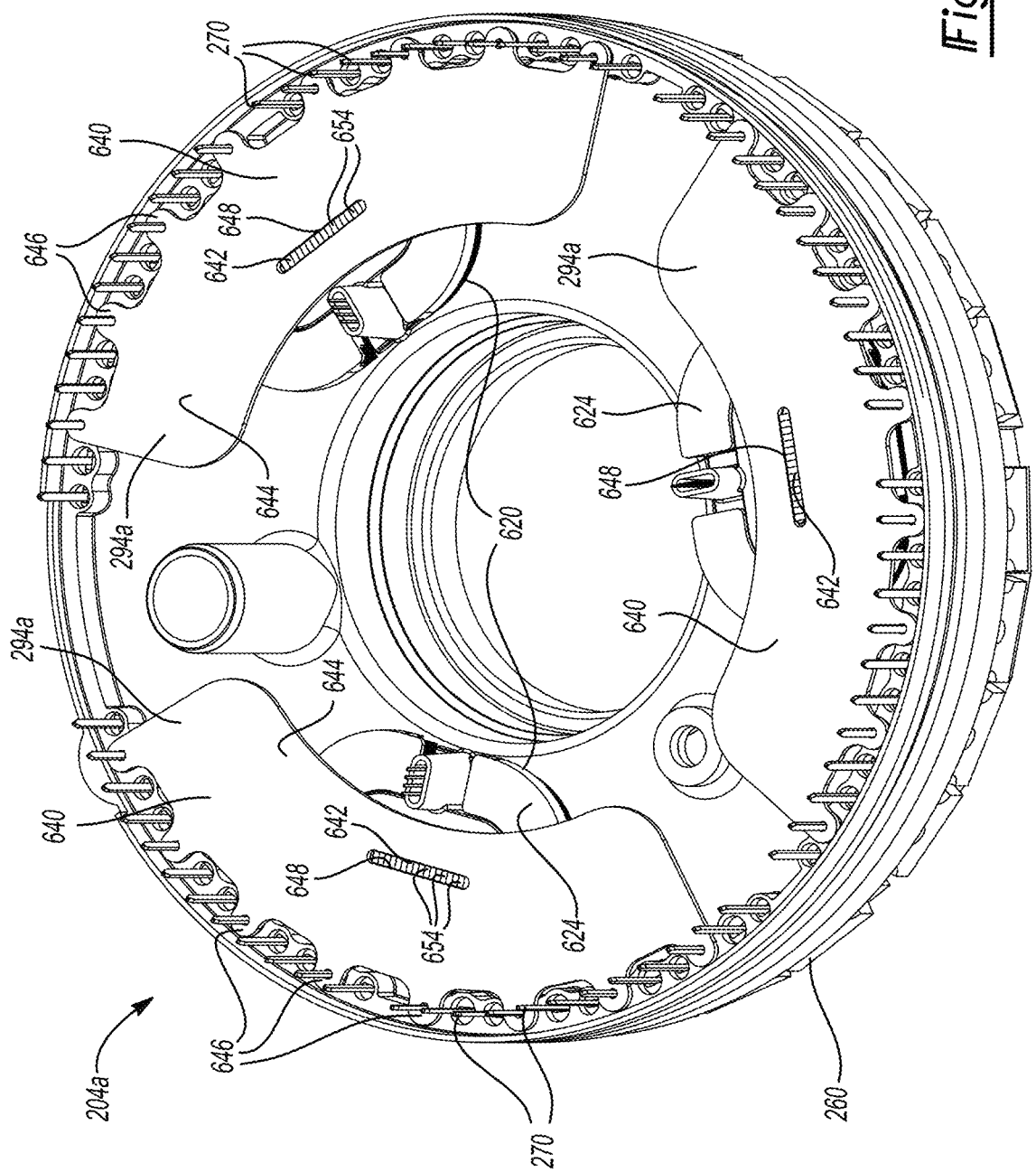
Figure 52:
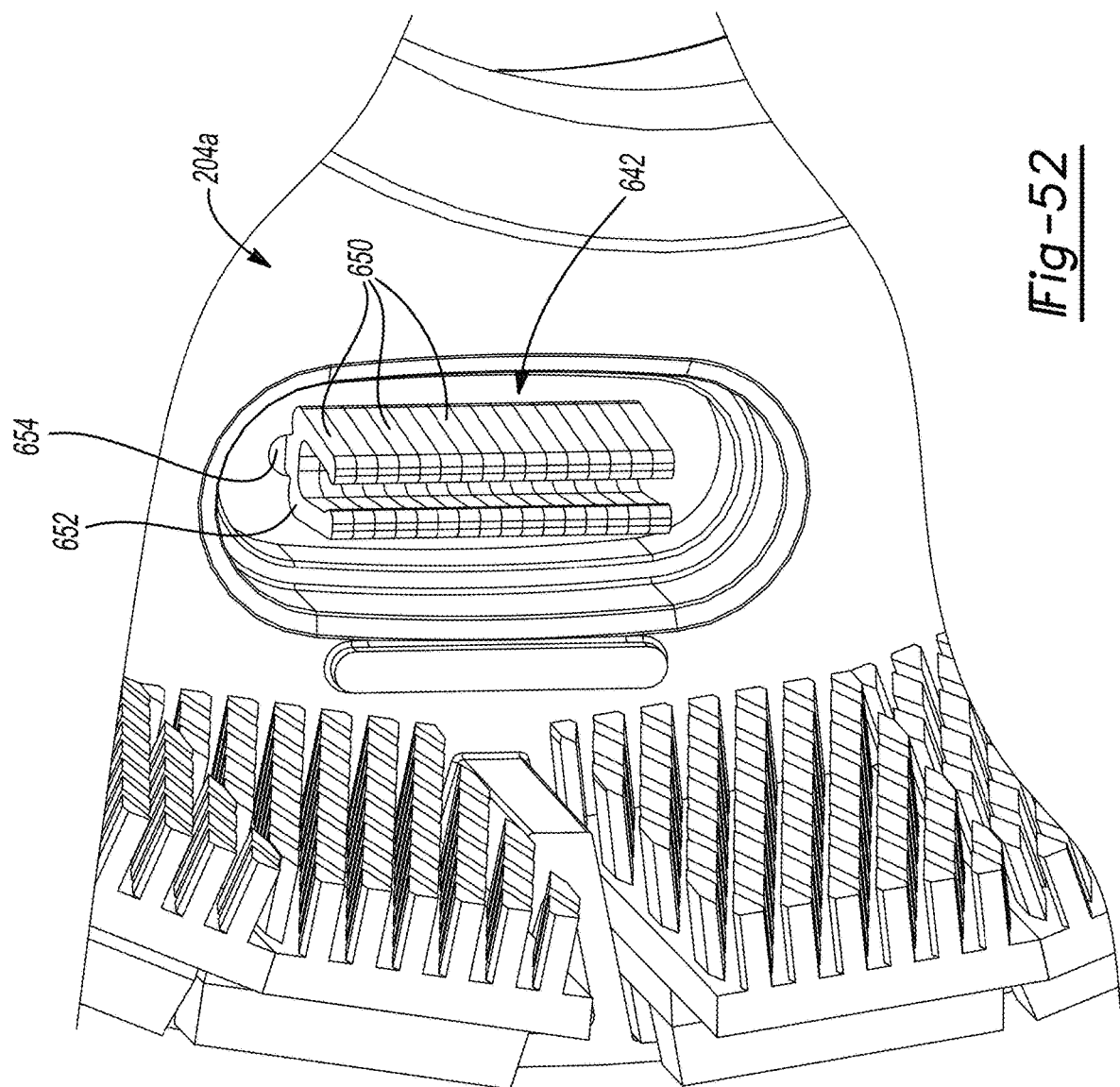

With reference to FIGS. 51 and 52, each of the phase leads 294a can include a conductor plate 640 and a receiver 642. The conductor plate 640 can be formed of a suitable electrically-conductive material, such as copper. Each conductor plate 640 can have a body 644 and a plurality of protrusions 646 that extend radially outwardly from the body 644. The body 644 can overlie an associated one of the stacks of current sensor laminations 620 and can define a receiver aperture 648 that can be disposed in-line with a corresponding one of the phase lead bosses 292*a*. It will be appreciated that the insulating member 624 can inhibit the transmission of electricity between the conductor plate 640 and the current sensor laminations 620. Each of the protrusions 646 can define an aperture that is sized to receive a device terminal 270 of an associated one of the MOSFET's 260.

The receiver 642 is formed of a plurality of individually bident-shaped members 650 that are linearly arranged (i.e., stacked back-to-front) and permanently affixed to the conductor plate 640. Each bident-shaped member 650 can be formed of an appropriate electrically conductive material, such as copper, and can have body 652 and a base 654. The body 652 can define a pair of tines and a generally U-shaped opening. Each of the tines can have a protrusion or barb that is fixedly coupled to a distal end of the tine and which extends inwardly therefrom so as to narrow the portion of the generally U-shaped opening that is opposite the base 654. The base 654 is received into the receiver aperture 648 in an associated one of the conductor plates 640. In the example shown, the receiver apertures 648 are formed along a straight line and as such, the bident-shaped members 650 that form the receiver 642 are arranged along the straight line. It will be appreciated, however, that one or more of the receiver apertures 648 could be arranged along a line that is shaped differently (e.g., an arcuate line) and that the associated set of bident-shaped members 650 are similarly arranged along a differently shaped (i.e., non-straight) line.

It will be appreciated that each phase of electric power supplied to the inverter 204*a* can be electrically coupled to a blade terminal (not shown) that is received into the generally U-shaped openings in the bident-shaped members 650 and electrically coupled to the receiver 642. The individual bident-shaped members 650 permit flexing of the tines relative to one another and ensure that the blade terminal electrically contacts multiple ones of the tines (preferably all or substantially all of the tines) to transmit an associated phase of electric power through the receiver 642 and into the conductor plate 640, which transmits the associated phase of electric power to a set of the MOSFET's 260.

Figure 53:
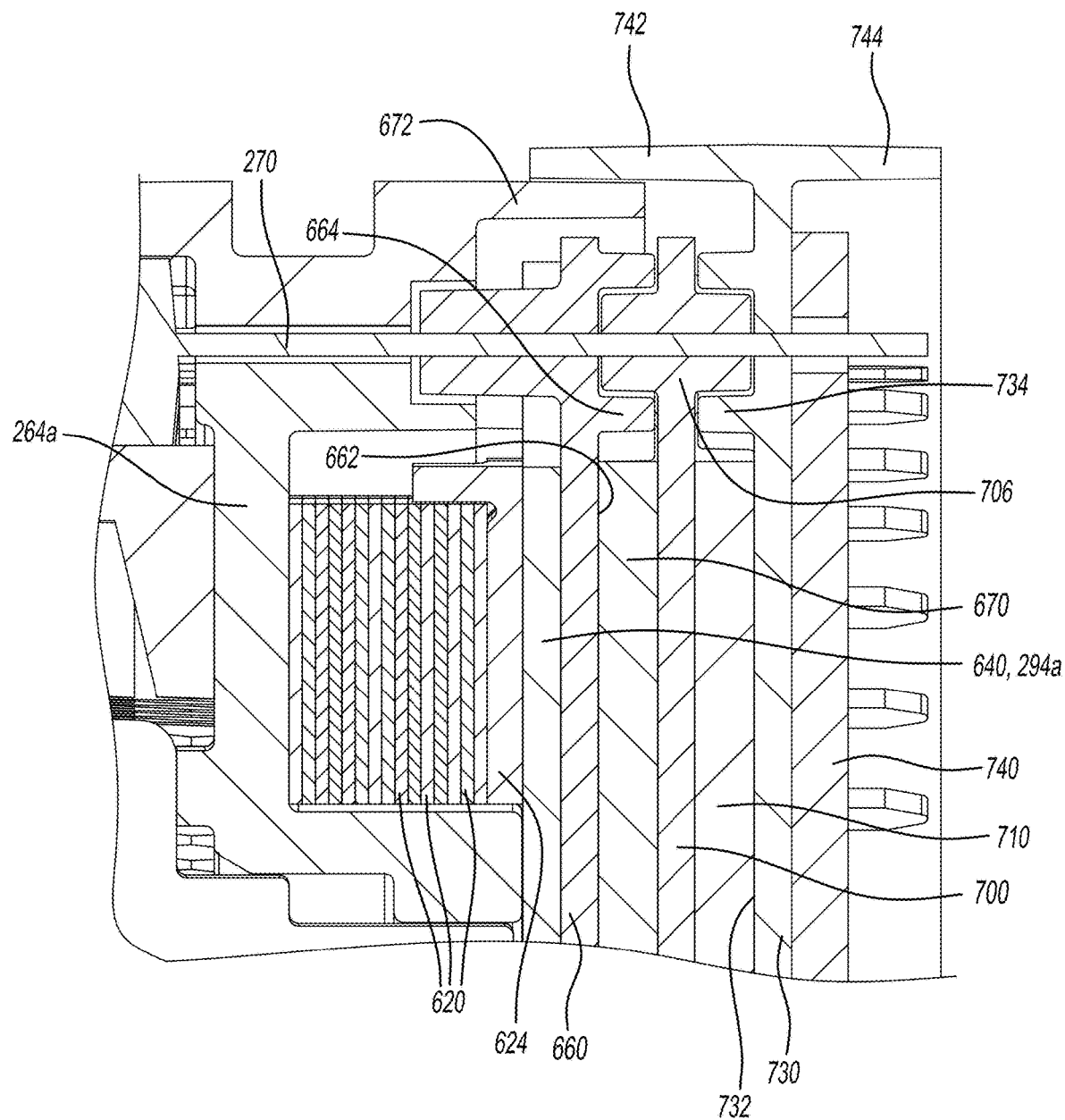
Figure 54:
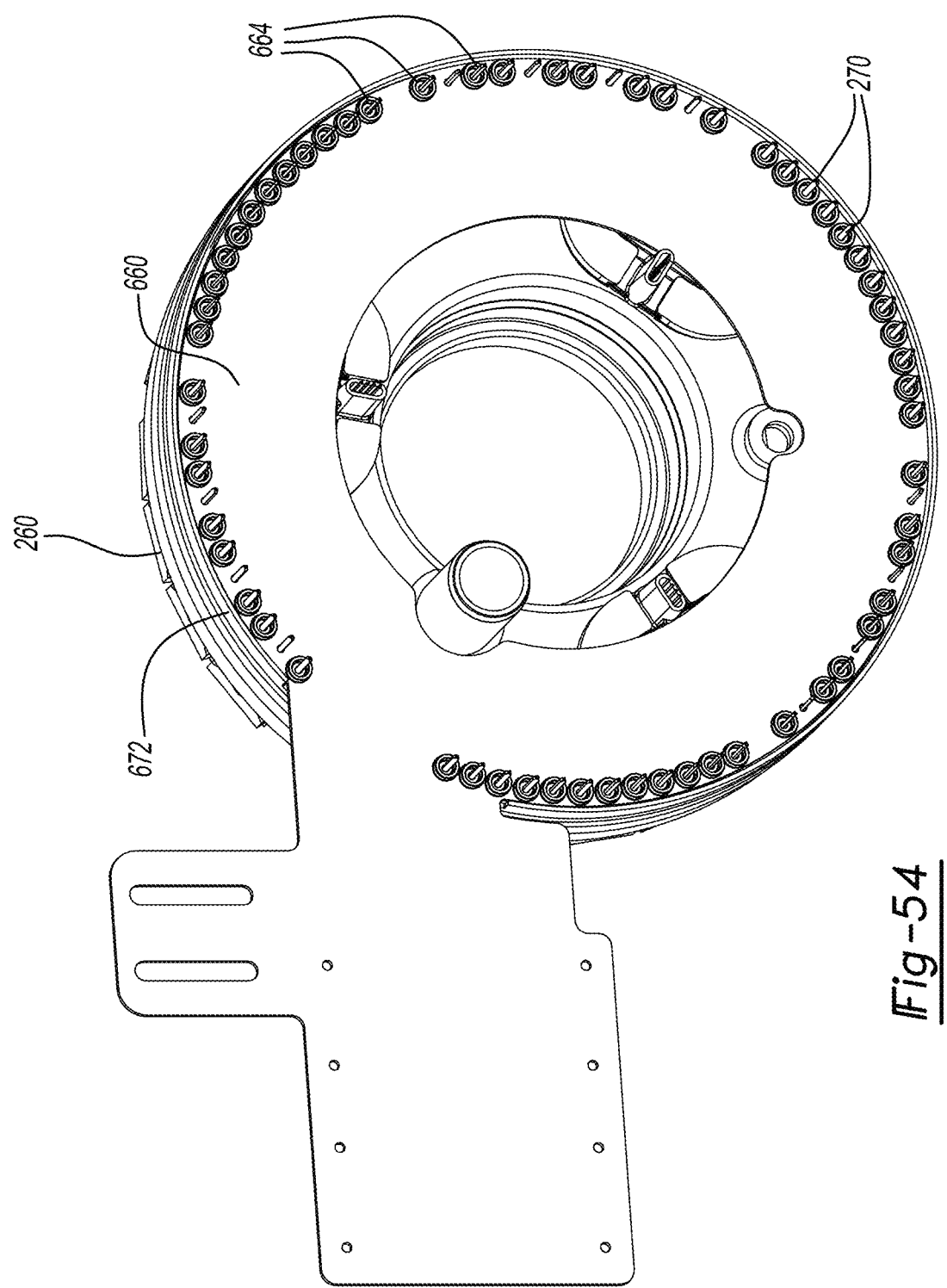

In FIGS. 53 and 54, a first insulator 660 is abutted against the phase leads 294*a* on a side of the phase leads that is opposite the generally C-shaped insulating members 624. The first insulator 660 can define a first bus bar recess 662 and a plurality of first insulating collars 664. The first bus bar recess 662 is disposed on an axial side of the first insulator 660 that is opposite the side that abuts the phase leads 294*a*. Each of the first insulating collars 664 is disposed about a device terminal 270 of a respective one of the MOSFET's 260. Each first insulating collars 664 can having a first end, which can be received into a mating recess that is formed in the retaining member 264*a*. It will be appreciated that the first insulating collars 664 are disposed about the device terminals 270 of the MOSFET's 260 that need be electrically separated from a first bus bar 670 that is received into the first bus bar recess 662. Holes are formed through the first insulator 660 to receive therethrough any electric terminals (e.g., the device terminals 270 of the MOSFET's 260) that need extend through the first insulator 660. Each of the first insulating collars 664 can be disposed concentrically about a respective one of the holes.

In the example shown the retaining member 264*a* defines a flange 672, which is disposed circumferentially about the device terminals 270 of the MOSFET's 260.

Figure 55:
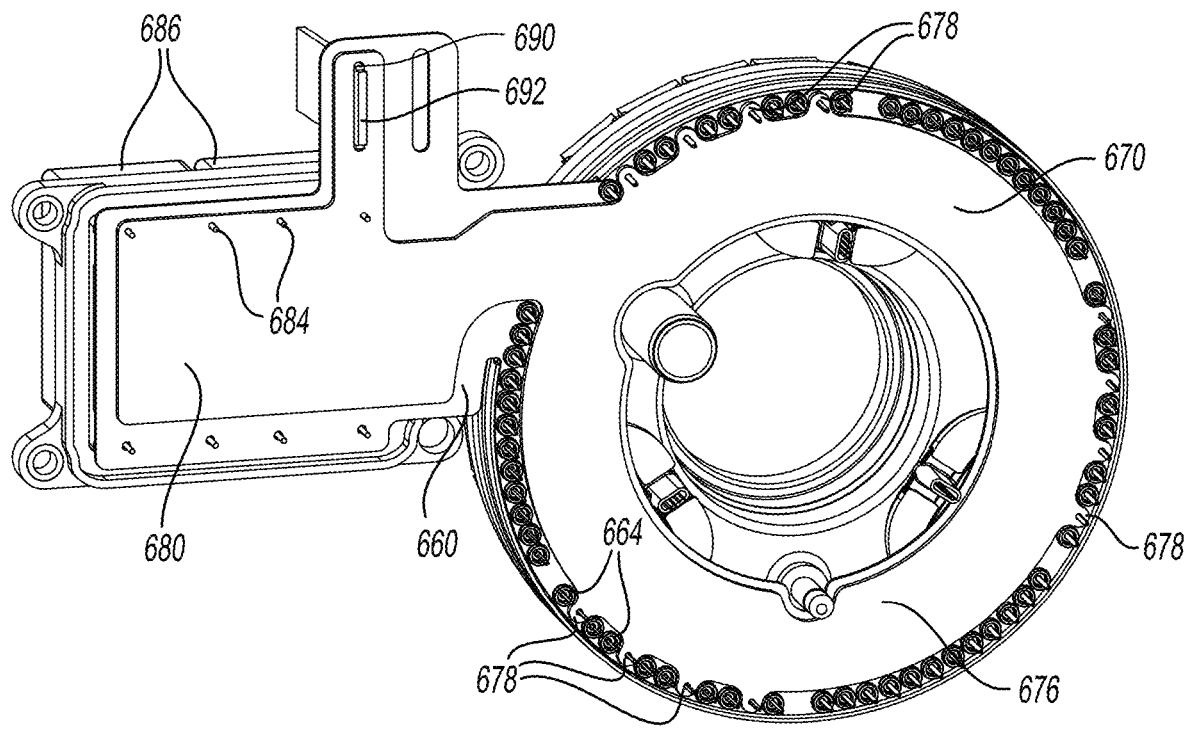
Figure 56:
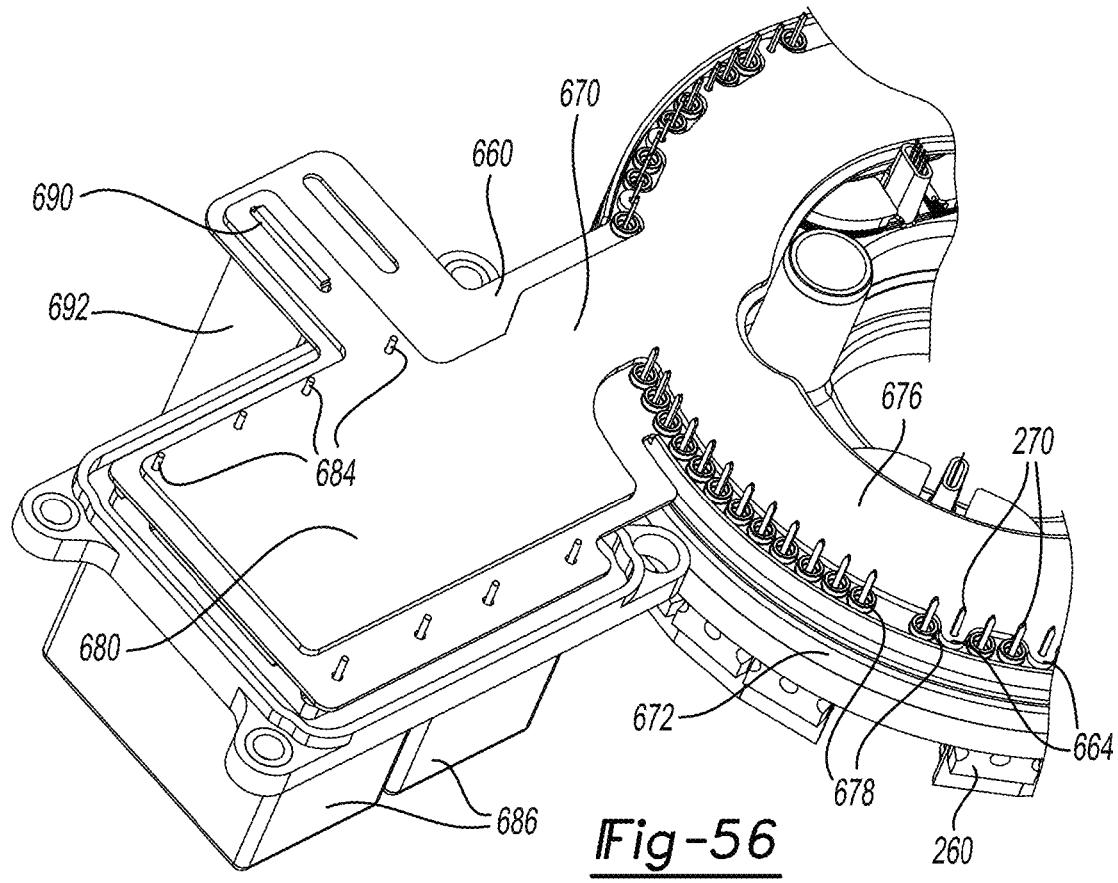

With reference to FIGS. 53, 55 and 56, the first bus bar 670 is abutted to the first insulator 660 and received into the first bus bar recess 662. The first bus bar 670 has an annular bar body 676, a plurality of protrusions 678 that extend radially outwardly from the annular bar body 676, and a power input portion 680. Each of the protrusions 678 is sized to be received between the first insulating collars 664 of the first insulator 660 and to be electrically coupled to a respective one of the device terminals 270 of the MOSFET's 260. Holes are formed through the protrusions and the power input portion 680 to receive device terminals 270 from the MOSFET's 260 and from the terminals 684 of a pair of capacitors 686, respectively. A first slotted aperture 690 is formed in the power input portion 680 to receive a blade terminal 692 that electrically couples the first bus bar 670 to a source of electrical power (not shown).

Figure 57:
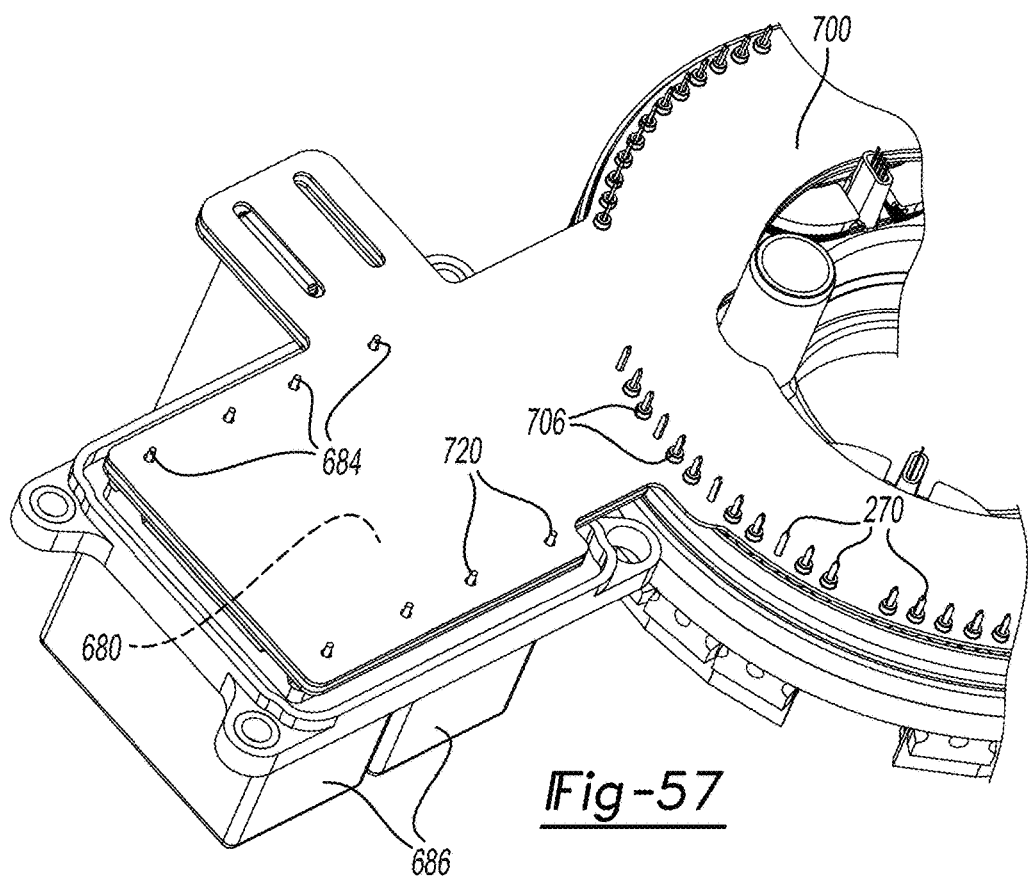

With reference to FIGS. 53 and 57, a second insulator 700 can be mounted to the first bus bar 670 on a side opposite the first insulator 660. Like the first insulator 660, the second insulator 700 can extend over the power input portion 680, can have a plurality of holes for receipt of various device terminals 270 and terminals 684 therethrough and can define a plurality of (second) insulating collars 706 that can be disposed about the device terminals 270 of the MOSFET's 260 to electrically separate those device terminals 270 of the MOSFET's 260 that will not be electrically coupled a second bus bar 710. Each of the second insulating collars 706 can define a pair of hollow, tubular projections that can project in opposite axial directions. The tubular projections on the side of the second insulator 700 that face toward the first insulator 660 can be matingly received into recesses that are defined by the first insulating collars 664.

Figure 58:
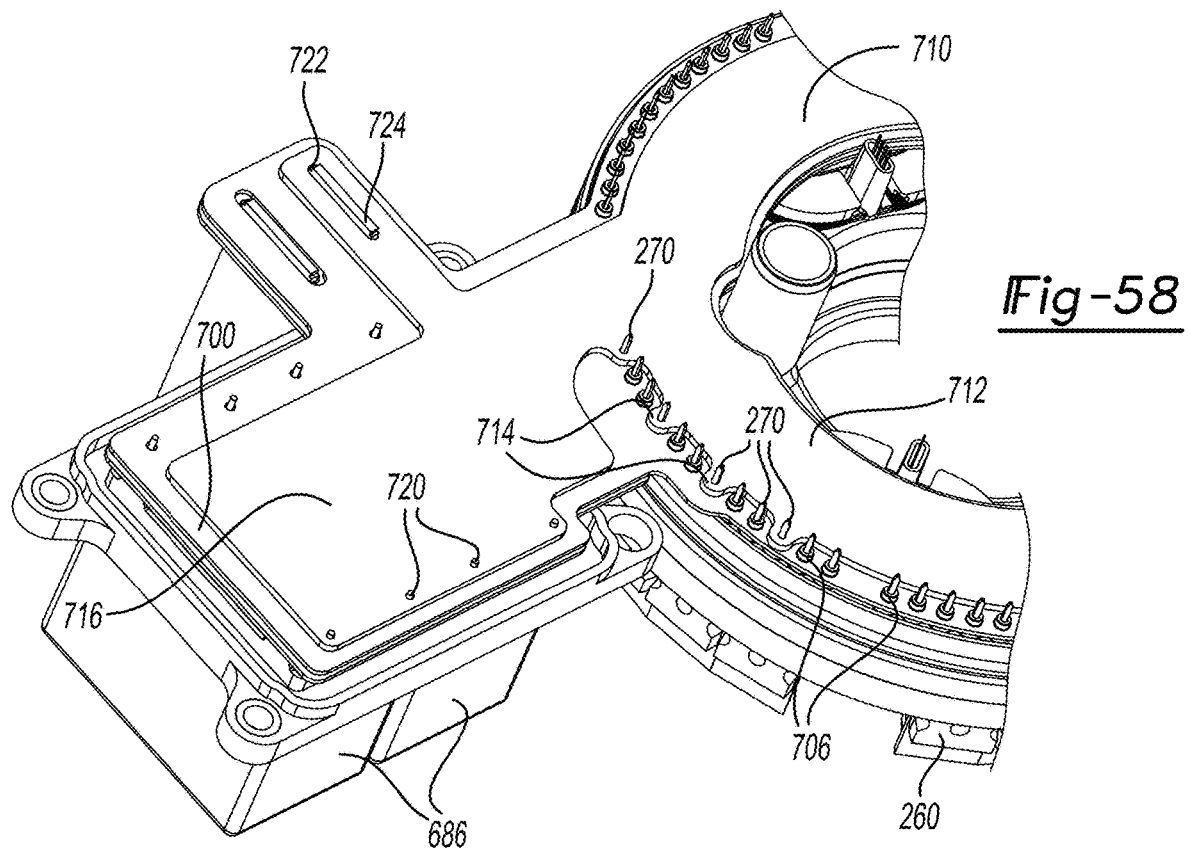

With reference to FIGS. 53 and 58, the second bus bar 710 is abutted to the second insulator 700. The second bus bar 710 has an annular bar body 712, a plurality of protrusions 714 that extend radially outwardly from the annular bar body 712 and a power input portion 716. Each of the protrusions 714 is sized to be received between the second insulating collars 706 of the second insulator 700 and to be electrically coupled to a respective one of the device terminals 270 of the MOSFET's 260. Holes are formed through the protrusions 714 and the power input portion 716 to receive the device terminals 270 from the MOSFET's 260 and from the terminals 720 of the pair of capacitors 686, respectively. A second slotted aperture 722 is formed in the power input portion 716 to receive a blade terminal 724 that electrically couples the second bus bar 710 to a source of electrical power (not shown)

Figure 59:
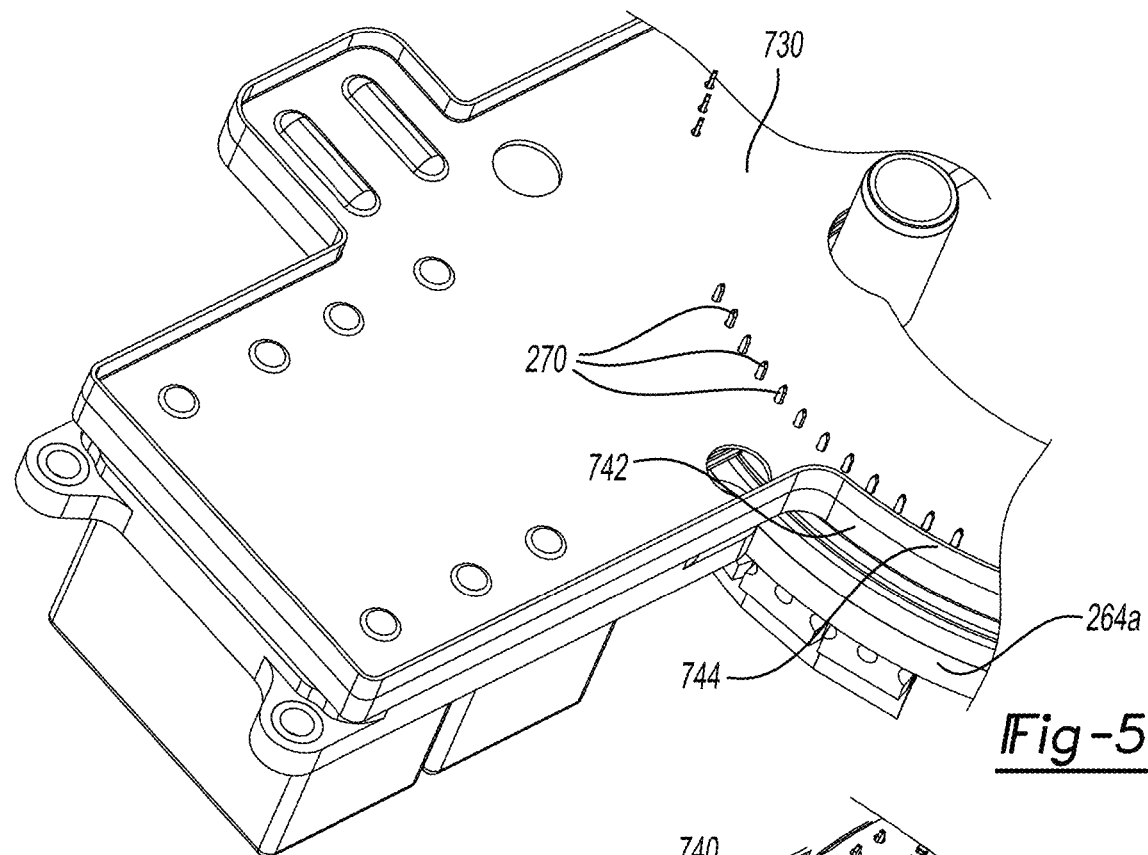

With reference to FIGS. 53 and 59, a third insulator 730 is mounted to the retaining member 264*a* and abuts the second bus bar 710 on a side opposite the second insulator 700. The third insulator 730 defines a second bus bar recess 732 into which the second bus bar 710 is received. The third insulator 730 also defines a plurality of third insulating collars 734 and a plurality of holes. Each of the third insulating collars 734 can define a recess that can receive a tubular projection from an associated one of the second insulating collars 706 of the second insulator 700. The holes can extend through the third insulator 730 to receive there through various terminals, such as the device terminals 270 of the MOSFET's 260, so that those terminals can be electrically coupled to the circuit board 740. The third insulator 730 can define first and second flange members 742 and 744, respectively, that can extend axially from a central body of the third insulator 730 in opposite axial directions. Each of the first and second flange members 742 and 744 is disposed about the perimeter of the central body of the third insulator 730. The flange 672 of the retaining member 264*a* can be received within (and optionally can abut) the second flange member 742 to form a labyrinth about a cavity that is defined by the retaining member 264*a* and the third insulator 730.

Figure 60:
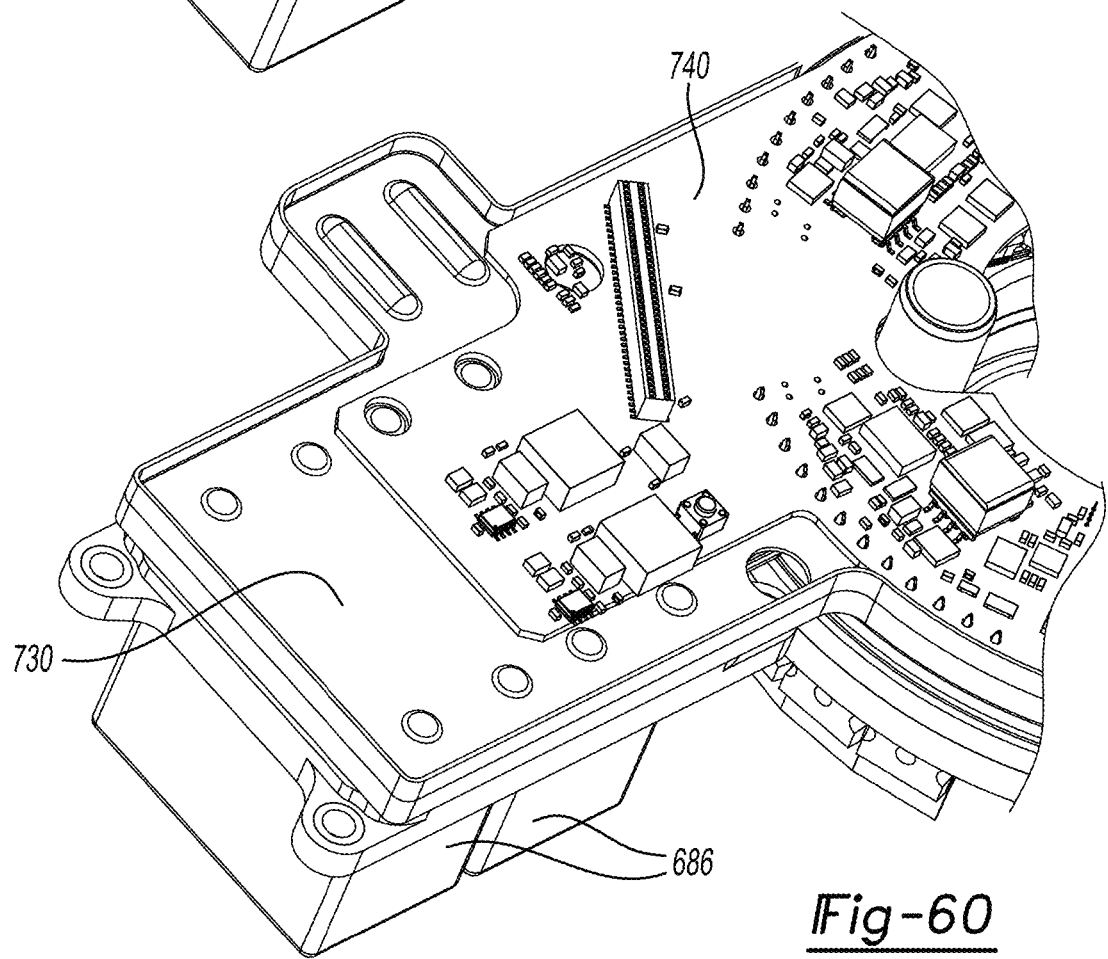

In FIGS. 53 and 60, the circuit board 740 can be abutted to the third insulator 730 on a side opposite the second bus bar 710 and can be electrically coupled to the various terminals that extend through the third insulator 730.

Figure 61:
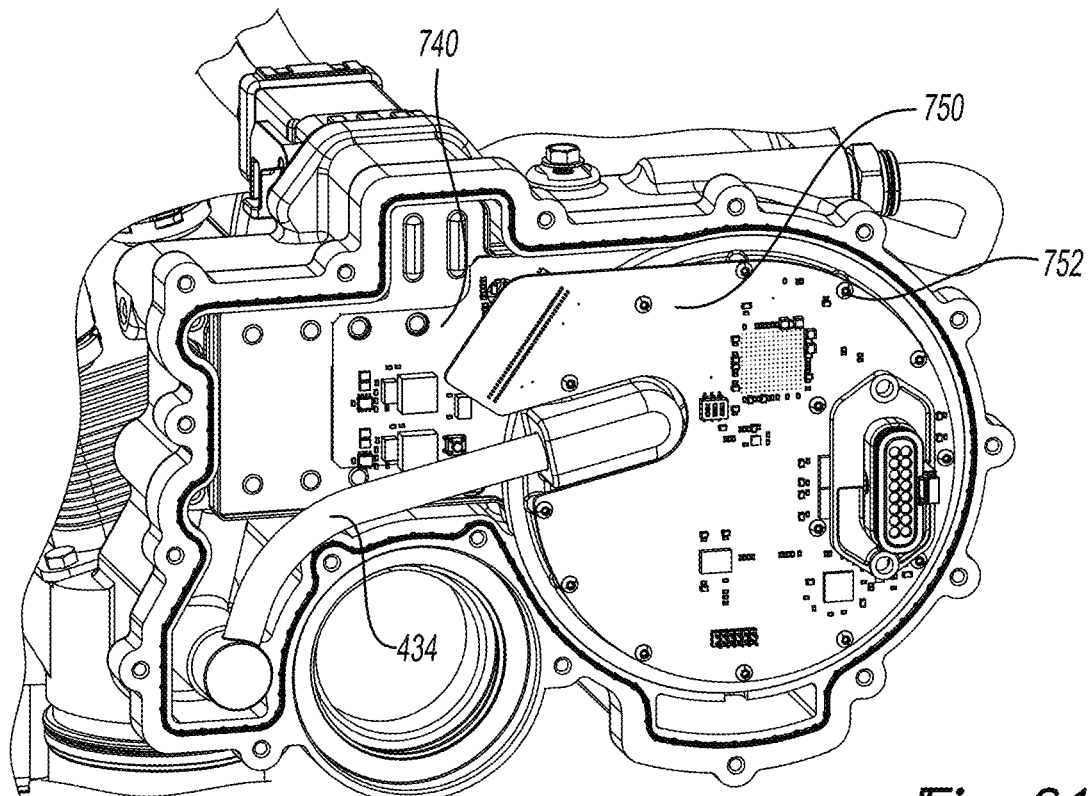
FIG. 61 is a perspective view depicting the mounting of a cover to the inverter of FIG. 45 and the assembly of the inverter to a housing of an alternately configured electric drive unit.
Figure 62:
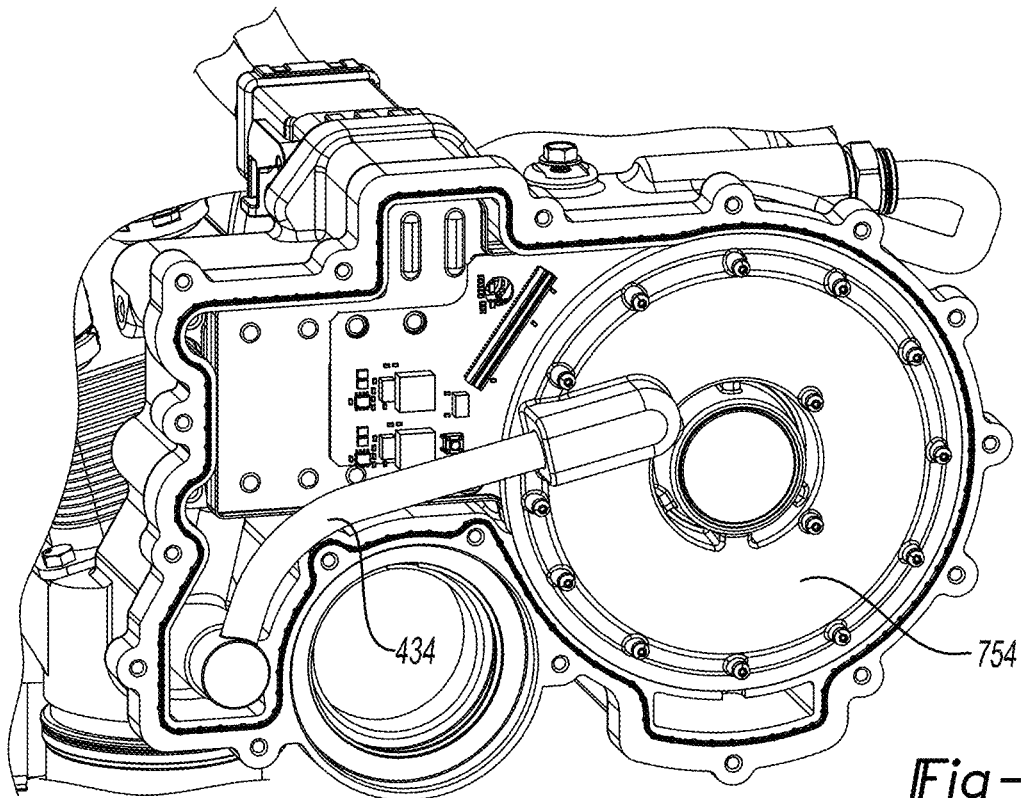
FIG. 62 is similar to the view of FIG. 61 with the cover removed from the inverter.
Figure 63:
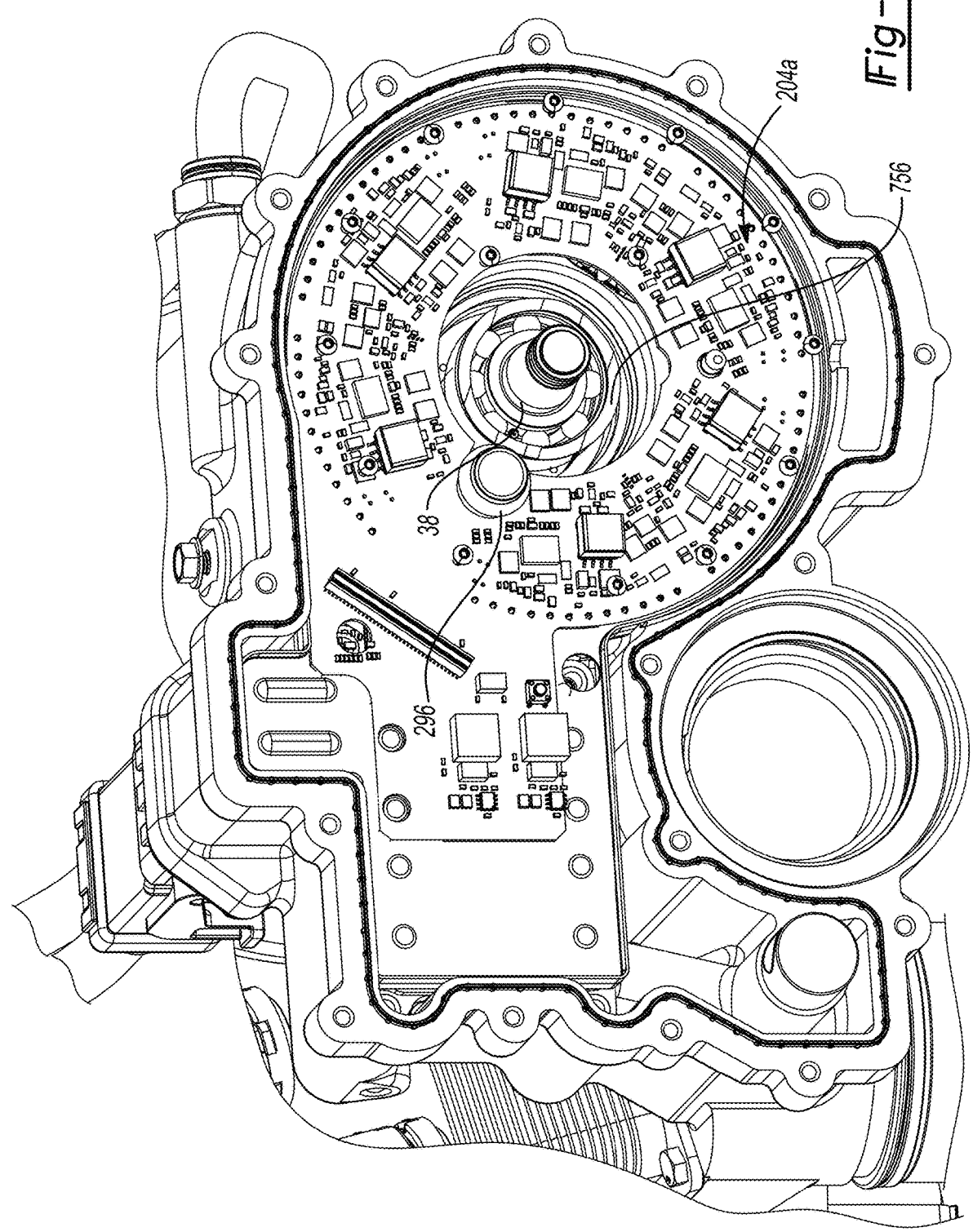
FIG. 63 is similar to the view of FIG. 62 with a bearing support removed.
Figure 64:
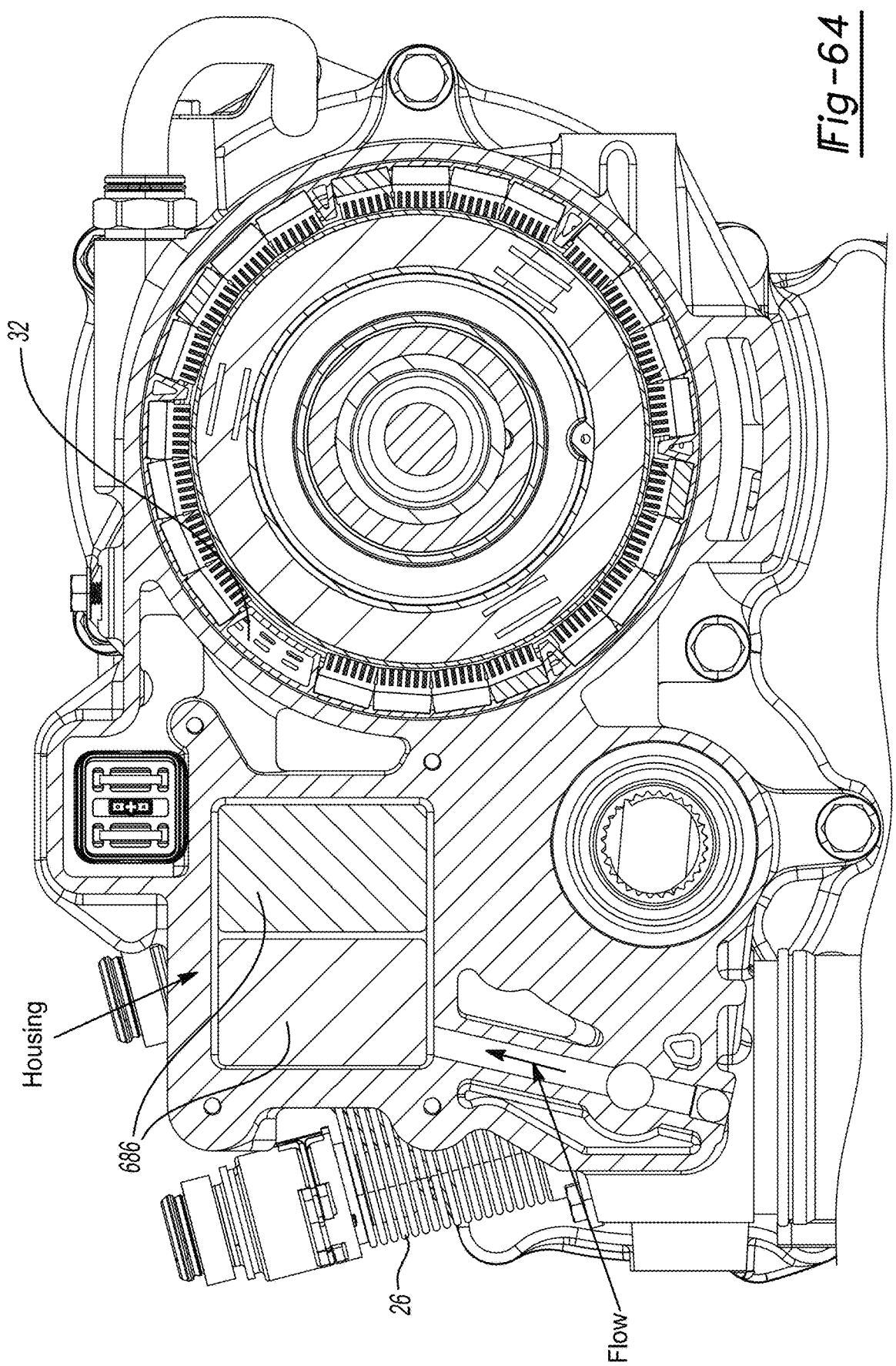
FIG. 64 is similar to the view of FIG. 63 with the inverter removed to show the stator.
Figure 65:
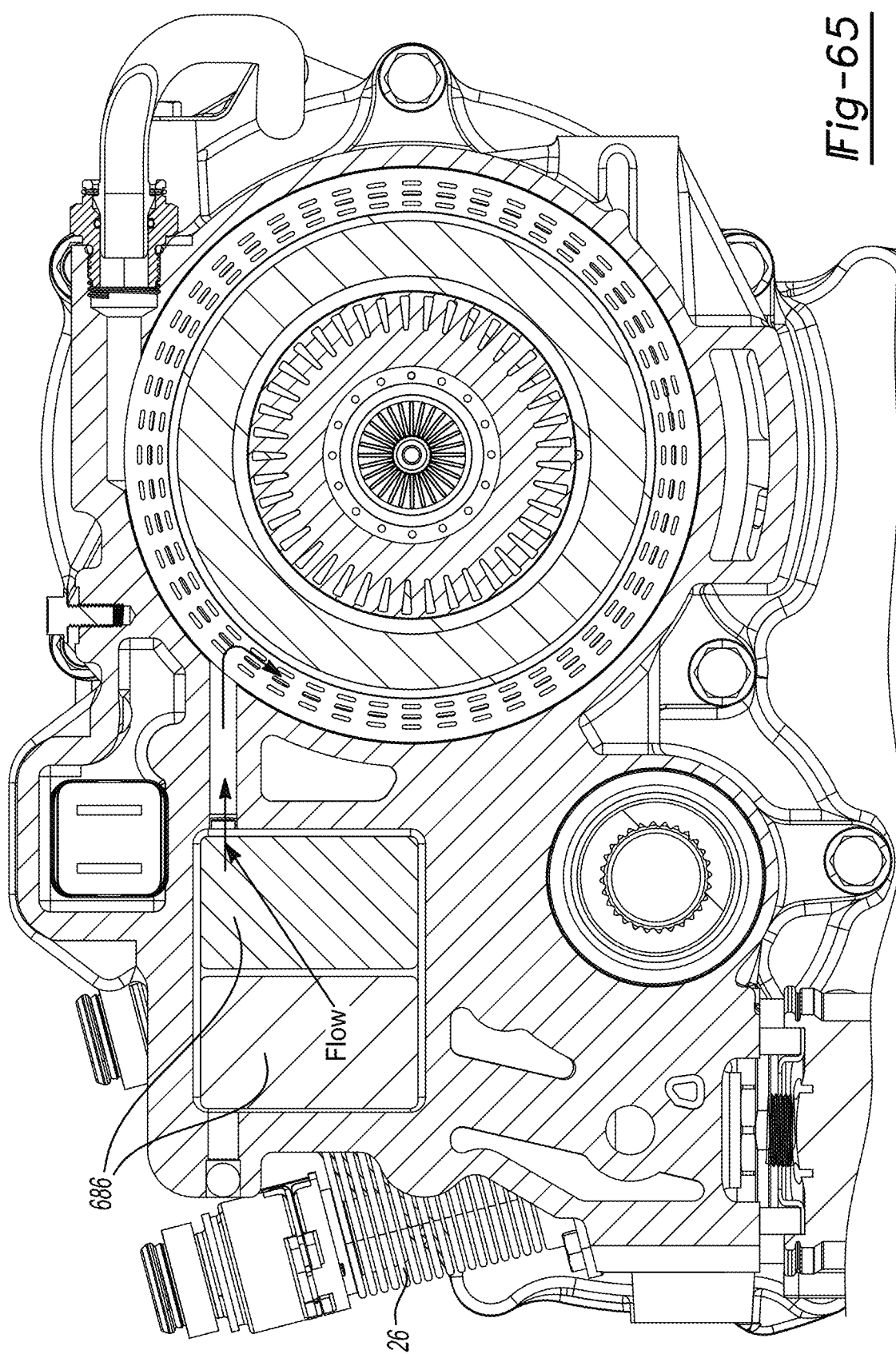
FIG. 65 is a section view through the alternately configured electric drive unit depicting the flow of cooling oil through a field capacitor and to the stator.
Figure 66:
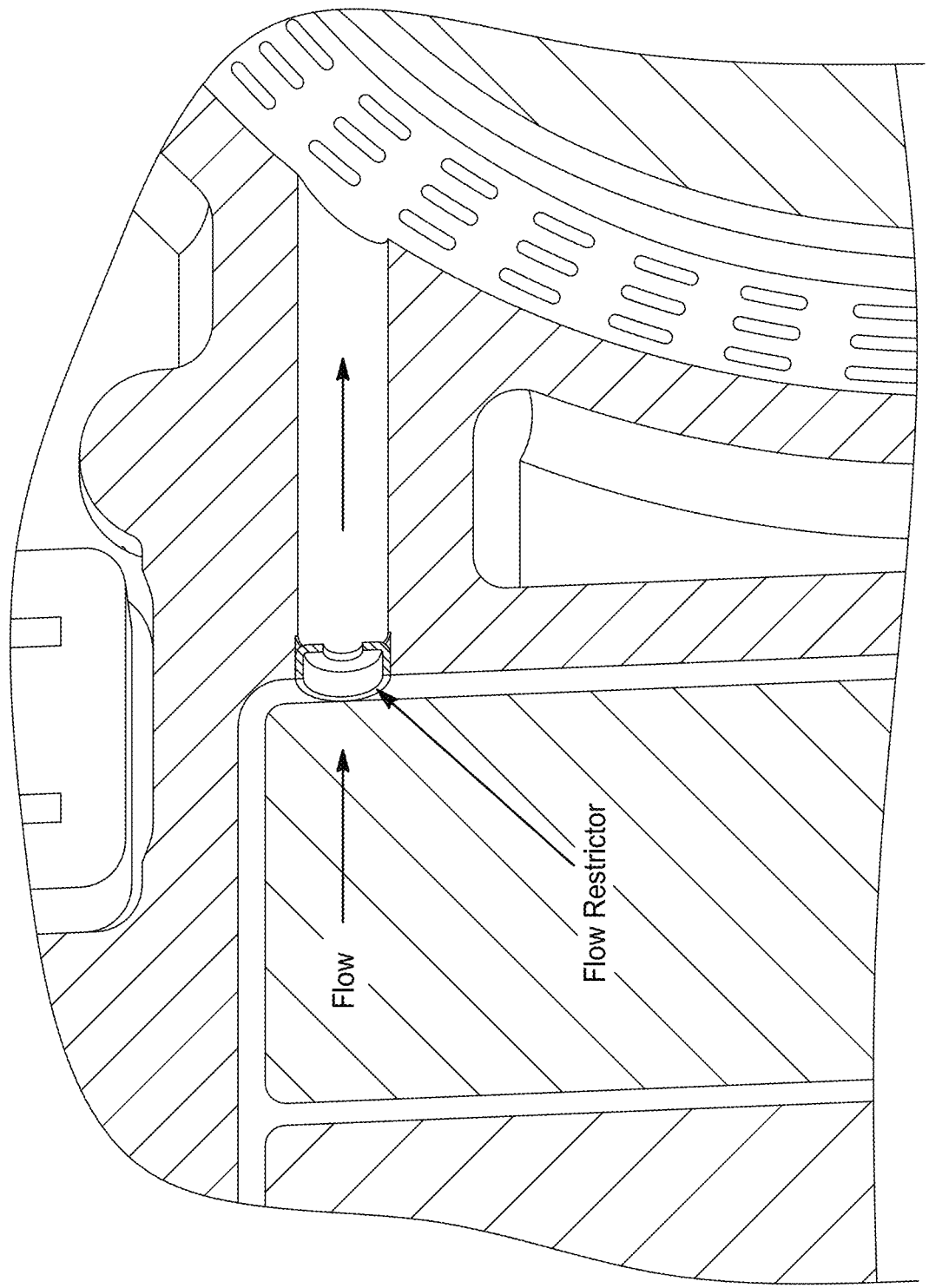
FIG. 66 is an enlarged portion of FIG. 65.
Figure 67:
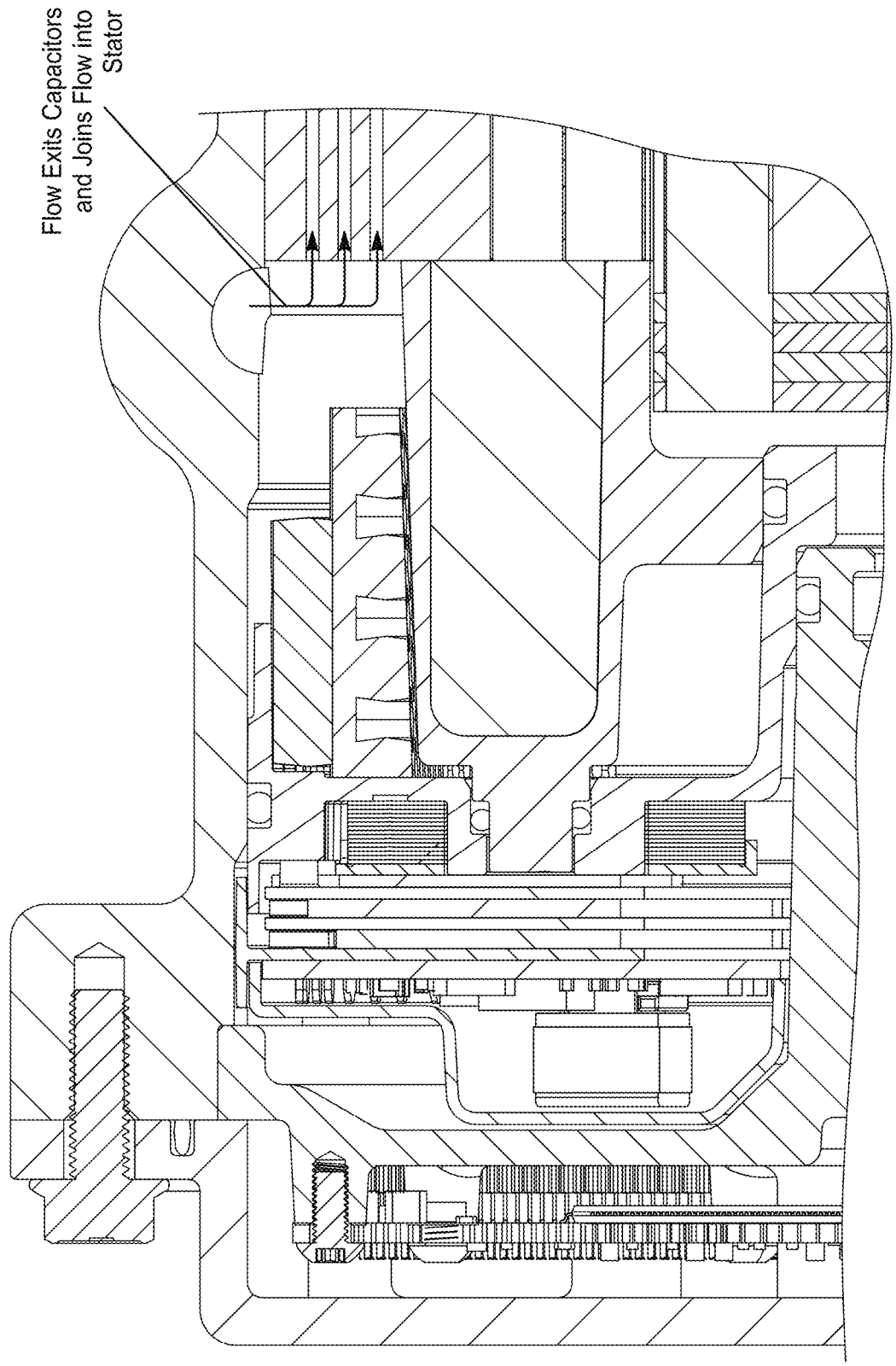
FIG. 67 is a section view of a portion of the alternately configured electric drive unit depicting where cooling oil leaves a cavity that holds a field capacitor and merges with a flow of cooling oil that passes through the heat sinks prior to the merged flow entering coolant passages formed in the stator.

In FIGS. 61 through 63 a control board 750 is plugged into the circuit board 740 and is fixedly coupled thereto via a plurality of threaded fasteners 752. The control board 750 is disposed about the transfer tube 434 that is mounted to a bearing support 754 that holds a bearing 756 that supports a rotor shaft 38 of the electric motor relative to the housing of the electric motor. The transfer tube 434 is sealingly engaged to the oil inlet port 296 that is unitarily and integrally formed with the retaining member 264*a* (FIG. 46). Coolant received by the oil inlet port 296 in the retaining member is employed to route cooling liquid to the inverter 204*a* and to the electric motor.

In FIGS. 64 through 67, a portion of the flow of the filtered coolant that is discharged from the heat exchanger 26 is routed to the capacitors 686 to cool the capacitors 686. Coolant discharged from the capacitors 686 is routed to join the flow of cooling liquid enters the stator 32 to cool the electric motor.

Figure 68:
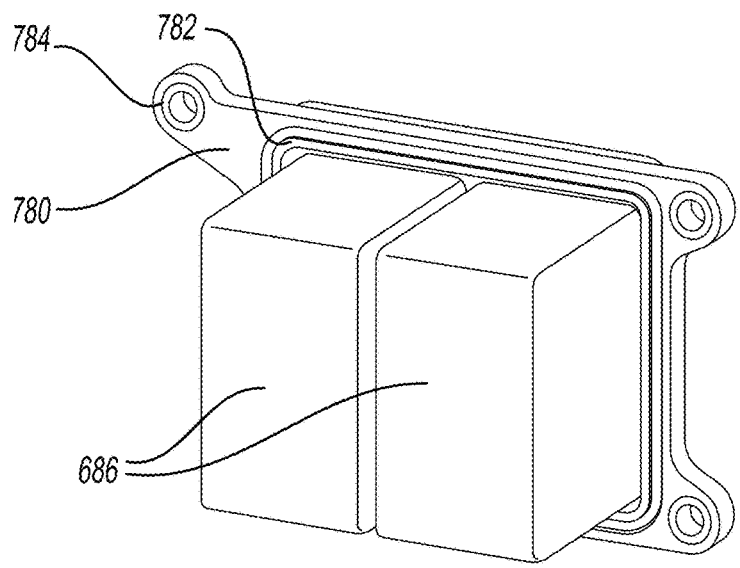
FIG. 68 is a front perspective view of the field capacitor.
Figure 69:
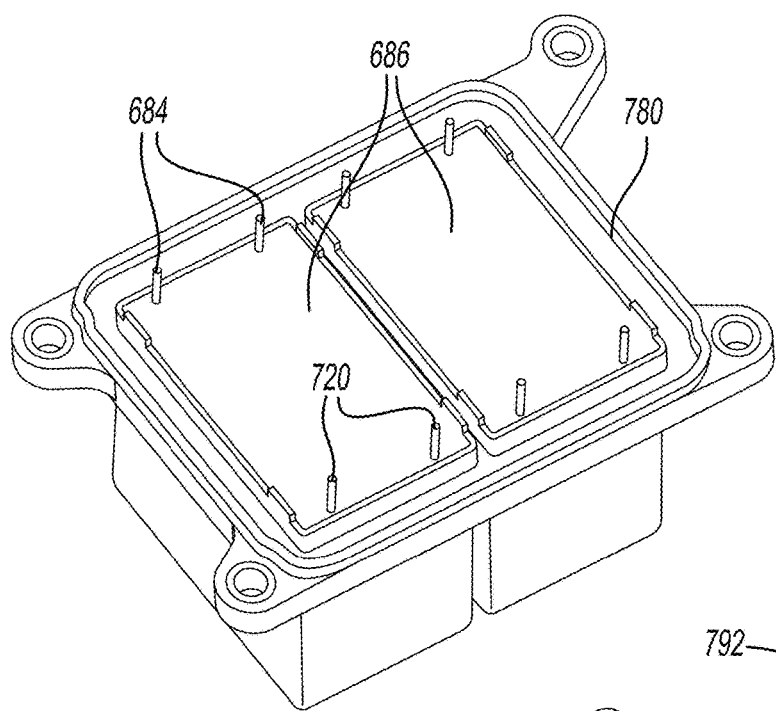
FIG. 69 is a rear perspective view of a portion of the field capacitor.

The capacitors 686 are illustrated in FIG. 68 as being mounted to a tray 780 that holds a seal member 782. Optional crush limiters 784 can be mounted to the tray 780 to limit the amount by which the seal member 782 is compressed. FIG. 69 depicts the reverse side of the tray 780 and the terminals 684, 720 of the capacitors 686. The capacitors 686 can be potted to the tray 780 with a suitable compound to form a seal between the capacitors 686 and the tray 780.

Figure 70:
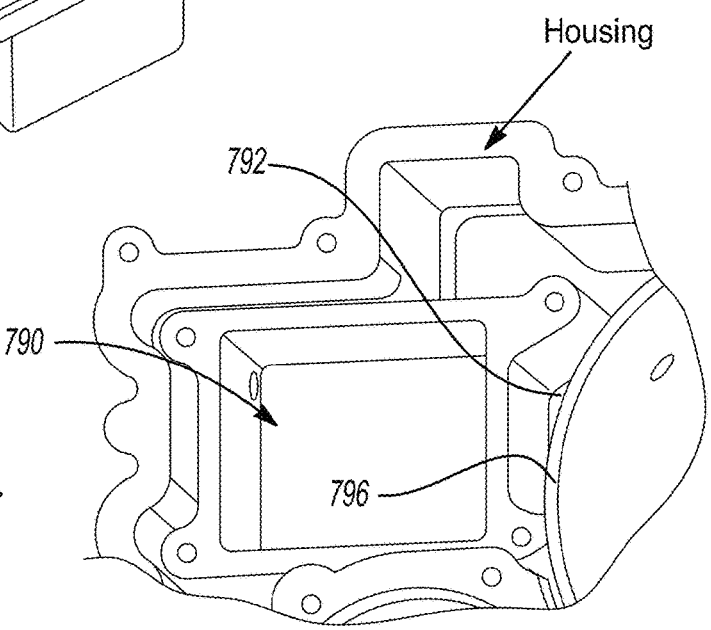
FIG. 70 is a perspective view of a portion of the housing of the alternately configured electric drive unit showing a field capacitor cavity for holding the field capacitor.

FIG. 70 depicts a recess 790 in the housing that is configured to receive the tray 780 (FIG. 68) and the capacitors 686 (FIG. 68). A gallery 792 that is integrally formed with the housing permits cooling fluid in the recess 790 to be discharged through a housing wall 796 to the stator 32 (FIG. 64) of the electric motor.

FIG. 71 depicts the tray 780 being mounted to the housing via a plurality of threaded fasteners.

FIG. 72 depicts a fourth insulator 800 that is disposed between the circuit board 740 and the bearing support 754. The fourth insulator 800 can have a flange 810 about its perimeter that can be received into the first flange 742 on the third insulator 730 to form a labyrinth between the third and fourth insulators 730 and 800.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electric drive unit comprising:
a stator having a stator body and a plurality of sets of field windings, the stator body defining a plurality of cooling channels that extend longitudinally through the stator body, each of the sets of field windings being fixedly coupled to the stator body and being circumferentially spaced apart about a central longitudinal axis;
a rotor received in the stator and rotatable about the central longitudinal axis; and
an inverter assembly that includes a plurality of power semiconductors, a plurality of heat sinks and an end plate, each of the power semiconductors being thermally coupled to a corresponding one of the heat sinks, each of the heat sinks having a plurality of fins that extend into a flow channel that is coaxial with the plurality of sets of field windings, the end plate being coupled to the power semiconductors and having a projection and a coolant port, the projection being sealingly coupled to the plurality of sets of field windings and partly defining an annular cavity, the coolant port being coupled in fluid communication with the annular cavity, wherein the flow channel is in fluid communication with and disposed in a flow path between the annular cavity and the cooling channels in the stator body.

2. The electric drive unit of claim 1, wherein the flow channel is disposed radially between the plurality of sets of field windings and the power semiconductors.

3. The electric drive unit of claim 1, wherein the flow channel is disposed radially outwardly of the plurality of sets of field windings.

4. The electric drive unit of claim 1, wherein an annular gap is formed axially between the end plate and an axial end of the field windings, the annular gap fluidly coupling the annular cavity and the flow channel.

5. The electric drive unit of claim 4, wherein a radially inward end of the annular gap intersects the annular cavity, and a radially outward end of the annular gap intersects the flow channel.

6. The electric drive unit of claim 1, wherein the tubular projection carries a seal member that is sealingly mounted to the stator.

7. The electric drive unit of claim 1, wherein the inverter assembly further comprises first and second bus bars, each of the first and second bus bars having an annular bar body that is electrically coupled to at least a portion of the power semiconductors.

8. The electric drive unit of claim 7, wherein the inverter assembly further comprises a plurality of conductor plates, each of the conductor plates being electrically coupled to a corresponding set of the power semiconductors and to a phase lead of a corresponding one of the sets of field windings.

9. The electric drive unit of claim 8, wherein the inverter assembly further comprises a current sensor lamination mount, a sensor mount, a plurality of generally C-shaped sensor laminations and a Hall-effect sensor, the current sensor lamination mount being coupled to the end plate, the sensor mount being a tubular structure that projects from the current sensor lamination mount, the generally C-shaped current sensor laminations being disposed on the current sensor lamination mount and having open ends that are disposed on opposite sides of the sensor mount, the Hall-effect sensor being received in the sensor mount and disposed between the opposite open ends of the generally C-shaped current sensor laminations, wherein the generally C-shaped current sensor laminations are received about a portion of one of the phase leads.

10. The electric drive unit of claim 8, wherein each of the phase leads comprises a receiver that defines a slotted aperture.

11. The electric drive unit of claim 10, wherein the receiver comprises a plurality of individually bident-shaped members.

12. The electric drive unit of claim 1, further comprising a transmission having a transmission input member that is coupled to the rotor for rotation therewith.

13. The electric drive unit of claim 12, further comprising a differential assembly having a differential input member, which is driven by a transmission output member of the transmission, and a pair of differential output members.

14. The electric drive unit of claim 13, wherein the differential input member is a differential case and wherein the differential output member is fixedly coupled to the differential case.

15. The electric drive unit of claim 1, wherein the inverter assembly further comprises a TMR sensor, wherein a magnet is coupled to the rotor for rotation therewith, and wherein the TMR sensor senses a rotational position of magnet.

16. An electric drive unit comprising:
a motor assembly having an electric motor and an inverter assembly, the electric motor having a plurality of sets of field windings and defining a plurality of cooling channels, each of the sets of field windings including a phase terminal, the inverter assembly having a retainer, a plurality of power semiconductors, a circuit board, first and second bus bars, a plurality of conductor plates, and a plurality of heat sinks, the retainer including an annular end plate that is sealingly coupled to the electric motor, each of the power semiconductors having a plurality of device terminals that are received through the annular end plate, each of the power semiconductors being electrically coupled to the first and second bus bars, each of the conductor plates being electrically coupled to a corresponding set of the power semiconductors and a corresponding one of the phase terminals, the heat sinks being mechanically and thermally coupled to the power semiconductors;
wherein the power semiconductors and the heat sinks are disposed concentric with the plurality of sets of field windings;
wherein the end plate defines a coolant tube;
wherein the end plate and the electric motor cooperate to form an annular cavity that is in fluid communication with the coolant tube;
wherein the heat sinks have fins that are disposed in a flow channel, and wherein the flow channel is disposed in fluid communication between the annular cavity and the cooling channels.

17. The electric drive unit of claim 16, wherein the flow channel is disposed radially between the plurality of sets of field windings and the power semiconductors.

18. The electric drive unit of claim 16, wherein the flow channel is disposed radially outwardly of the plurality of sets of field windings.

19. The electric drive unit of claim 16, wherein an annular gap is formed axially between the end plate and an axial end of the field windings, the annular gap fluidly coupling the annular cavity and the flow channel.

20. The electric drive unit of claim 19, wherein a radially inward end of the annular gap intersects the annular cavity, and a radially outward end of the annular gap intersects the flow channel.

* * * * *